(12) United States Patent
Seo et al.

(10) Patent No.: US 10,978,680 B2
(45) Date of Patent: Apr. 13, 2021

(54) APPARATUS FOR MANUFACTURING DISPLAY DEVICE AND METHOD FOR MANUFACTURING DISPLAY DEVICE

(71) Applicant: Samsung Display Co. Ltd., Yongin-si (KR)

(72) Inventors: Jin Seo, Osan-si (KR); Woo Suk Seo, Yongin-si (KR); Sung Hoon Yang, Seoul (KR); Se Yoon Oh, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/552,536

(22) Filed: Aug. 27, 2019

(65) Prior Publication Data

US 2020/0075900 A1 Mar. 5, 2020

(30) Foreign Application Priority Data

Aug. 28, 2018 (KR) .................. 10-2018-0101595
Oct. 8, 2018 (KR) .................. 10-2018-0120095

(51) Int. Cl.
*H01L 51/00* (2006.01)
*H01L 51/56* (2006.01)
*H01L 51/52* (2006.01)

(52) U.S. Cl.
CPC .......... *H01L 51/56* (2013.01); *H01L 51/0031* (2013.01); *H01L 51/5246* (2013.01)

(58) Field of Classification Search
CPC .... B23K 26/206; B23K 26/032; B23K 26/06; H01L 51/0031; H01L 51/56; H01L 51/5246
See application file for complete search history.

(56) References Cited

U.S. PATENT DOCUMENTS

| 7,371,143 | B2* | 5/2008 | Becken | C03C 27/06 |
| | | | | 445/25 |
| 8,415,174 | B2* | 4/2013 | Tanaka | H01L 51/0031 |
| | | | | 438/4 |
| 9,393,642 | B2* | 7/2016 | Han | B23K 26/206 |
| 2006/0082298 | A1* | 4/2006 | Becken | H01L 51/5246 |
| | | | | 313/512 |
| 2010/0288739 | A1* | 11/2010 | Lee | G01B 9/02081 |
| | | | | 219/121.67 |
| 2011/0027918 | A1* | 2/2011 | Tanaka | H01L 51/5278 |
| | | | | 438/16 |
| 2015/0048070 | A1* | 2/2015 | Han | B23K 26/206 |
| | | | | 219/121.79 |

FOREIGN PATENT DOCUMENTS

| KR | 20030063044 | 7/2003 |
| KR | 101794778 | 12/2017 |

* cited by examiner

*Primary Examiner* — Nikolay K Yushin
(74) *Attorney, Agent, or Firm* — Cantor Colburn LLP

(57) ABSTRACT

A method for manufacturing a display device includes preparing a target panel including a first substrate and a second substrate disposed on one surface of the first substrate, the target panel including a sealing area between the first substrate and the second substrate, making sealing light be incident in the sealing area and receiving at least a part of the sealing light reflected from the sealing area, generating first data including at least one parameter of intensity, energy, current, and voltage, and determining whether sealing is defective by comparing the first data and prestored second data.

31 Claims, 42 Drawing Sheets

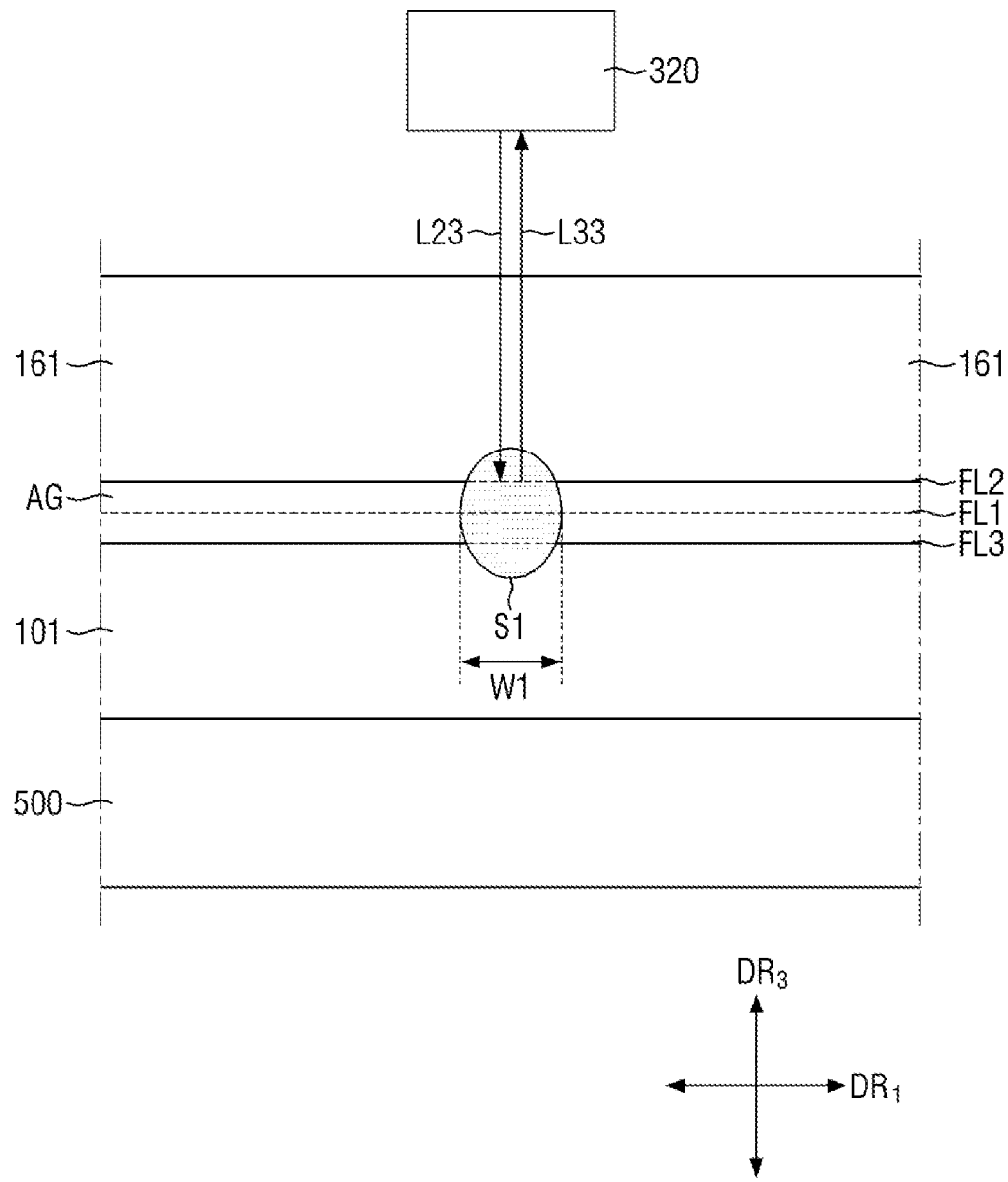

APPARATUS FOR MANUFACTURING DISPLAY DEVICE AND METHOD FOR MANUFACTURING DISPLAY DEVICE

This application claims priority to Korean Patent Application No. 10-2018-0101595, filed on Aug. 28, 2018, and No. 10-2018-0120095, filed on Oct. 8, 2018, and all the benefits accruing therefrom under 35 U.S.C. § 119, the content of which in its entirety is herein incorporated by reference.

BACKGROUND

1. Field

Exemplary embodiments of the invention relate to an apparatus for manufacturing a display device and a method for manufacturing a display device.

2. Description of the Related Art

A display device is a device for displaying a moving image or a still image. The display device may be used as a display screen of not only portable electronic appliances such as a mobile phone, a smart phone, a tablet personal computer ("PC"), a smart watch, a watch phone, a mobile communication terminal, an electronic notebook, an electronic book, a portable multimedia player ("PMP"), a navigator, and a ultra mobile PC ("UMPC"), but also various products such as a television, a notebook, a monitor, a billboard, and the internet of things ("IoT").

The display device may be, for example, an organic light emitting display device. The image display of the display device such as the organic light emitting display device is generally caused by light transmission. In particular, the light transmittance may affect display quality such as luminance of the display device. Thus, elements of the display device may at least partially include a transparent element, for example, a glass element.

SUMMARY

Laser sealing is a method for combining a plurality of transparent members to form a multi-stack bonding body. However, an incomplete sealing area may be due to a roughness of the transparent member and a shaking of the laser device. External oxygen, moisture, and the like penetrate into the display device through the incomplete sealing area, thereby causing defects of the display device.

Exemplary embodiments of the invention are to provide an apparatus for manufacturing a display device and a method for manufacturing a display device, by which the sealing of the display device is inspected in real time.

However, exemplary embodiments of the invention are not restricted to the one set forth herein. The above and other exemplary embodiments of the invention will become more apparent to one of ordinary skill in the art to which the invention pertains by referencing the detailed description of the invention given below.

According to an exemplary embodiment of the invention, there is provided a method of manufacturing a display device, the method for manufacturing the display device includes preparing a target panel including a first substrate and a second substrate disposed on one surface of the first substrate, the target panel including a sealing area between the first substrate and the second substrate, making sealing light be incident in the sealing area and receiving at least a part of the sealing light reflected from the sealing area, generating first data including at least one parameter of intensity, energy, current, and voltage, and determining whether sealing is defective by comparing the first data and prestored second data.

In an exemplary embodiment, the making the sealing light may be incident in the sealing area includes bonding the first substrate and the second substrate.

In an exemplary embodiment, the sealing light may include a femtosecond laser.

In an exemplary embodiment, the prestored second data may include at least one parameter of intensity, energy, current, and voltage.

In an exemplary embodiment, the determining whether sealing the target panel is defective may include determining that the sealing area in which at least any one of the intensity and the energy of the first data is reduced by about 5 percent (%) or more as compared with the prestored second data in at least one wavelength in a wavelength band in a range of about 400 nanometers (nm) to about 1000 nm is a defective sealing area.

In an exemplary embodiment, the determining whether sealing the target panel is defective may include determining that the sealing area in which at least any one of the voltage and the current energy of the first data is reduced by about 20% or more as compared with the prestored second data in at least one wavelength in a wavelength band in a range of about 400 nm to about 1000 nm is a defective sealing area.

In an exemplary embodiment, the determining whether sealing the target panel is defective may include detecting that a corresponding area is a fluctuating area when a voltage amplitude or an energy amplitude of the first data is larger than a reference value stored in the prestored second data and distinguishing a detected area as a defective sealing area.

In an exemplary embodiment, the determining whether sealing the target panel is defective may include data-transforming the first data into third data by Fourier transformation.

In an exemplary embodiment, the sealing light includes a femtosecond laser and the first substrate and the second substrate may be partially melted and solidified and bonded to each other in the sealing area in which the femtosecond laser is incident.

In an exemplary embodiment, in the receiving the sealing light reflected from the sealing area, the sealing light may be reflected from the sealing area which is at least partially melted.

According to an exemplary embodiment of the invention, there is provided a method for manufacturing a display device, the method for manufacturing the display device includes preparing a manufacturing apparatus including a sealing module including a light source unit emitting sealing light and a sealing inspection module including a detector receiving at least a part of the sealing light, a data transforming unit generating measurement light data based on the sealing light, and a comparison unit determining whether sealing is defective by comparing the measurement light data with reference data, and irradiating, by the light source unit, the sealing light to a target panel and partially melting the target panel to be bonded and making a part of the sealing light reflected therefrom be incident in the detector, wherein the measurement light data includes at least one parameter of intensity, energy, current, and voltage.

In an exemplary embodiment, the reference data may include at least one parameter of intensity, energy, voltage, and current.

In an exemplary embodiment, the sealing light may include a femtosecond laser and a first substrate and a second substrate are partially melted and solidified and bonded to each other in a sealing area in which the femtosecond laser is incident.

According to an exemplary embodiment of the invention, there is provided an apparatus for manufacturing a display device, the apparatus for manufacturing the display device includes a sealing module including a light source unit which emits sealing light, and a sealing inspection module including a detector which receives at least a part of the sealing light, a data transforming unit which generates measurement light data based on the sealing light, and a comparison unit which determines whether sealing is defective by comparing the measurement light data with reference data, wherein the measurement light data includes at least one parameter of intensity, energy, voltage, and current of the sealing light.

In an exemplary embodiment, the sealing module may further include a lens unit which is disposed on an optical path of the emitted sealing light and adjusts a focus distance of a femtosecond laser and the light receiving unit of the detector is disposed to face a focus of the femto second laser which passes through the lens unit.

In an exemplary embodiment, the reference data may include at least one parameter of intensity, energy, voltage, and current.

In an exemplary embodiment, a data generating unit may include a first data generating unit and a second data generating unit, and the first data generating unit generates intermediate data including at least one of intensity, energy, voltage, and current of the received sealing light and the second data generating unit generates the measurement light data by performing Fourier transformation based on the intermediate data.

In an exemplary embodiment, the emitted sealing light may be reflected from the sealing area of which at least a part is melted and the detector receives at least a part of the sealing light.

In an exemplary embodiment, a data generating unit may generate the measurement light data based on the sealing light reflected from the sealing area of which at least a part is melted.

In an exemplary embodiment, the sealing light may include a femtosecond laser, and the sealing module irradiates the femtosecond laser to a target panel including a first substrate and a second substrate facing each other to bond the first substrate and the second substrate and the sealing module receives the femtosecond laser reflected from the target panel.

According to an exemplary embodiment of the invention, there is provided a method for manufacturing a display device, the method for manufacturing the display device includes preparing a target panel including a first substrate and a second substrate disposed on one surface of the first substrate, the target panel including a sealing area between the first substrate and the second substrate, irradiating the sealing area with first light, irradiating the sealing area irradiated with the first light with second light, receiving at least a part of third light reflected from the sealing area, generating first data based on the applied first light and the received third light, converting the first data into second data, generating a first image based on the second data, and comparing the first image with a prestored second image to determine whether sealing is defective.

In an exemplary embodiment, wherein the first light may be sealing light, the second light is inspection light, and the third light includes reflected light of the second light.

In an exemplary embodiment, wherein the irradiating the sealing area with the sealing light may include attaching the first substrate to the second substrate, and the sealing light includes a femtosecond laser, and the first substrate and the second substrate are partially melted and solidified in the sealing area irradiated with the femtosecond laser to be attached to each other.

In an exemplary embodiment, wherein the inspection light sequentially may pass through one surface and another surface of a dichroic lens and is incident on the sealing area, and the reflected light is reflected from another surface of the dichroic lens and then received.

In an exemplary embodiment, wherein the first data may include a phase difference between the inspection light and the reflected light and time taken until the inspection light is incident and the reflected light is received, and the second data includes three-dimensional coordinates (X, Y, Z) up to the sealing area.

According to an exemplary embodiment of the invention, there is provided a method for manufacturing a display device, the method for manufacturing the display device includes preparing a display device manufacturing apparatus including a sealing module including a first light source unit emitting sealing light, a sealing inspection module including a second light source emitting inspection light to a subject, a detector receiving at least a part of reflected light reflected from the subject, a data generating unit generating measurement light data based on the inspection light and the reflected light, a data transforming unit converting the measurement light data generated from the data generating unit into conversion data, an image generating unit generating a first image of the subject based on the measurement light data, and a comparison unit comparing the first image with a prestored second image to determine whether sealing is defective, irradiating a sealing area of a target panel with the sealing light by the first light source unit, and irradiating the subject to the inspection light by a second light source unit and making a part of the reflected light reflected from the subject incident on the detector.

In an exemplary embodiment, a method for manufacturing a display device may further include generating the measurement light data based on the inspection light and the reflected light incident on the detector by the data generating unit.

In an exemplary embodiment, wherein the measurement light data may include a phase difference between the inspection light and the reflected light and time taken until the inspection light is incident and the detector receives the reflected light, and the conversion data includes three-dimensional coordinates (X, Y, Z) from the sealing inspection module to the subject.

In an exemplary embodiment, a method for manufacturing a display device may further include converting the measurement light data into the conversion data by the data transforming unit, and generating the first image of the subject based on the conversion data by the image generating unit.

In an exemplary embodiment, a method for manufacturing a display device may further include comparing the first image with the prestored second image by the comparison unit to determine whether sealing is defective.

According to an exemplary embodiment of the invention, there is provided an apparatus for manufacturing a display device, the apparatus for manufacturing the display device includes a sealing module including a first light source unit which emits sealing light, and a sealing inspection module including a second light source which emits inspection light to a subject, a detector which receives at least a part of reflected light reflected from the subject, a data generating unit which generates measurement light data based on the inspection light and the reflected light, a data transforming unit which converts the measurement light data into conversion data, an image generating unit which generates a first image of the subject based on the measurement light data, and a comparison unit which compares the first image with a prestored second image to determine whether sealing is defective.

BRIEF DESCRIPTION OF THE DRAWINGS

The above and other exemplary embodiments and features of the invention will become more apparent by describing in detail exemplary embodiments thereof with reference to the attached drawings, in which:

FIGS. 18A to 18C are cross-sectional views illustrating another exemplary embodiment of a process of inspecting a first cell by the sealing inspection module;

DETAILED DESCRIPTION

Figure 1:
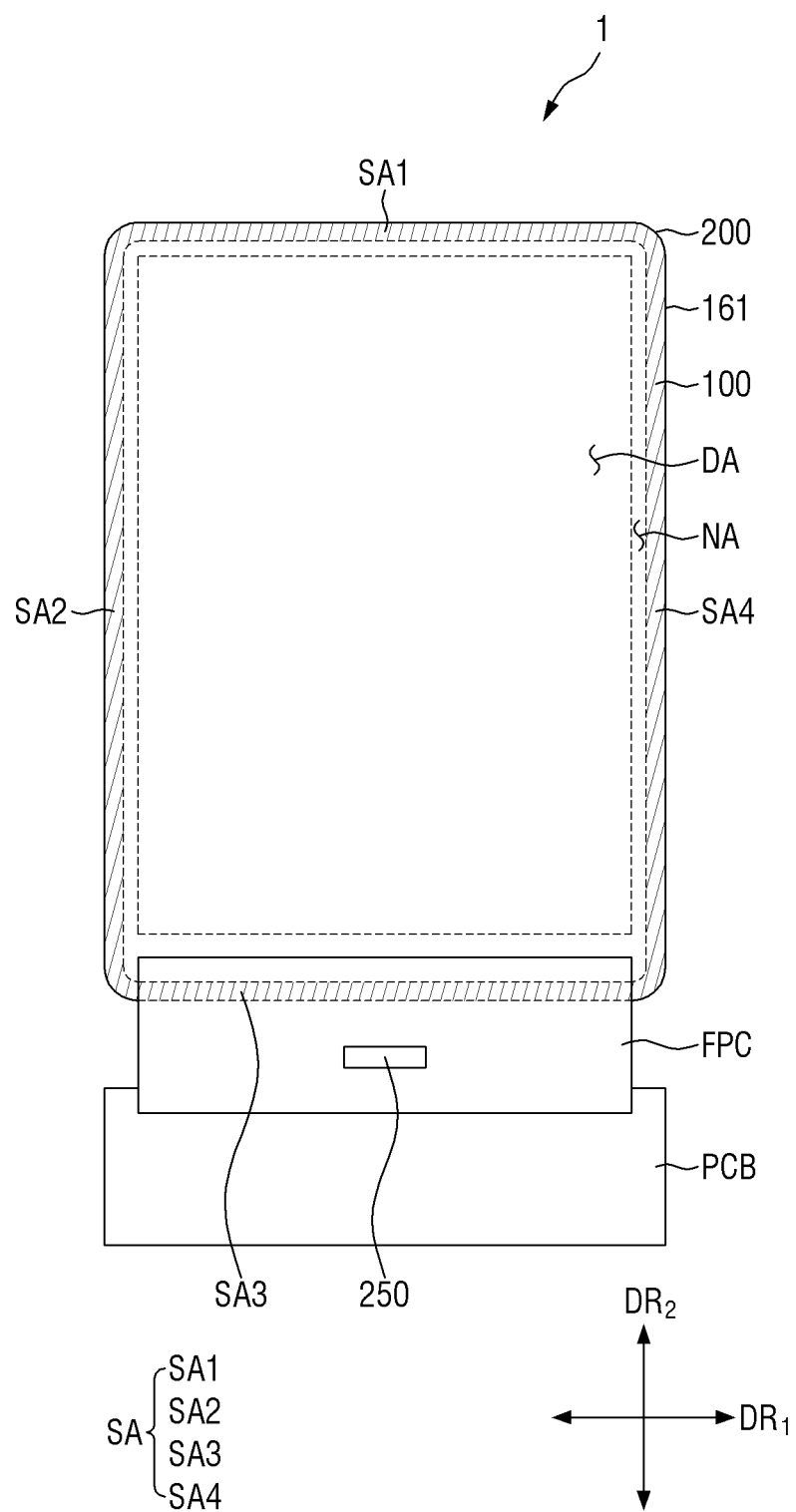
FIG. 1 is a plan view of an exemplary embodiment of a display device.

Hereinafter, embodiments of the invention will be described with reference to the attached drawings.

The advantages and features of the invention and methods for achieving the advantages and features will be apparent by referring to the exemplary embodiments to be described in detail with reference to the accompanying drawings. However, the invention is not limited to the exemplary embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

Where an element is described as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
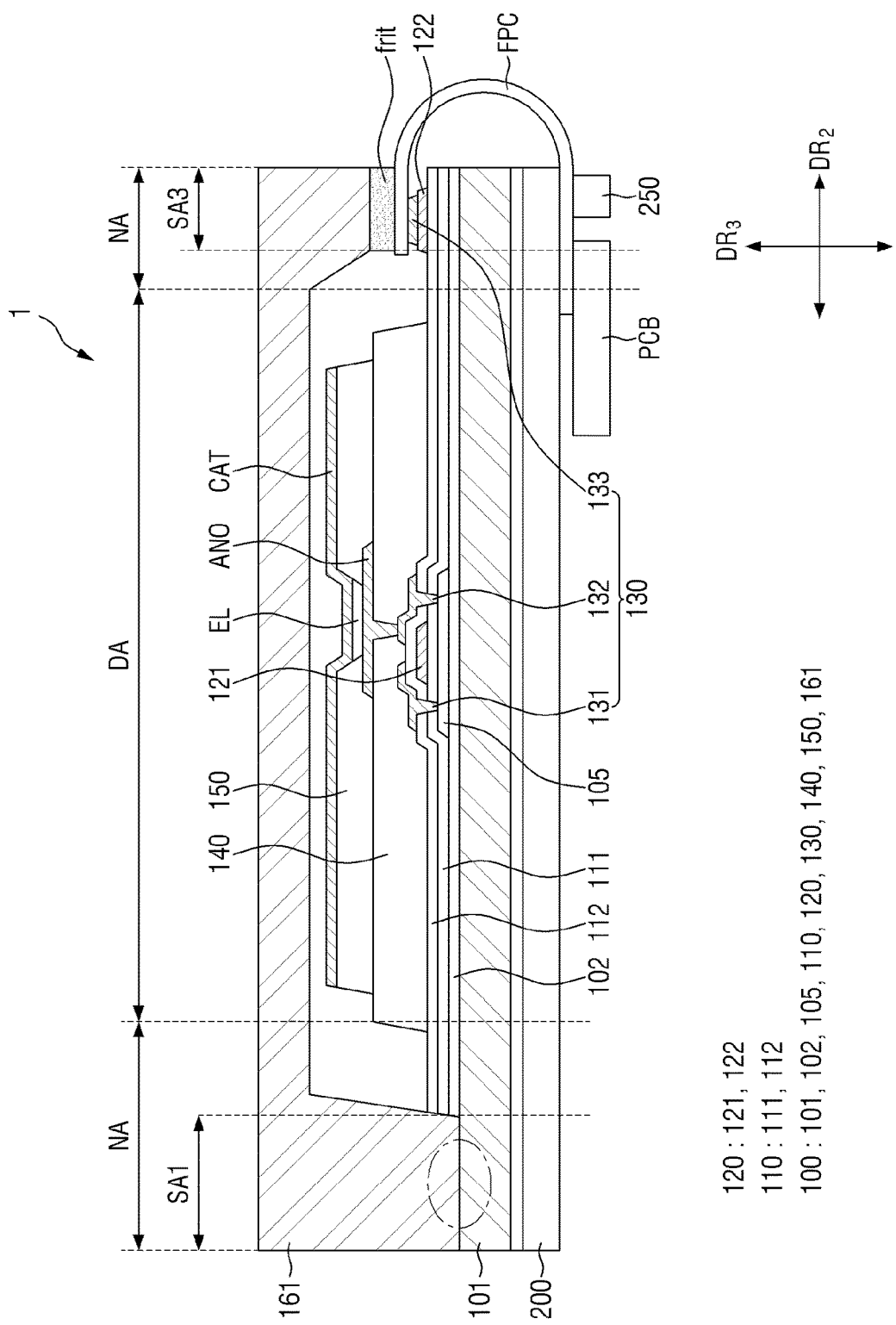
FIG. 2 is a cross-sectional view of an exemplary embodiment of a display panel.

FIG. 1 is a plan view of a display device according to an exemplary embodiment, and FIG. 2 is a cross-sectional view of a display panel according to an exemplary embodiment. FIG. 2 shows a non-display area NA at both sides taken along a second direction DR2 of FIG. 1 and a cross-sectional shape of one pixel.

Referring to FIGS. 1 and 2, a display device 1 includes a display area DA displaying an image and a non-display area NA disposed around the display area DA. The display device 1 may include both long sides and both short sides. In an exemplary embodiment, a side extending in a first direction DR1 may be a short side and a side extending in a second direction DR2 may be a long side, for example.

In an exemplary embodiment, the display area DA may have a rectangular shape with a vertically flat edge or a rectangular shape with a rounded edge, for example. The display area DA includes both long sides and both short sides, in which an extending side in the first direction DR1 may be a short side and an extending side in the second direction DR2 may be a long side. However, the planar shape of the display area DA is not limited to a rectangle, and may have a circular shape, an elliptical shape, or other various shapes.

The non-display area NA is disposed around the display area DA. In an exemplary embodiment, the non-display area NA may be disposed adjacent to both short sides of the display area DA. In an alternative exemplary embodiment, the non-display area NA may be disposed adjacent to both long sides as well as both short sides of the display area DA, and may surround all sides of the display area DA. That is, the non-display area NA may provide the edge of the display area DA. A flexible printed circuit board ("FPC") may be connected to the non-display area (the non-display area NA adjacent to the other short side in the second direction DR2 of the display device 1). One side of the FPC may be connected with the display panel (also referred to as a target panel) 100. The FPC may include a flexible insulating material. A data driving integrated circuit ("IC") 250 is disposed on the FPC. In one embodiment, the data driving IC 250 may be applied in the form of a driving chip, but is not limited thereto. The data driving IC 250 may generate a signal and transmit the signal to the display panel 100. A printed circuit board ("PCB") may be connected onto the other side of the FPC. In an exemplary embodiment, the PCB may be a rigid substrate, but is not limited thereto.

The non-display area NA of the display device 1 may include a sealing area SA. The sealing area SA may be disposed adjacent to both the long sides and the both short sides of the display device 1. The sealing area SA may constitute an edge of the display device as an area spaced apart from the display area DA in the non-display area NA.

The sealing area SA may include first to fourth sealing areas SA1 to SA4. The first sealing area SA1 may be disposed adjacent to one short side of the display panel 100 in the second direction DR2. The second sealing area SA2 may be disposed adjacent to one long side of the display panel 100 in the first direction DR1. The third sealing area SA3 may be disposed adjacent to the other short side of the display panel 100 in the second direction DR2. The fourth sealing area SA4 may be disposed adjacent to the other long side of the display panel 100 in the first direction DR1. The widths of the first to fourth sealing areas SA1 to SA4 may be equal to each other, but are not limited thereto and may be different from each other. A first substrate 101 and a second substrate 161 of the display panel 100 may be sealed in the first, second and fourth sealing areas SA1, SA2 and SA4 as described below. In the third sealing area SA3, the FPC may be sealed through the second substrate 161 and a frit. This will be described below.

The display device 1 may include a display panel 100 displaying an image and a lower panel sheet 200 disposed below the display panel 100. In an exemplary embodiment, the display panel 100 may be, for example, an organic light emitting display panel. In the following embodiments, as the display panel, the organic light emitting display panel is applied, but the invention is not limited thereto, and in other exemplary embodiments, other types of display panels such as a liquid crystal display panel, a quantum nano light emitting display panel, a micro light emitting diode ("LED") panel, a field emission display panel, or an electrophoretic display panel may also be applied.

The display panel 100 includes pixels. The pixels may be disposed in the display area DA. Unlike the drawing, the display panel 100 may include a plurality of pixels. The display panel 100 may include a first substrate 101, a second substrate 161, a plurality of conductive layers, a plurality of insulating layers for insulating the same, an organic layer EL, and the like.

The first substrate 101 is arranged throughout the display area DA and the non-display area NA. The first substrate 101 according to an exemplary embodiment may have a shape that is retracted to be partially rounded in a thickness direction in the non-display area NA including the third sealing area SA3. That is, a thickness of the first substrate 101 in a third direction DR3 may gradually decrease from the area adjacent to the display area DA to the non-display area NA including the third sealing area SA3. In this case, since the first substrate 101 retreats in a lounge shape, the width of decrease in the thickness may gradually decrease. The first substrate 101 may serve to support various elements disposed above the first substrate 101. In an exemplary embodiment, the first substrate 101 may be a rigid substrate including a rigid material such as soft glass, quartz, or the like. However, the invention is not limited thereto and the first substrate 101 may be a semi-soft substrate including some soft materials. In an exemplary embodiment, when the first substrate 101 is the semi-soft substrate, the first substrate 101 may include polyethylene terephthalate ("PET"), polyimide ("PI"), polycarbonate ("PC"), polyethylene ("PE"), polypropylene ("PP"), polysulfone ("PSF"), polymethacrylate ("PMMA"), triacetylcellulose ("TAC"), cycloolefin polymer ("COP"), and the like, for example. In this case, a part of the first substrate 101 may be curved, bent, or folded.

The buffer layer 102 may be disposed on the first substrate 101. The buffer layer 102 may prevent penetration of moisture and oxygen from the outside through the first substrate 101. Further, the buffer layer 102 may planarize the surface of the first substrate 101. In an exemplary embodiment, the buffer layer 102 may include any one of a silicon nitride (SiNx) film, a silicon oxide (SiO$_2$) film, and a silicon oxynitride (SiOxNy) film, for example.

In an exemplary embodiment, a plurality of conductive layers and insulating layers disposed on the buffer layer 102 and the buffer layer 102 are not disposed in the first sealing area SA1 so as to expose a top of the first substrate 101 in the first sealing area SA1. The exposed top of the first substrate 101 may be sealed with the second substrate 161 as described below. However, the invention is not limited thereto, and in another exemplary embodiment, the buffer layer 102 may be disposed even in the first sealing area SA1 and layers above the buffer layer 102 may not be disposed in the first sealing area SA1, and a partial area of the buffer layer 102 to which the laser is irradiated may be melted together with the first substrate 101 and the second substrate 161 during a sealing process.

The semiconductor layer 105 may be disposed on the buffer layer 102. The semiconductor layer 105 forms a channel of a thin film transistor ("TFT"). The semiconductor layer 105 is disposed in each pixel of the display area DA and in some cases, the semiconductor layer 105 may be disposed even in the non-display area NA. The semiconductor layer 105 may include a source/drain area and an active area. In an exemplary embodiment, the semiconductor layer 105 may include polycrystalline silicon, for example.

A first insulating layer 111 may be disposed on the semiconductor layer 105. The first insulating layer 111 may be substantially disposed over an entire surface of a first substrate (also referred to as a base substrate) 101 including the display area DA and the non-display area NA. The first insulating layer 111 may be a gate insulating film having a gate insulating function. In an exemplary embodiment, the first insulating layer 111 may include a silicon compound, a metal oxide, and the like, for example. In an exemplary embodiment, the first insulating layer 111 may include silicon oxide, silicon nitride, silicon oxynitride, aluminum oxide, tantalum oxide, hafnium oxide, zirconium oxide, titanium oxide, and the like, for example. Silicon oxide, silicon nitride, silicon oxynitride, aluminum oxide, tantalum oxide, hafnium oxide, zirconium oxide, titanium oxide, and the like may be used singly or in combination with each other.

A first conductive layer 120 may be disposed on the first insulating layer 111. In an exemplary embodiment, the first conductive layer 120 may include a gate electrode 121 of a TFT and a first pad 122. The first conductive layer 120 may include a metallic material. In an exemplary embodiment, the first conductive layer 120 may include at least one metal including at least one of molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu), for example.

A second insulating layer 112 may be disposed on the first conductive layer 120. The second insulating layer 112 may insulate the first conductive layer 120 and the second conductive layer 130 from each other. The second insulating layer 112 may be selected among the illustrated materials of the first insulating layer 111.

A second conductive layer 130 may be disposed on the second insulating layer 112. The second conductive layer 130 may include a source electrode 131, a drain electrode 132, and a second pad 133. The second conductive layer 130 may include the illustrated materials of the first conductive layer 120.

A FPC may be attached onto the top of the second pad 133. The FPC is bent to surround one side of the first substrate 101 to overlap with a lower portion of the lower panel sheet 200.

A first via layer 140 may be disposed on the second conductive layer 130. In an exemplary embodiment, the first via layer 140 may include an organic insulating material such as the polyacrylates resin, the epoxy resin, the phenolic resin, the polyamides resin, the polyimides resin, the unsaturated polyesters resin, the polyphenylenethers resin, the polyphenylene resin, the polyphenylene resin, the polyphenylenesulfides resin, or benzocyclobutene ("BCB").

An anode electrode ANO is disposed on the first via layer 140. The anode electrode ANO may be electrically connected to a drain electrode 132 of the thin film transistor TFT through a contact hole penetrating the first via layer 140.

A pixel defined layer 150 may be disposed on the anode electrode ANO. An opening exposing the anode electrode ANO may be defined in the pixel defined layer 150. The pixel defined layer 150 may include an organic material or an inorganic material. In an exemplary embodiment, the pixel defined layer 150 may include a material such as a photoresist, a polyimide resin, an acrylic resin, a silicon compound, a polyacrylic resin, or the like, for example. An electroluminescent layer EL may be disposed on the top of the anode electrode ANO and in the opening of the pixel defined layer 150. A cathode electrode CAT is disposed on the electroluminescent layer EL and the pixel defined layer 150. The cathode electrode CAT may be a common electrode disposed over a plurality of pixels.

The lower panel sheet 200 is disposed below the display panel 100. The lower panel sheet 200 includes at least one functional layer. The functional layer may be a layer that performs a heat dissipation function, an electromagnetic wave shielding function, a grounding function, a buffering function, a strength enhancement function, a support function, a digitizing function, and the like. The functional layer may be a sheet layer including a sheet, a film layer including a film, a thin-film layer, a coating layer, a panel, a plate, or the like. One functional layer may be constituted the single layer, but may also be constituted by of a plurality of laminated thin films or coating layers. The functional layer may be, for example, a support substrate, a heat dissipation layer, an electromagnetic wave shielding layer, an impact absorbing layer, a digitizer, and the like.

The second substrate 161 may be disposed at the top of the display panel 100. Specifically, the second substrate 161 may be disposed on an upper surface of the FPC connected to a plurality of insulating layers, the conductive layer, the electroluminescent layer EL, and the first substrate 101 of the display panel 100. The second substrate 161 may overlap with the first substrate 101 in a thickness direction (e.g., vertical direction in FIG. 2) and may have the same planar shape as that of the first substrate 101. Side surfaces of the first substrate 101 and the second substrate 161 may be aligned with each other. The second substrate 161 may include the illustrated materials of those of the first substrate 101.

The thickness of the second substrate 161 in the sealing area SA may be larger than a thickness in an area other than the sealing area SA. A lower surface of the second substrate 161 may be sealed with the first substrate 101 or the FPC in the sealing area SA. The second substrate 161 may be sealed with the upper surface of the first substrate 101 in the first, second and fourth sealing areas SA1, SA2 and SA4. In the third sealing area SA3, the second substrate 161 may be attached to the upper surface of the FPC through an illustrated frit. The first substrate 101 and the second substrate 161 may be sealed with each other through a composite device 300 (refer to FIG. 3) in the first, second and fourth sealing areas SA1, SA2 and SA4. Hereinafter, sealing and inspecting the composite device 300 that seals the sealing areas SA1, SA2 and SA4 of the display device 1 and the display device 1 will be described.

Figure 3A:
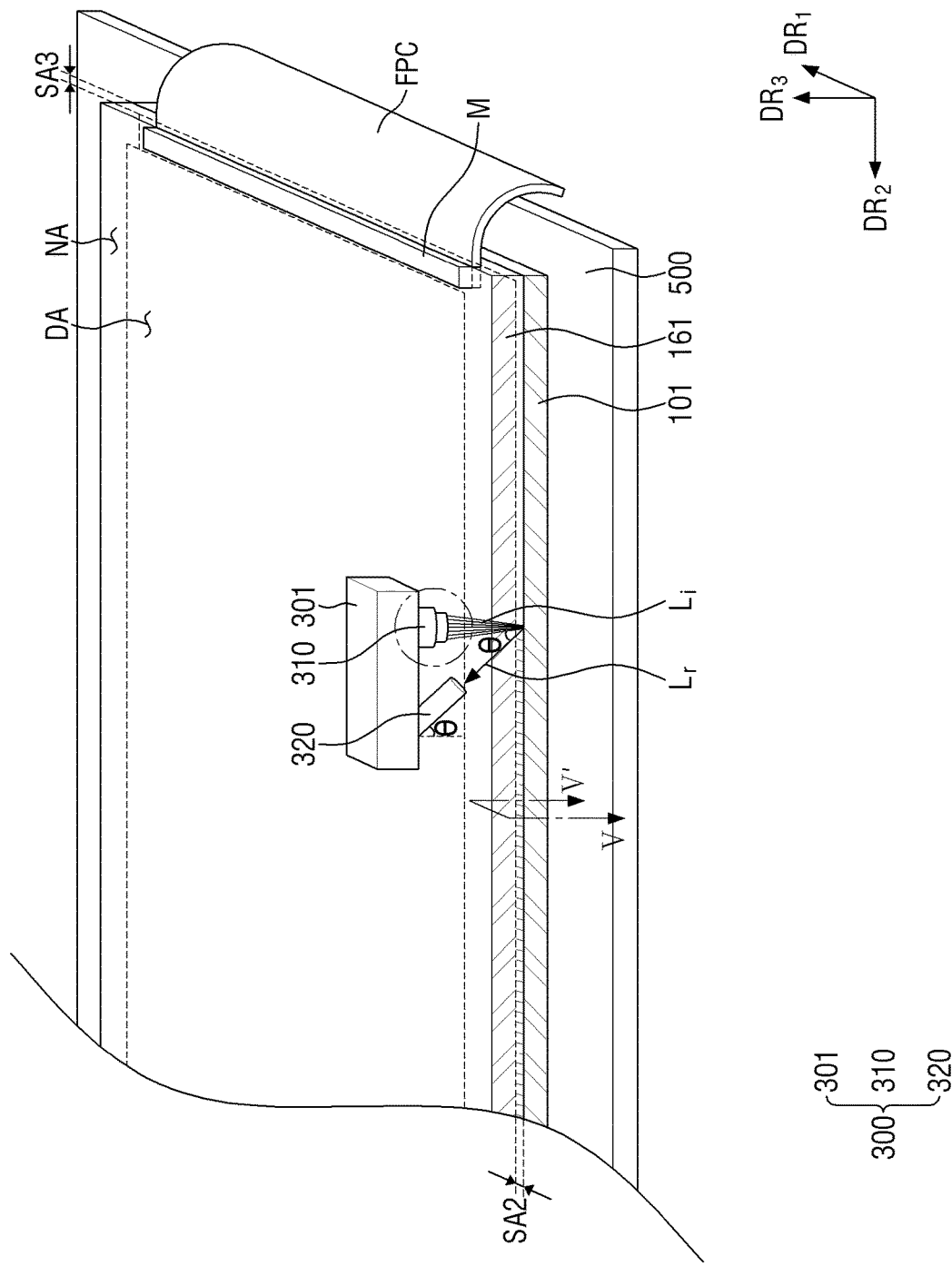
FIG. 3A is a perspective view illustrating an exemplary embodiment of a sealing inspection module.
Figure 3B:
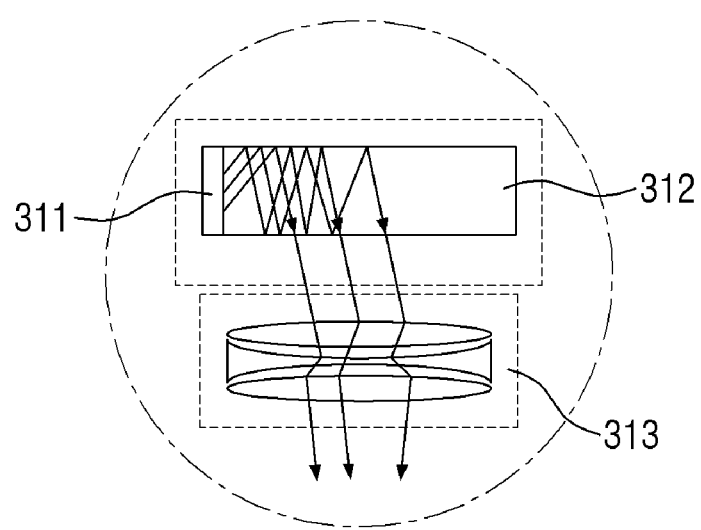
FIG. 3B is an enlarged view of a portion of FIG. 3A.
Figure 4A:
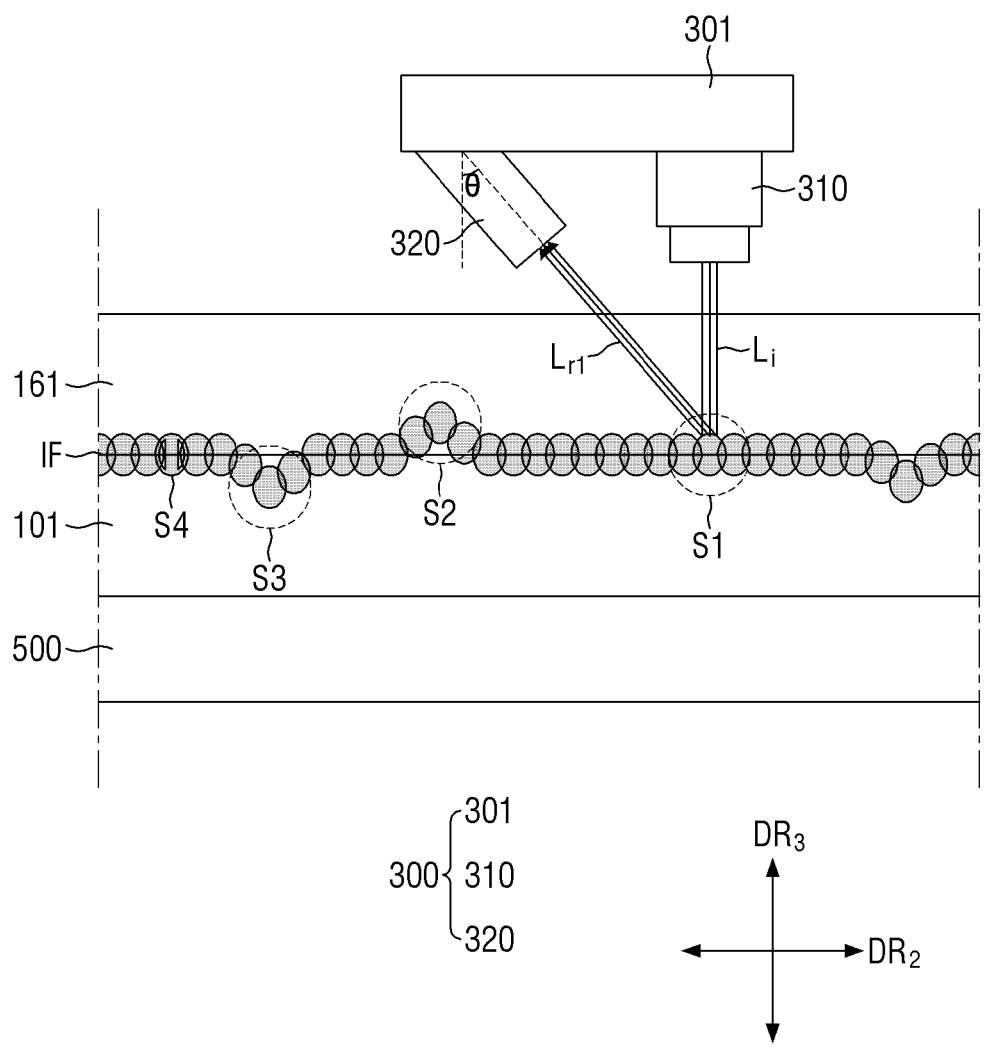
FIGS. 4A to 4C are cross-sectional views illustrating an exemplary embodiment of a process of inspecting sealing by the sealing inspection module.
Figure 4B:
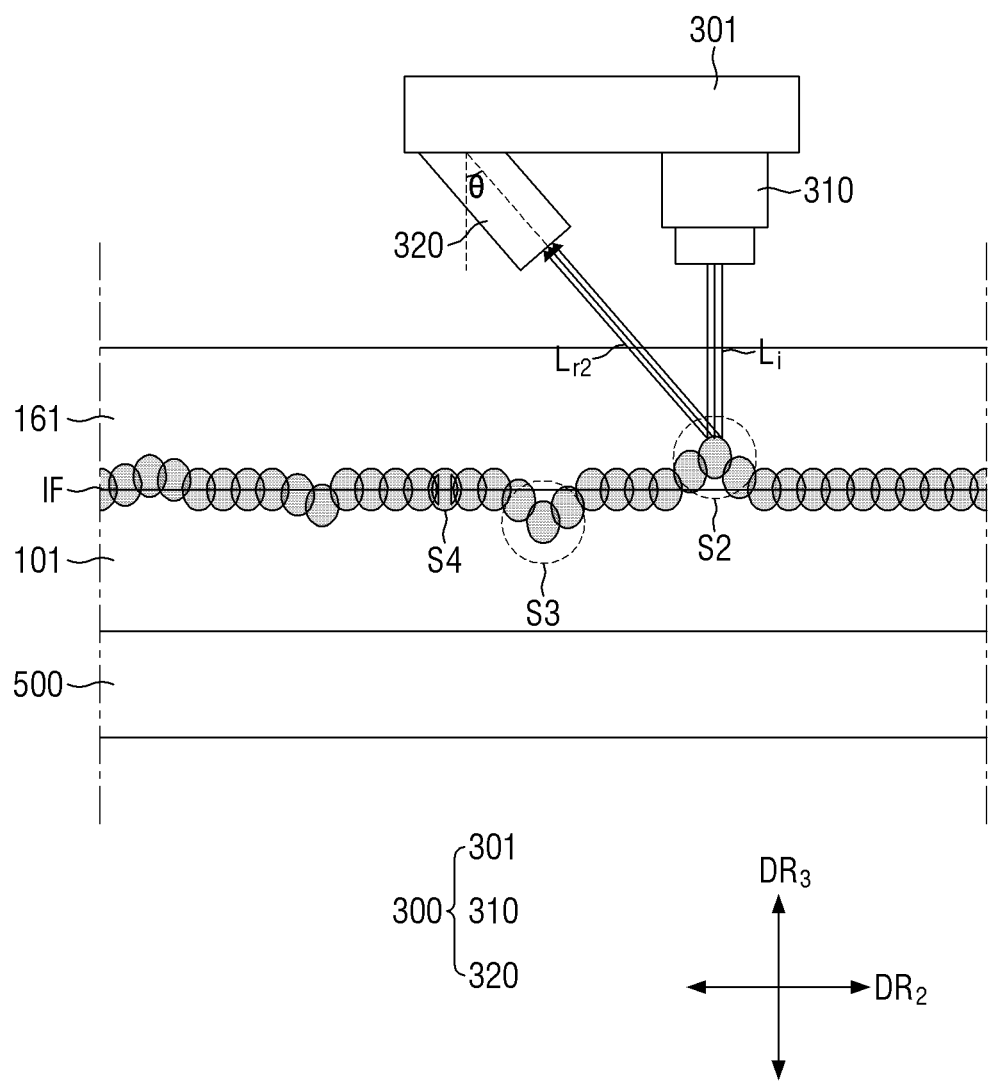
Figure 4C:
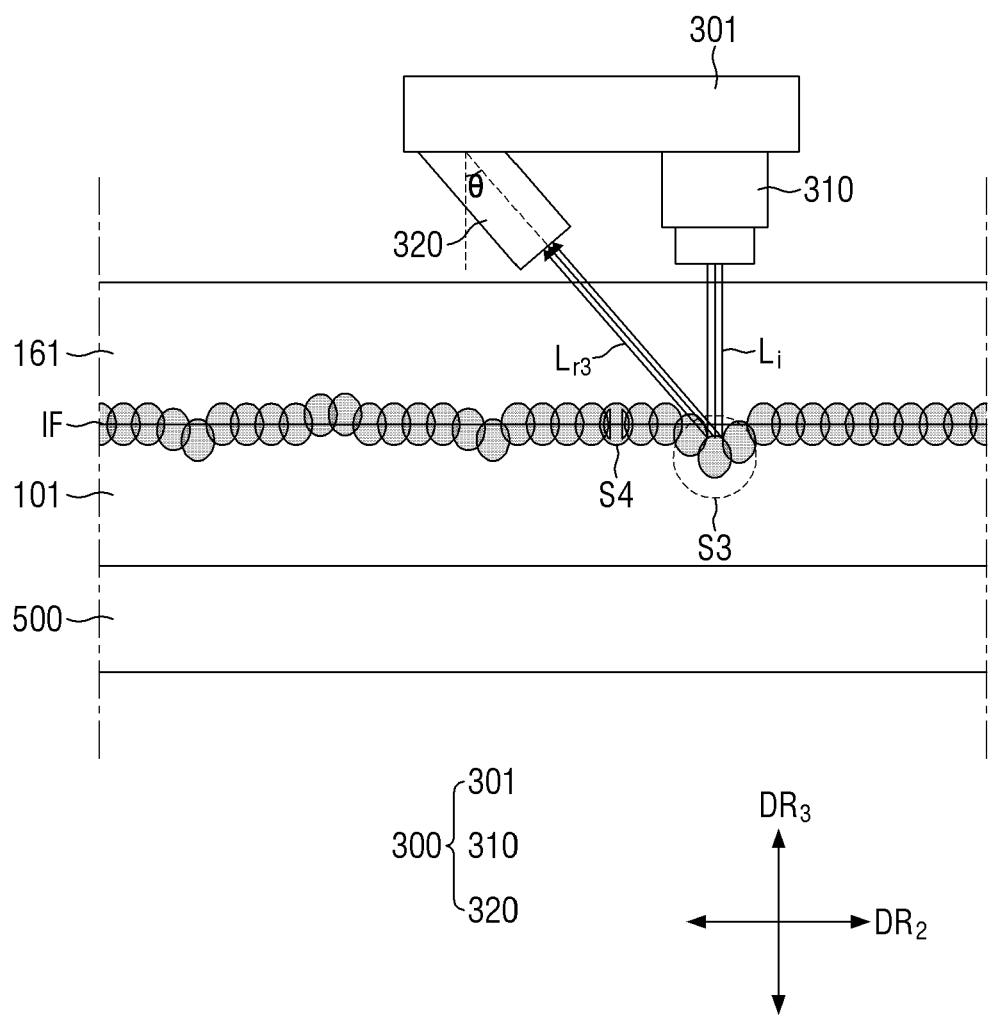
Figure 5A:
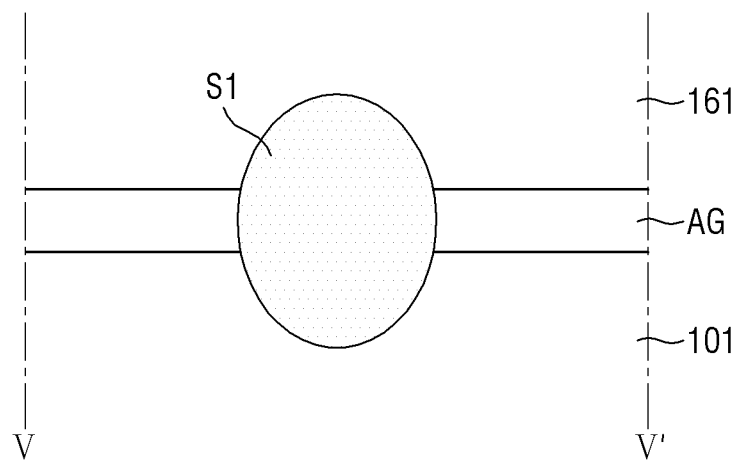
FIGS. 5A to 5D are cross-sectional views of first to fourth sealing cells.
Figure 5B:
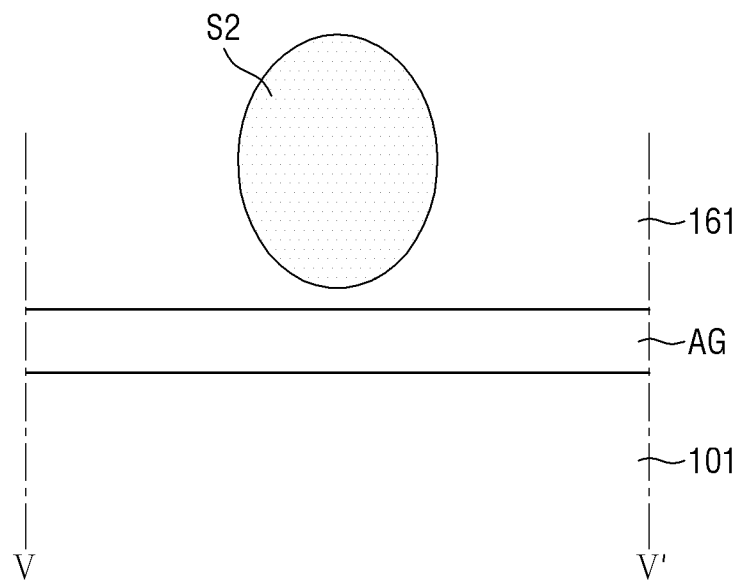
Figure 5C:
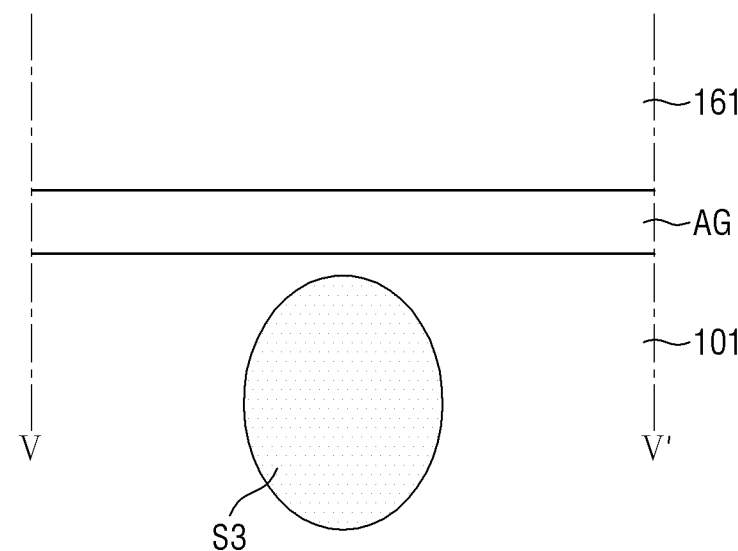
Figure 5D:
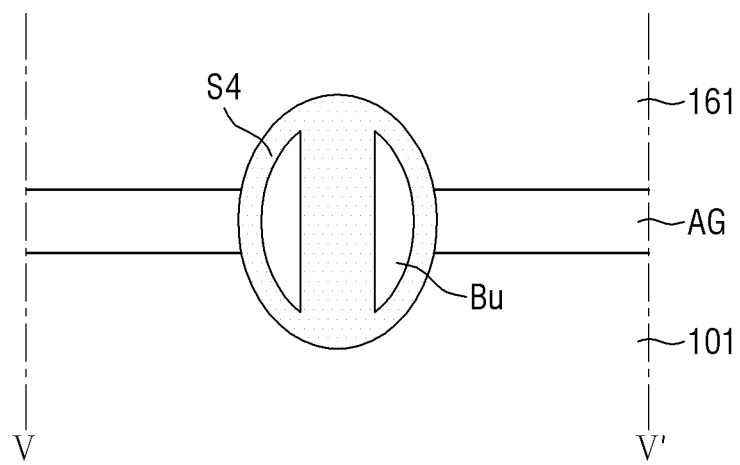
Figure 6:
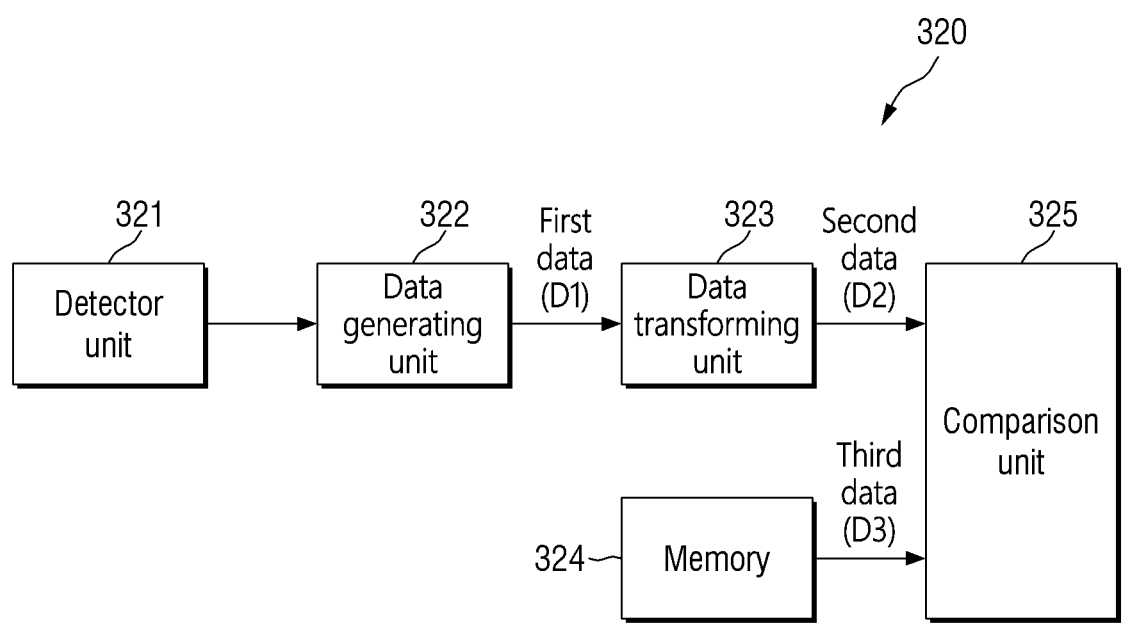
FIG. 6 is a block diagram illustrating an exemplary embodiment of a configuration of a sealing inspection module.
Figure 7:
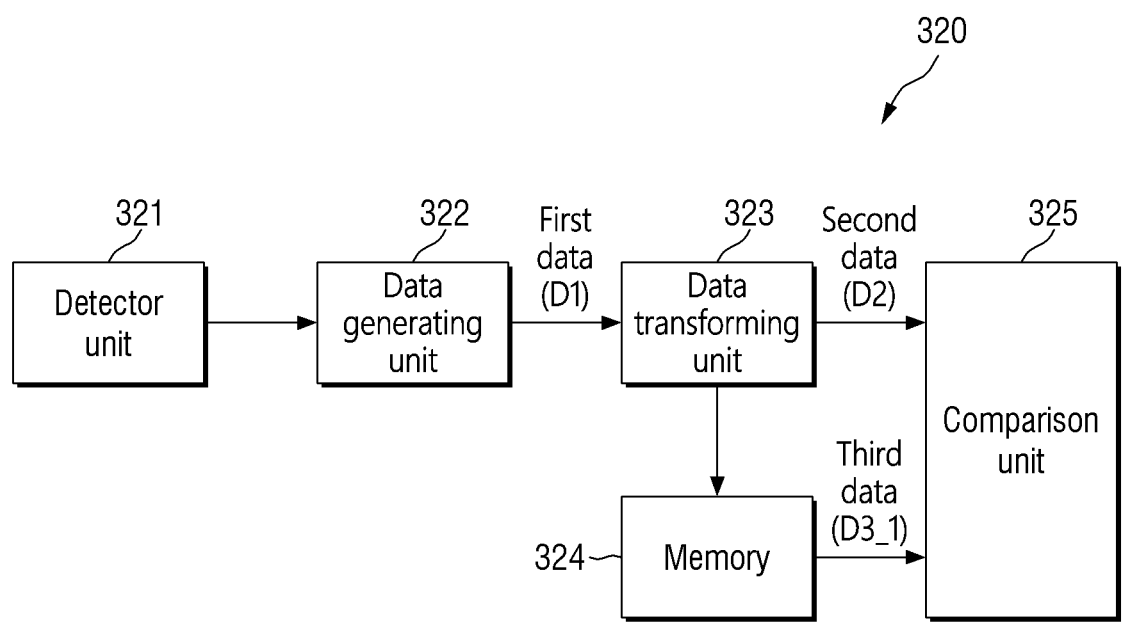
FIG. 7 is a block diagram illustrating a modified example of a configuration of a sealing inspection module.

FIG. 3 is a perspective view illustrating a sealing inspection module according to an exemplary embodiment, FIGS. 4A to 4C are cross-sectional views illustrating a process of inspecting sealing by the sealing inspection module according to an exemplary embodiment, FIGS. 5A to 5D are cross-sectional views of first to fourth sealing cells, and FIG. 6 is a block diagram illustrating a configuration of a sealing inspection module according to an exemplary embodiment. FIG. 7 is a block diagram illustrating a configuration of a sealing inspection module according to a modified example.

Referring to FIGS. 3 to 6, the sealing composite device 300 according to an exemplary embodiment may include a sealing module 310, a sealing inspection module 320, and a control device 301 for controlling them. Constituent devices of the composite device 300 are unitary.

The constituent devices of the composite device 300 are all unitary.

The sealing module 310 may include a light source unit 311 that emits light, an oscillation unit 312 that oscillates light, and a lens unit 313 that changes an optical path. The light source unit 311 may emit the light. In an exemplary embodiment, the light may be a laser. In an exemplary embodiment, the laser may be a femtosecond laser, for example. In an exemplary embodiment, the femtosecond laser may mean a laser having a pulse width of about 200 femtoseconds or more and 500 femtoseconds or less, for example. However, the femtosecond laser is not limited thereto and may be light in a short wavelength band ranging from a near infrared ray ("IR") laser to an ultraviolet ("UV") laser or multi-wavelength band light including light in various wavelength bands. The light emitted from the light source unit 311 may enter the oscillation unit 312. While the light incident in the oscillation unit 312 is repeatedly reflected on glass-made reflection member (not illustrated) disposed on the upper and lower surfaces, energy of the light may be amplified. When the light energy is sufficiently amplified, the light penetrates the reflection member disposed on the lower surface to be incident in the lens unit 313. The optical path of the light incident in the lens unit 313 may be changed through a plurality of lenses of which respective shapes and functions are different from each other as illustrated. As illustrated, the lens unit 313 may have a configuration in which a lens having a center with a concave shape is inserted between lenses having the centers with a convex shape, but is not limited thereto. The light incident in the lens unit 313 may be spot-focused on the sealing area SA of the display panel 100 after passing through the lens unit 313. That is, the light emitted from the light source unit 311 passes through the lens unit 313, thereby enhancing a light quality.

In the exemplary embodiment, when bonding the first substrate 101 and the second substrate 161 is completed, the bonded substrates may become the display panel 100 of the display device 1. However, when the first substrate 101 and the second substrate 161 are not bonded to each other or the bonding is not completed, a component including the first substrate 101 and the second substrate 161 may be interpreted as a target panel.

Hereinafter, the target panel is designated by the same reference numeral and term as the display panel, but it will be understood that the examples may be different. In the illustrated exemplary embodiment, an interface IF may be provided between the first substrate 101 and the second substrate 161.

As illustrated in FIG. 3, a stage 500 may be disposed below the display panel 100 (refer to FIG. 2). The stage 500 may serve to move the display panel thereabove so that the sealing composite device 300 which is fixed while moving at a predetermined velocity may aims the sealing area SA of the display panel 100. In an exemplary embodiment, when the sealing composite device 300 sequentially seals and inspects the sealing areas from the second sealing area SA2 to the third sealing area SA3, the stage 500 disposed below the display panel 100 moves in a second direction DR2 in order to seal and inspect the second sealing area SA2 and may move in a first direction DR1 again after the sealing composite device 300 completes sealing and inspection of the second sealing area SA2, for example. In this case, the sealing composite device 300 may move relatively with the stage 500. However, the invention is not limited thereto and while the display panel 100 is positioned as it is and the sealing composite device 300 moves above the display panel 100, sealing and inspection processes may be performed. Hereinafter, for convenience of description, it is primarily described that the sealing composite device 300 moves, but the sealing composite device 300 may move relatively by the stage 500 as described above.

In an exemplary embodiment, a mask M may further disposed on the FPC disposed above the third sealing area SA3. When the composite device 300 is disposed in the third sealing area SA3 by moving the stage 500, the mask may interrupt the light emitted from the sealing module 310 from being irradiated to the FPC. As a result, damage to the FPC and a plurality of wires (not illustrated) disposed on the FPC may be prevented.

In FIG. 3, a gap between the first substrate 101 and the second substrate 161 in the third direction DR3 is not illustrated, but referring to FIGS. 5A to 5D, the gap in the third direction DR3 may exist between the first substrate 101 and the second substrate 161. The gap may be an air gap AG. The air gap AG may exist even before the first substrate 101 and the second substrate 161 are bonded. The air gap AG may be generated because facing planes of the first substrate 101 and the second substrate 161 are not completely flat and may include some degree of roughness. Accordingly, the air gap AG may not exist according to characteristics of the facing planes of the first substrate 101 and the second substrate 161. In an exemplary embodiment, a thickness of the air gap AG may vary depending on curves of the first substrate 101 and the second substrate 161, but may be substantially in the range of about 0 nanometer (nm) to about 1000 nm, for example. Further, when the first substrate 101 and the second substrate 161 are bonded to each other, parts of the first substrate 101 and the second substrate 161 are melted, and as a result, a space of the air gap AG may be filled with the melted parts. In this case, bonding may be in a good state. However, parts of the first substrate 101 and the second substrate 161 are melted, but the air gap AG may not be completely filled and in this case, sealing of the first substrate 101 and the second substrate 161 may be in a bad state.

A plurality of sealing cells S may be arranged in a second direction DR2. Respective sealing cells S may be discontinuously formed in the second direction DR2. The reason is that when the light emitted from the sealing module 310 is the laser, the light has a pulse vibration characteristic. The sealing cells S arranged in the second direction DR2 may overlap with adjacent sealing cells S in the second direction DR2, but are not limited thereto.

The sealing area SA may include the plurality of sealing cells S. The respective sealing cells S may be formed by melting the first substrate 101 and/or the second substrate 161 by light Li emitted by the sealing module 310. The sealing cell S may include a first cell S1 passing through the air gap AG in the third direction DR3, a second cell S2 disposed above the air gap AG in the third direction DR3, a third cell S3 disposed below the air gap AG in the third direction DR3 of the air gap AG, and a fourth cell S4 passing through the air gap AG in the third direction DR3 and including bubbles Bu of a predetermined degree therein. The first cell S1 may physically connect and seal the first substrate 101 and the second substrate 161, but the second to fourth sealing cells S2 to S4 may be areas where the first substrate 101 and the second substrate 161 are not connected and sealed.

The light Li emitted from the sealing module 310 is focused on an area between the first substrate 101 and the second substrate 161 as described above. A distance from the sealing module 310 up to the focus is fixed. However, in the sealing module 310, the emitted light Li may be focused on another area other than a focused area due to upward or downward shaking or an aberration of the lens unit 313. In this case, each of the second cell S2 and the third cell S3 may be formed. Air around the fourth cell S4 may be trapped and formed when the first substrate 101 and the second substrate 161 of the sealing area SA are sealed due to the sealing module 310. The sealing inspection module 320 according to an exemplary embodiment is fixed at a predetermined angle with the sealing module 310 to determine whether sealing of each of the sealing cells S1 to S4 is defective. In an exemplary embodiment, the angle may be in the range of about 0 degree to about 60 degrees, for example.

The sealing inspection module 320 according to an exemplary embodiment is connected with the control device 301 and the sealing module 310 irradiates to the light Li to the sealing area SA and thereafter, inspects reflected light Lr to serve to whether sealing is defective. In an exemplary embodiment, the sealing inspection module 320 may include a detector unit 321, a data generating unit 322, a data transforming unit 323, a memory unit 324, and a comparison unit 325 as illustrated in FIG. 6.

The detector unit 321 may serve to receive the light Lr reflected in the sealing area SA. The data generating unit 322 measures an amount of the light received by the detector unit 321 and transforms the light amount into intensity, voltage, current, and energy corresponding to the light amount to generate first data D1. The first data D1 may be a fluctuate amplitude value of the voltage, the current, or the energy depending on the light amount and a voltage, current, or energy value in a specific wavelength area.

The data transforming unit 323 may serve to transform the first data D1 extracted by the data generating unit 322 into another format and transform the first data D1 into transformed second data D2. In the exemplary embodiment, the data transforming unit 325 Fourier-transforms the first data D1 to extract the transformed second data D2. According to the exemplary embodiment, when the first data D1 is Fourier-transformed, data may be obtained, which is filtered by transforming the first data D1 expressed as an aperiodic function into the transformed second data D2 expressed as a periodic function. In some exemplary embodiments, the data transforming unit 323 may be omitted. When the data transforming unit 323 is omitted, the first data D1 generated by the data generating unit 322 is transmitted to the comparison unit 325 and compared with third data D3 stored in the memory unit 324 to determine whether the sealing is defective.

The memory unit 324 may serve to store the third data D3 which may be compared with the first data D1 extracted through the data generating unit 322 or the second data D2 into which the first data D1 is transformed. The third data D3 stored by the memory unit 324 may be stored based on the first data D1 or the second data D2. In an exemplary embodiment, the third data D3 may be an intensity, voltage, current, or energy value corresponding to the light amount in a wavelength area band, for example. Further, the third data D3 may be a fluctuate amplitude value of the voltage, the current, or the energy depending on the light amount and a voltage, current, or energy value in a specific wavelength area. In an exemplary embodiment, the wavelength area band stored in the memory unit 324 may be in the range of about 400 nm to about 1000 nm, for example. In an exemplary embodiment, an amplitude value of the voltage of the third data D3 may be in the range of about 10 millivolts to about 100 (mV), for example. In an exemplary embodiment, an energy amplitude value of the third data D3 may be in the range of about 1 microjoule (μJ) to about 100 μJ, for example. In an exemplary embodiment, the voltage of the third data D3 may be in the range of about 2000 to about 3000 mV in any one wavelength in the wavelength area band in the range of about 400 nm to about 1000 nm, for example. In an exemplary embodiment, the energy of the third data D3 may be in the range of about 50 μJ to about 100 μJ, for example. When the third data D3 is stored based on the second data D2, data subjected to data transformation of the third data D3 based on the first data D1 may be stored.

The comparison unit 325 may serve to determine a defective sealing area of the display panel 100. Specifically, the comparison unit 325 compares the first data D1 and the third data D3 to determine the defective sealing area. In an exemplary embodiment, when the intensity or energy in the first data D1 is reduced by about 5% or more as compared with the third data D3 in the wavelength area band, for example, about 400 nm to about 1000 nm, for example, the comparison unit 325 may determine that the corresponding area is the defective sealing area. In an exemplary embodiment, when an amplitude value of the voltage of the first data D1 is about 10 mV to about 100 mV or more or the energy amplitude value of the first data D1 is about 1 μJ to about 50 μJ or more, for example, it may be determined that the corresponding area is the defective sealing area. In an exemplary embodiment, when the voltage of the first data D1 is about 2000 mV to about 3000 mV or less in any one wavelength in the wavelength area band in the range of about 400 nm to about 1000 nm or the energy of the first data D1 is about 50 μJ to about 100 μJ or less, for example, it may be determined that the corresponding area is the defective sealing area. In a case where the data-transformed second data D2 is compared with the third data D3 to determine whether the sealing is defective as described above, it may be determined that the corresponding area is the defective sealing area when the intensity or energy in the second data D2 is reduced by a specific range or more as compared with the third data D3 for example, in the range of about 400 nm to about 1000 nm similarly thereto. Furthermore, it may be determined that the corresponding area is the defective sealing area with the amplitude value of the voltage or the energy amplitude value or the voltage value or energy value of the second data D2.

The sealing inspection module 320 according to an exemplary embodiment is physically connected to the sealing module 310 so that the sealing module 310 may measure the light reflected on the sealing area SA in real time while performing the process of sealing the sealing area SA by irradiating the light to the sealing area SA. As a result, the sealing inspection module 320 may determine whether the sealing is defective in real time.

Although not illustrated, the sealing inspection module 320 may further include an output unit. The output unit may serve to output a signal when the comparison unit 325 determines that the corresponding area is the defective sealing area of the display panel 100. The signal may be, for example, a video signal or an alarm signal. When the sealing inspection module 320 includes the output unit, the output unit may immediately inform the defective sealing area while performing the sealing process through the video signal or the alarm signal.

FIG. 7 is a block diagram illustrating a configuration of a sealing inspection module according to a modified example. FIG. 7 is different from FIG. 6 in that data measured during sealing based on the value of the intensity or power amount E or voltage or current is stored to determine the defective sealing area.

Hereinafter, a method for manufacturing of the display device will be described. In the following embodiments, the same components as those of the previously described embodiments will be referred to as the same reference numeral and the description thereof will be omitted or simplified.

FIG. 7 is a block diagram illustrating a configuration of a sealing inspection module according to a modified example.

The sealing inspection module 320_3 according to the exemplary embodiment is physically connected to the sealing module 310 so that the sealing module 310 may measure the light reflected on the sealing area SA in real time while performing the process of sealing the sealing area SA by irradiating the light to the sealing area SA. As a result, the sealing inspection module 320_3 may determine whether the sealing is defective in real time.

Hereinafter, the method for manufacturing of the display device according to an exemplary embodiment will be described. In the following embodiment, description of the parts described in the above-described sealing inspection module will be omitted or simplified, and differences will be mainly described.

Figure 8:
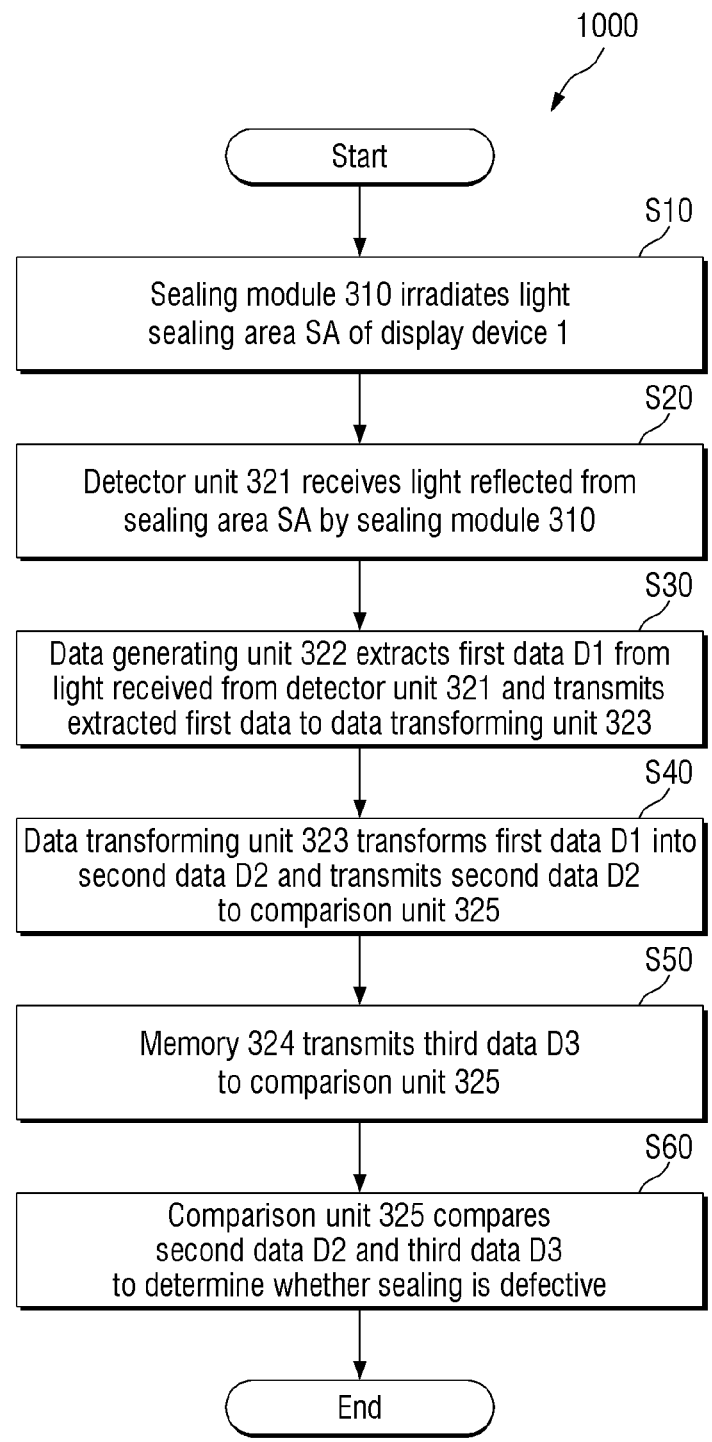
FIG. 8 is a flowchart of an exemplary embodiment of a method for manufacturing a display device.

FIG. 8 is a flowchart of a method for manufacturing a display device according to an exemplary embodiment.

The method 1000 for manufacturing of the display device according to an exemplary embodiment includes preparing a target panel 100 including a sealing area SA between a first substrate 101 and a second substrate 161 in the target panel 100 including the first substrate 101 and the second substrate 161 disposed on one surface of the first substrate 101.

Referring to FIG. 8, the method for manufacturing of the display device according to an exemplary embodiment includes irradiating, by a sealing module 310, light to the sealing area SA of the display device 1 (S10), receiving, by a detector unit 321, light Lr reflected from the sealing area SA by the sealing module 310 (S20), extracting, by a data generating unit 322, first data D1 from the light received from the detector unit 321 and transmitting the extracted first data D1 to a data transforming unit 323 (S30), transforming, by the data transforming unit 323, the first data D1 into second data D2 and transmitting the second data D2 to a comparison unit 325 (S40), transmitting, by a memory unit 324, third data (also referred to as a reference data) D3 to the comparison unit 325 (S50), and comparing, by the comparison unit 325, the second data D2 and the reference data D3 to determine whether sealing is defective (S60).

The irradiating of the light to the sealing area SA (S10) may include bonding the first substrate 101 and the second substrate 161. In an exemplary embodiment, the light may include a femtosecond laser, for example. The first substrate 101 and the second substrate 161 may be partially melted and solidified and bonded to each other in the sealing area SA where the femtosecond laser is incident.

As described above, in some exemplary embodiments, the data transforming unit 323 may be omitted. When the data transforming unit 323 is omitted, the first data D1 generated by the data generating unit 322 is transmitted to the comparison unit 325 and compared with third data D3 stored in the memory unit 324 to determine whether the sealing is defective.

Figure 9:
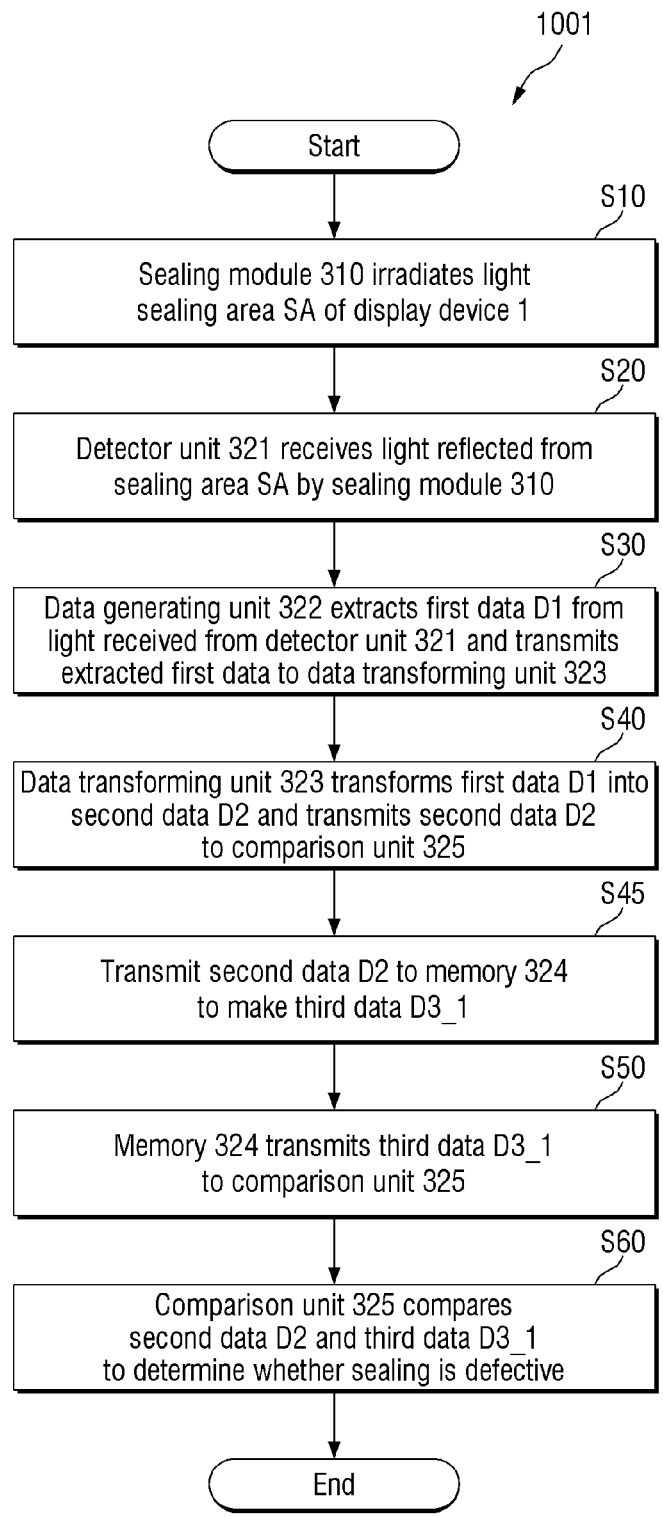
FIG. 9 is a flowchart of another exemplary embodiment of a method for manufacturing a display device.

FIG. 9 is a flowchart of a method for manufacturing a display device according to another exemplary embodiment.

Referring to FIG. 9, the method 1001 of FIG. 9 is different from the method 1000 for manufacturing a display device according to FIG. 8 in that the second data D2 is transmitted to the memory unit 324 to generate third data D3_1 (S45).

When the data transforming unit 323 is omitted as described above, the first data D1 generated by the data generating unit 322 may be transmitted to the comparison unit 325 and the first data D1 may be stored in the memory unit 324. The comparison unit 325 compares the third data D3_1 and the first data dl stored in the memory unit 324 with each other to determine whether the sealing is defective.

Figure 10:
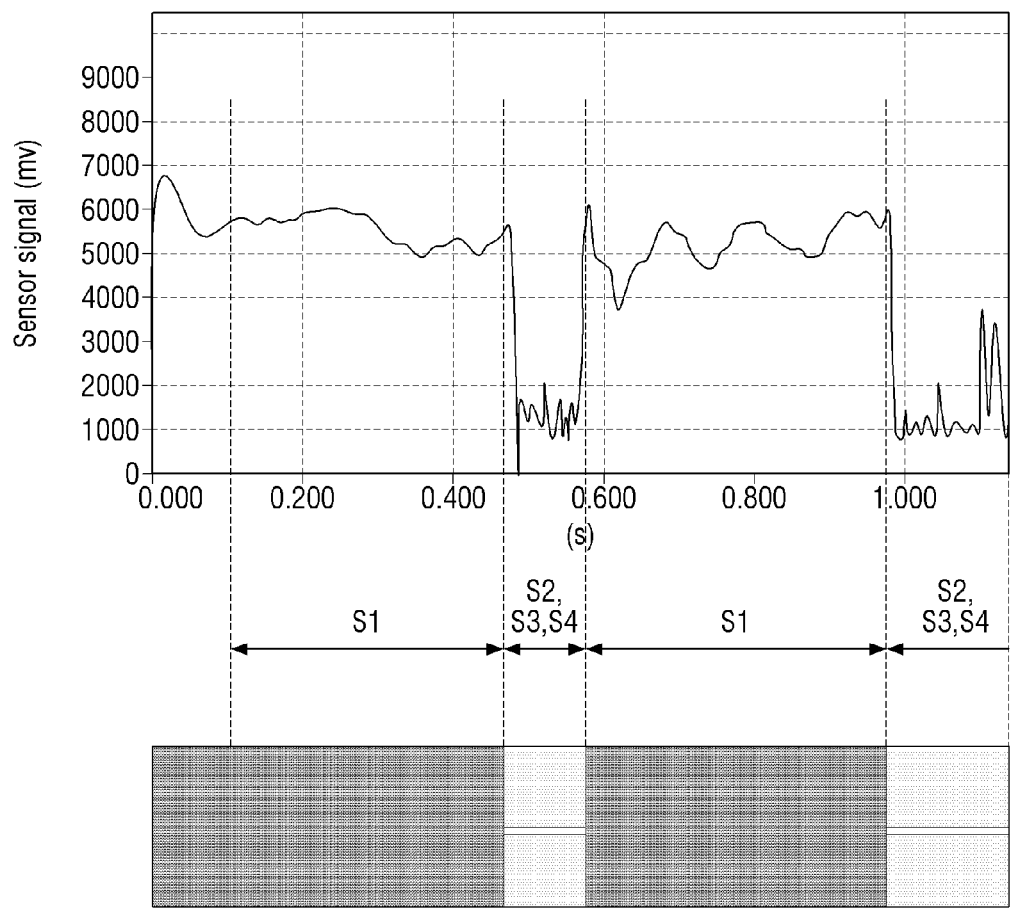
FIG. 10 is a graph illustrating measurement data of FIG. 8.

FIG. 10 is a graph illustrating measurement data of FIGS. 8 and 9. FIGS. 11A to 11D are graphs illustrating measurement data according to an exemplary embodiment.

Referring to FIGS. 5A to 5D and 10, voltage transformed by the data generating unit 322 through the light Lr in an interval of approximately 0.4 (s) to 0.6 (s) may be an area of which voltage is reduced by about 20% or more as compared with an interval of 0 (s) to 0.4 (s). The interval of 0 (s) to 0.4 (s) as an interval in which the first cells S1 are arranged may be an area in which sealing is good because there is no air gap AG between the first substrate 101 and the second substrate 161. On the contrary, the interval of approximately 0.4 (s) to 0.6 (s) as an interval in which at least one sealing cell among the second to fourth sealing cells S2 to S4 is disposed may be an area in which the sealing is defective because there is the air gap AG between the first substrate 101 and the second substrate 161 or the sealing cell S4 includes multiple air bubbles Bu therein even though there is no air gap AG between the first substrate 101 and the second substrate 161.

Figure 11A:
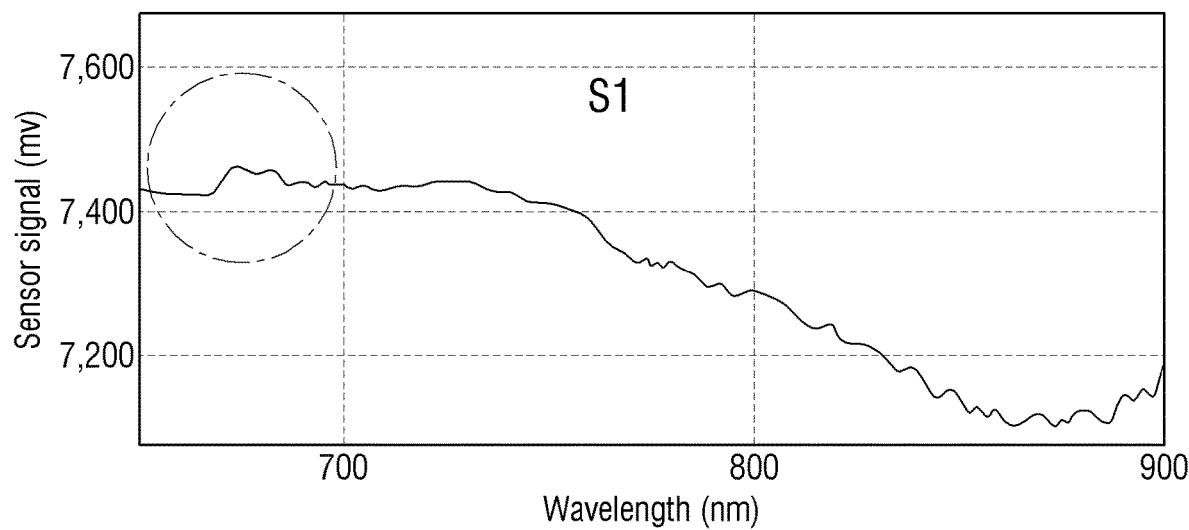
FIGS. 11A and 11C are graphs illustrating an exemplary embodiment of measurement data, and, and FIGS. 11B and 11D are enlarged views of portions of FIGS. 11A and 11C, respectively.
Figure 11B:
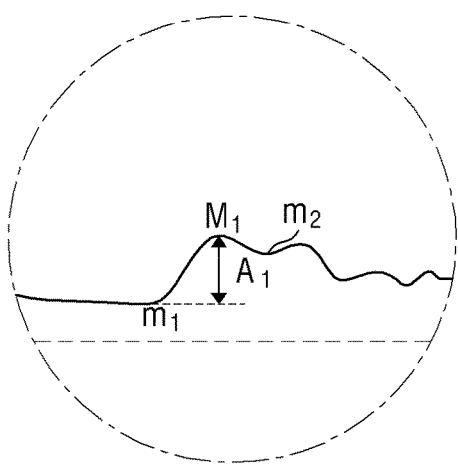
Figure 11C:
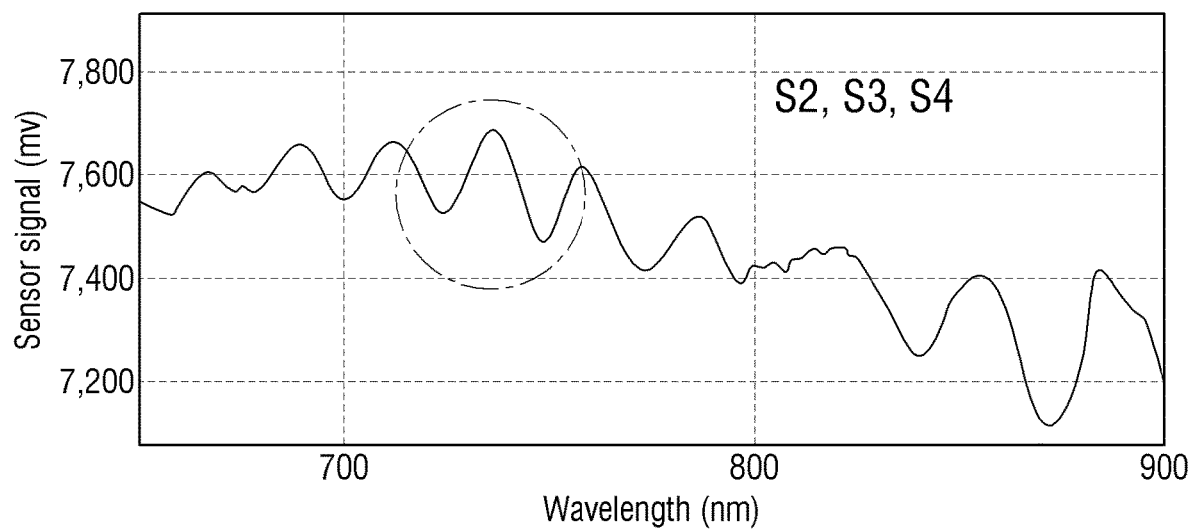
Figure 11D:
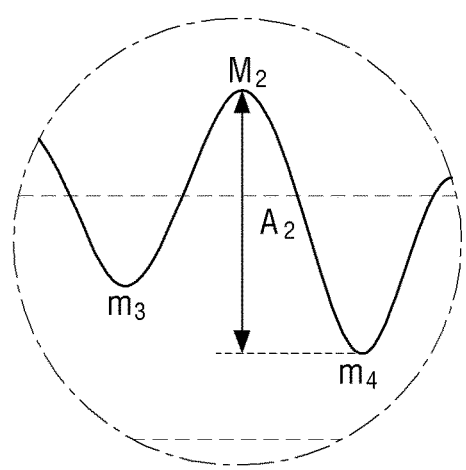

Referring to FIGS. 11A and 11C, an amplitude value means a value of an amplitude generated depending on fluctuation in the specification. In an exemplary embodiment, in FIG. 11A, an amplitude value A1 may mean a difference in value between a point m1 where the value falls and rises in a graph including an interval in which the value falls and rises and then, falls again and a point M1 where the value rises and falls again to a point m2, for example. In FIG. 11C, an amplitude value A2 may mean a difference in value between a point m3 where the value falls and rises in a graph including an interval in which the value falls and rises and then, falls again and a point M2 where the value rises and falls again to a point m4. As described above in the exemplary embodiment, the first data D1 may be a fluctuation amplitude value of voltage, current, or energy in a first wavelength area band or a voltage, current, or energy value in a specific wavelength area and the third data D3 may be a fluctuation amplitude value of the voltage, current, or energy in the first wavelength area band or a voltage, current, or energy value in a specific wavelength area. The comparison unit may compare amplitude values of voltage and energy of the first data D1 and the third data D3. In an exemplary embodiment, the first wavelength area band may be in the range of about 400 nm and about 1000 nm, for example. In an exemplary embodiment, the amplitude value of the voltage of the third data D3 may be in the range of about 10 mV to about 100 mV, for example. In an exemplary embodiment, the energy amplitude value of the third data D3 may be in the range of about 1 µJ to about 50 µJ, for example. In an exemplary embodiment, the voltage of the third data D3 may be in the range of about 2000 mV to about 3000 mV in any one wavelength in the wavelength area band in the range of about 400 nm to about 1000 nm, for example. In an exemplary embodiment, the energy of the third data D3 may be in the range of about 50 µJ to about 100 µJ, for example.

In an exemplary embodiment, the comparison unit 325 compares the first data D1 transmitted by the data generating unit 322 and the third data D3 transmitted by the memory unit 324 and when the amplitude value of the voltage of the first data D1 is about 10 mV to about 100 mV or more or the energy amplitude value of the first data D1 is about 1 joule (J) to about 50 J or more, for example, the comparison unit 325 may determine that the corresponding area is the defective sealing area. In an exemplary embodiment, when the voltage of the first data D1 is about 2000 mV to about 3000 mV or less in any one wavelength in the wavelength area band in the range of about 400 nm to about 1000 nm or the energy of the first data D1 is about 50 µJ to about 100 µJ or less, for example, it may be determined that the corresponding area is the defective sealing area.

In a case where the data-transformed second data D2 is compared with the third data D3 to determine whether the sealing is defective as described above, it may be determined that the corresponding area is the defective sealing area when the intensity or energy in the second data D2 is reduced by a specific range or more as compared with the third data D3, for example, in the range of about 400 nm to about 1000 nm similarly thereto. Furthermore, it may be determined that the corresponding area is the defective sealing area with the amplitude value of the voltage or the energy amplitude value or the voltage value or energy value of the second data D2.

The first data D1 may be an aperiodic function. The first data D1 may be transformed into a periodic function. The first data D1 may be Fourier-transformed. According to an exemplary embodiment, when the first data D1 is Fourier-transformed, data may be obtained, which is filtered by transforming the first data D1 expressed as the aperiodic function into the second data D2 expressed as the periodic function.

Figure 12A:
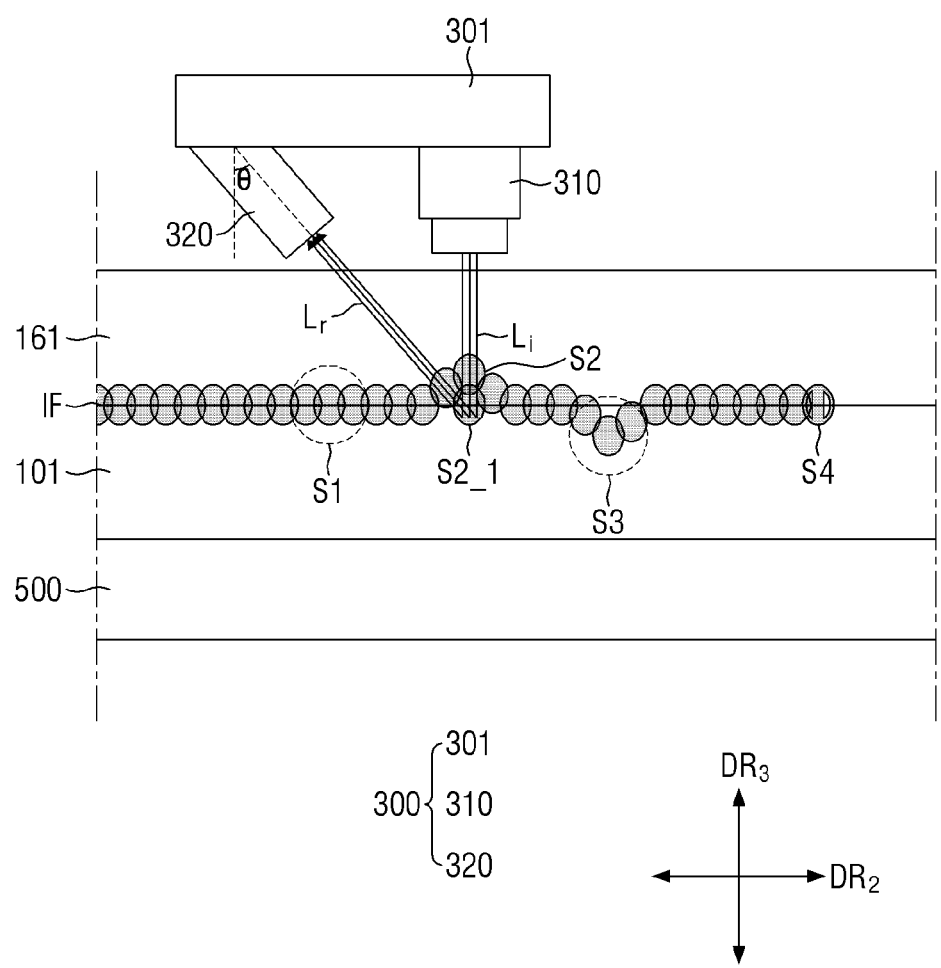
FIGS. 12A to 12C are views illustrating subsequent processes after the sealing inspection.
Figure 12B:
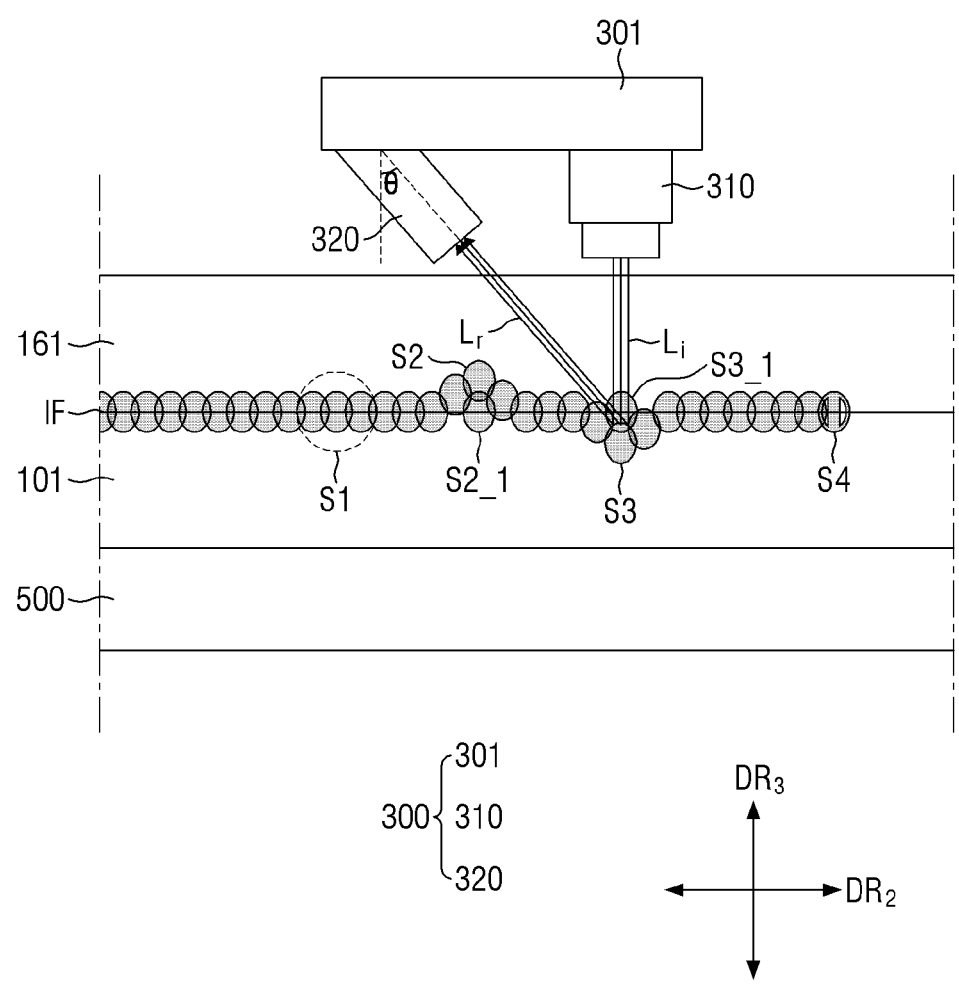
Figure 12C:
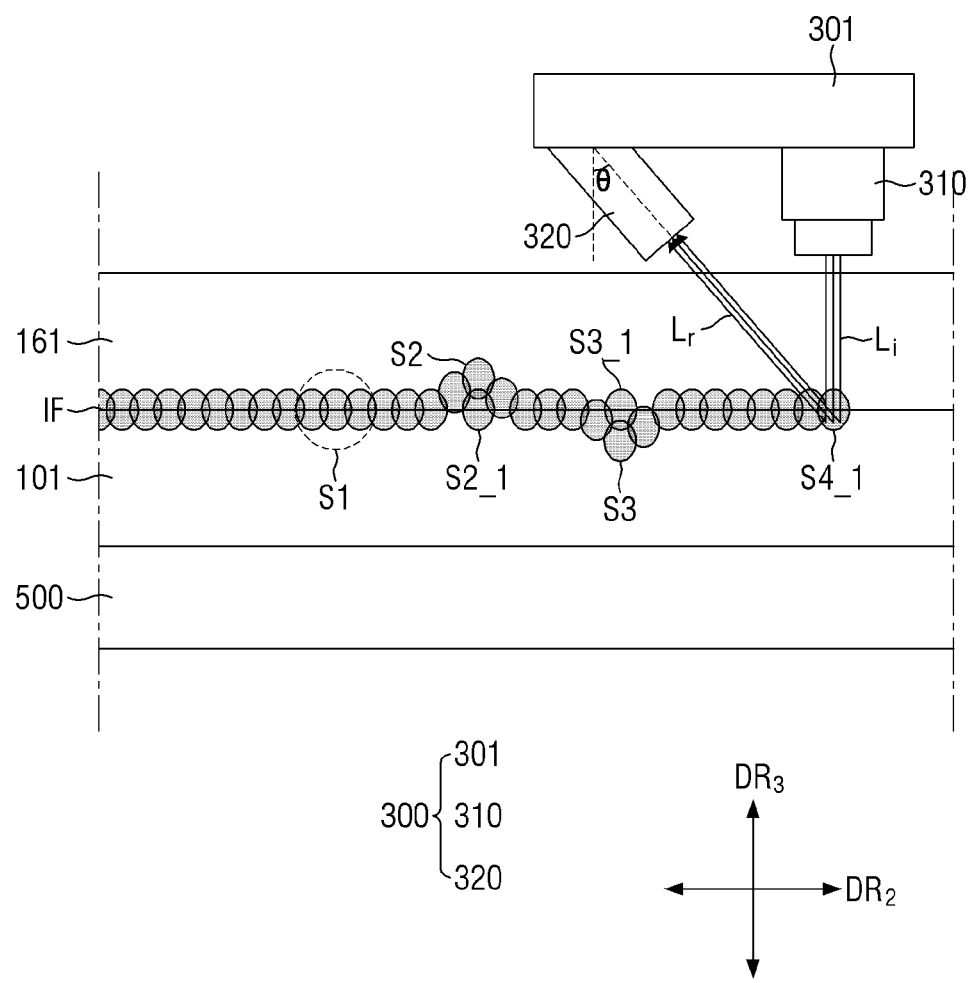

FIGS. 12A to 12C are views illustrating subsequent processes after the sealing inspection.

Referring to FIGS. 12A to 12C, as described above, the sealing area SA may include a plurality of sealing cells S2, S3, and S4 which are not normally sealed. Hereinafter, this may be referred to as an abnormal sealing cell. Abnormal sealing cells S2, S3, and S4 may include a second cell S2 disposed above the air gap AG in the third direction DR3, a third cell S3 disposed below the air gap AG in the third direction DR3, and a fourth cell S4 passing through the air gap AG in the third direction DR3 and including bubbles Bu of a predetermined degree therein. The second to fourth sealing cells S2 to S4 may be areas in which the first substrate 101 and the second substrate 161 are not normally connected and thus not sealed.

In FIG. 12A, the second cell S2 is sealed by the sealing module 310 again to form a normal sealing cell. As a result, in the corresponding sealing area SA, the second cell S2 and a normal sealing cell S2_1 may be together disposed and may overlap with each other in the third direction DR3.

In FIG. 12B, the third sealing cell S3 is sealed by the sealing module 310 again to form the normal sealing cell. As a result, in the corresponding sealing area SA, the third sealing cell S3 and the normal sealing cell S3_1 may be together disposed and may overlap with each other in the third direction DR3.

In FIG. 12C, the fourth cell S4 is sealed by the sealing module 310 again to form the normal sealing cell. As a result, in the corresponding sealing area SA, the fourth sealing cell S4 and the normal sealing cell S4_1 may be together disposed and may overlap with each other in the third direction DR3.

Hereinafter, other exemplary embodiments will be described. In the following embodiments, the same reference numerals as in the above embodiments are used, but they may refer to components having different functions.

Figure 13A:
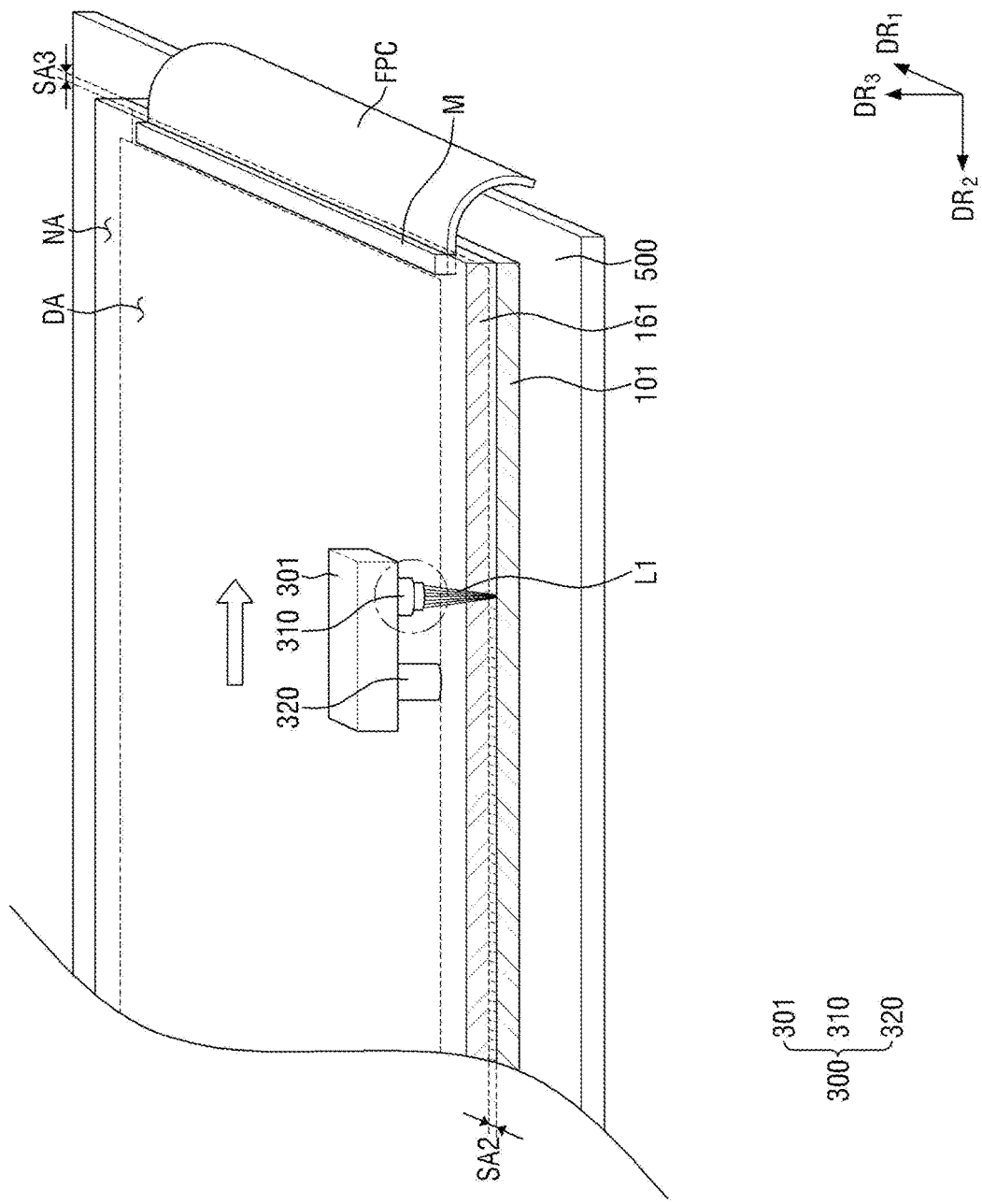
FIG. 13A is a perspective view illustrating another exemplary embodiment of a sealing module.
Figure 14A:
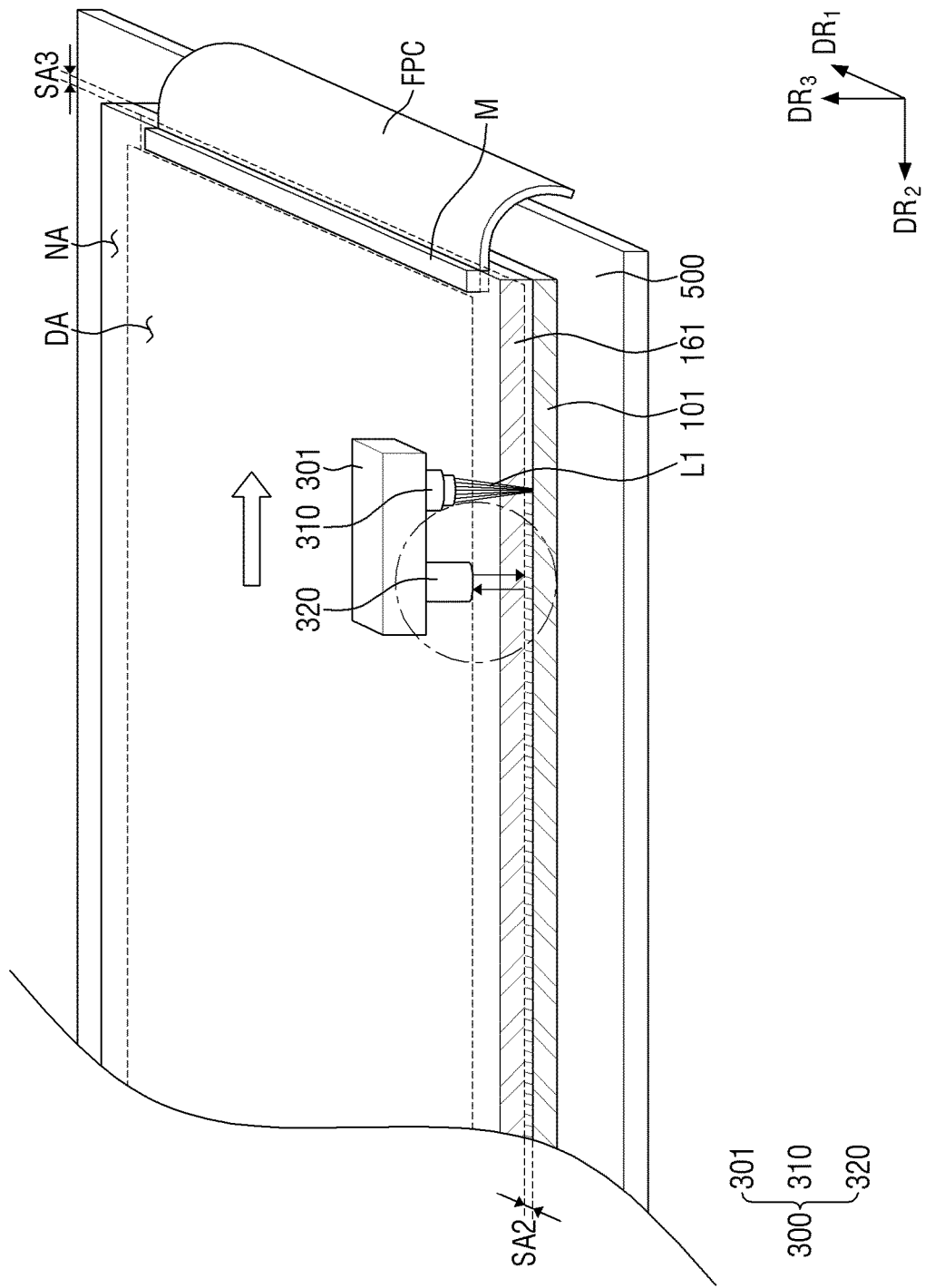
FIG. 14A is a perspective view illustrating another exemplary embodiment of a sealing inspection module.
Figure 15:
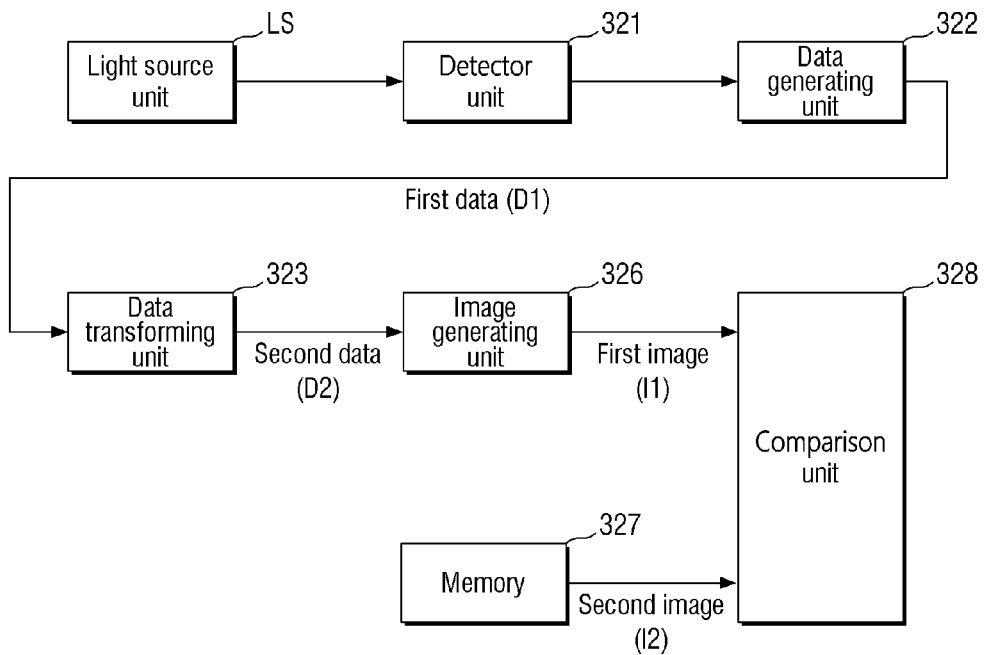
FIG. 15 is a block diagram illustrating another exemplary embodiment of a configuration of a sealing inspection module.
Figure 16:
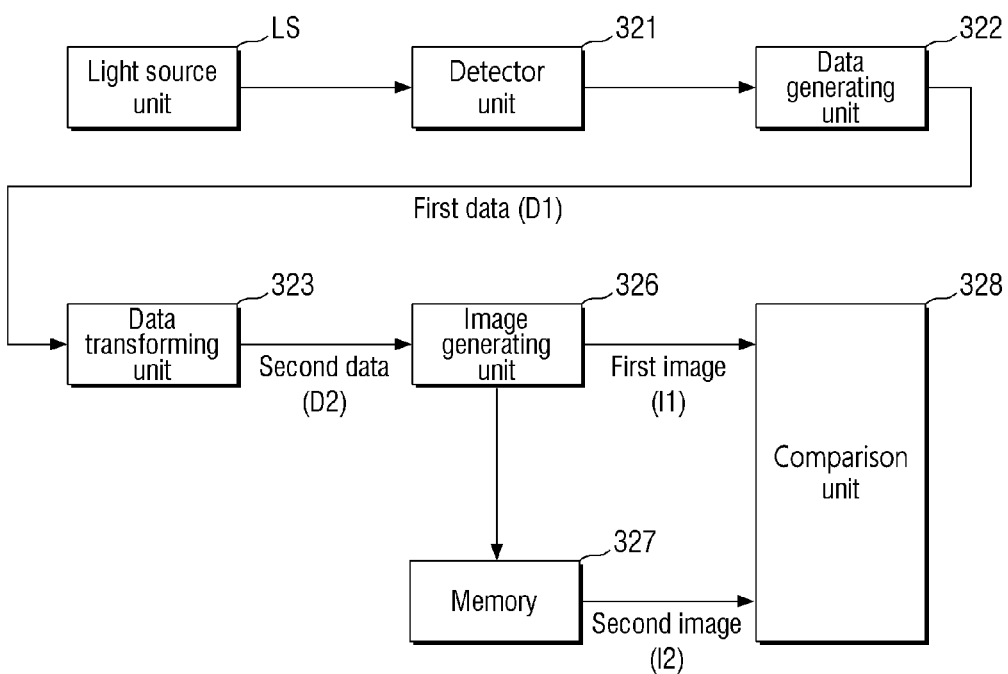
FIG. 16 is a block diagram illustrating another exemplary embodiment of a configuration of a sealing inspection module.
Figure 17A:
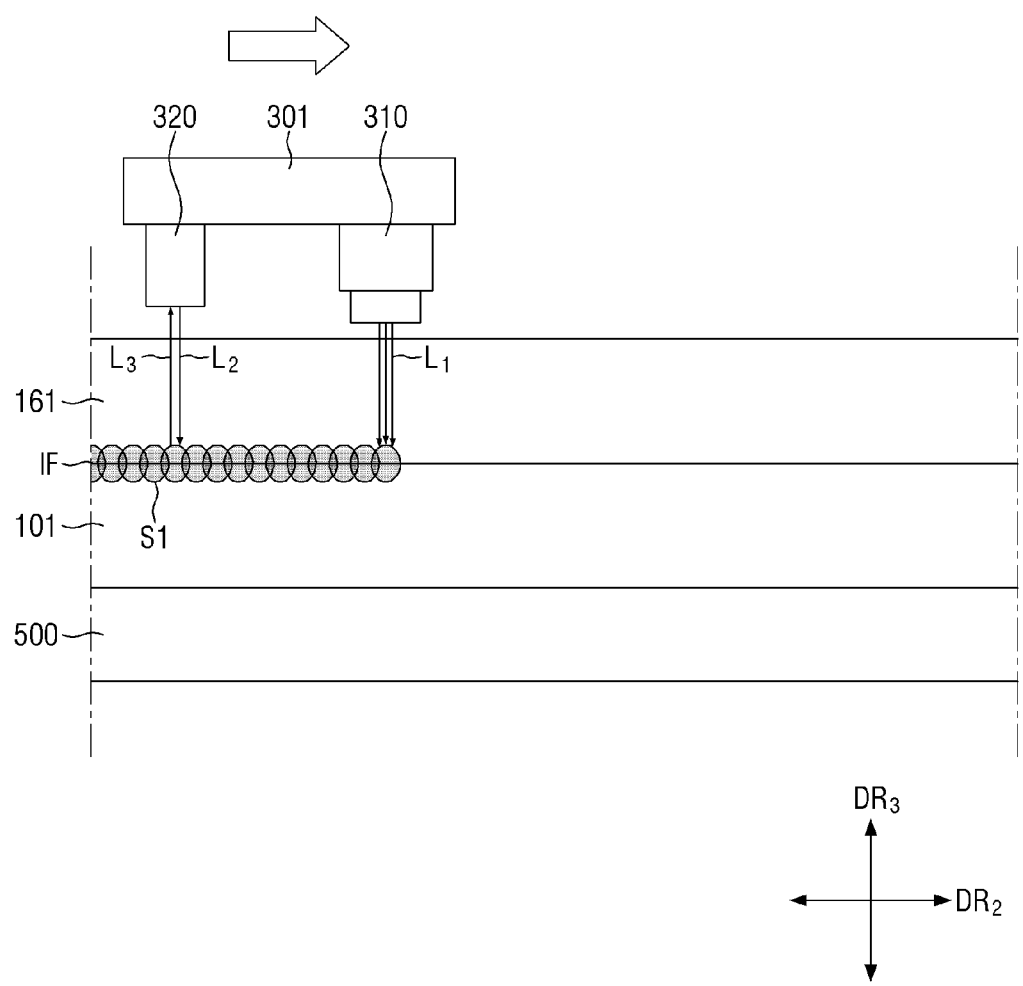
FIGS. 17A to 17C are cross-sectional views illustrating another exemplary embodiment of a process of inspecting sealing by the sealing inspection module.
Figure 17B:
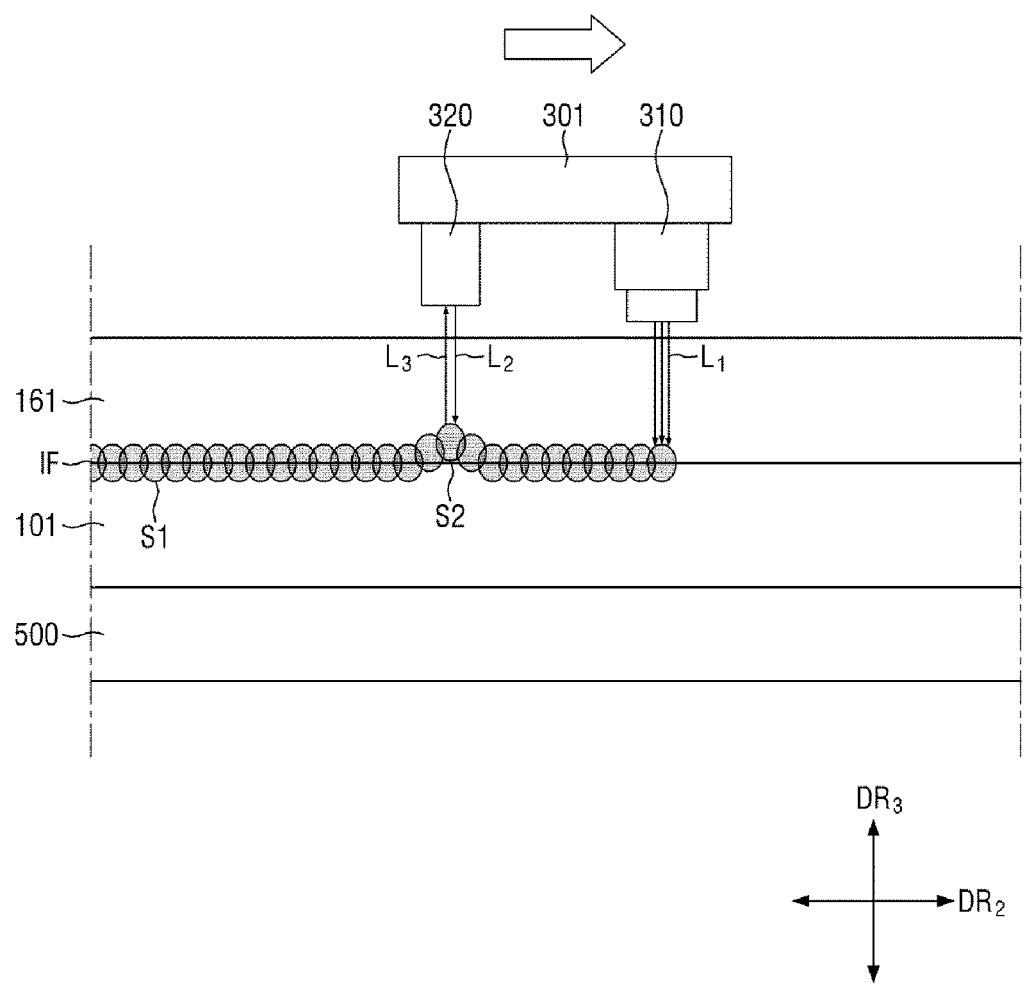
Figure 17C:
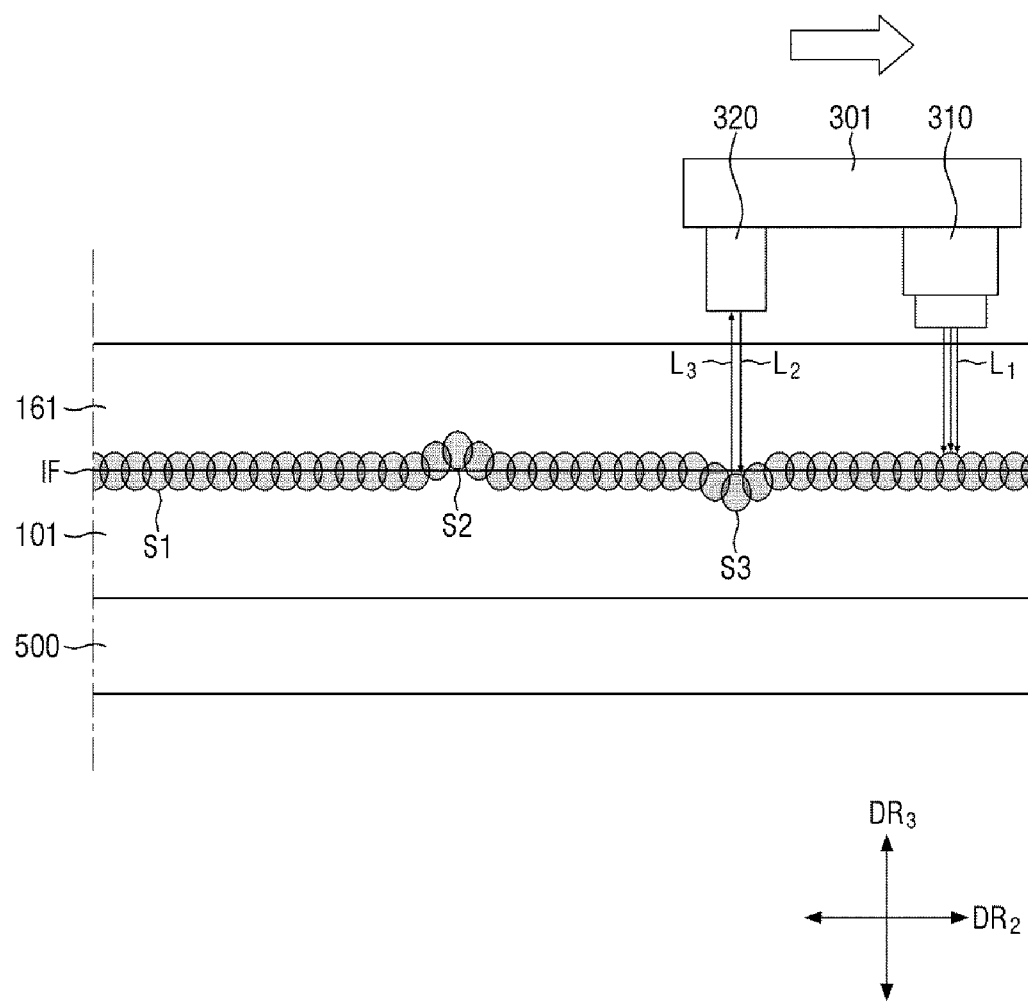

FIG. 13A is a perspective view illustrating a sealing module according to another exemplary embodiment, FIG. 14A is a perspective view illustrating a sealing inspection module according to another exemplary embodiment, FIG. 15 is a block diagram illustrating a configuration of a sealing inspection module according to another exemplary embodiment, FIG. 16 is a block diagram illustrating a configuration of a sealing inspection module according to another exemplary embodiment, and FIGS. 17A to 17C are cross-sectional views illustrating a process of inspecting sealing by the sealing inspection module according to another exemplary embodiment. FIGS. 17A to 17C illustrate a process of forming sealing cells S1, S2 and S3 while a sealing composite device 300 including a sealing module 310 moves in the second direction DR2.

Referring to FIGS. 13A to 17C, a sealing composite device 300 according to another exemplary embodiment may include a sealing module 310, a sealing inspection module 320, and a control device (also referred to as a control module) 301 for controlling the sealing module 310 and the sealing inspection module 320. All the components of the sealing composite device 300 are unitary.

The sealing module 310 may include a light source unit 311 emitting light, an oscillation unit 312 oscillating light, and a lens unit 313 changing an optical path. The light source unit 311 may emit light. In an exemplary embodiment, the light may be a laser. In an exemplary embodiment, the laser may be a femtosecond laser, for example. As used herein, the femtosecond laser may refer to a laser having a pulse width of 200 femtoseconds or more and 500 femtoseconds or less. However, the invention is not limited thereto, and the light may be light of a short wavelength band from a near IR laser to a UV laser or may be light of multi-wavelength bands including various wavelengths. The light emitted from the light source unit 311 may enter the oscillation unit 312. The light incident on the oscillation unit 312 is repeatedly reflected by glass-made reflective members (not shown) disposed on the upper and lower surfaces of the oscillation unit 312, and energy of the incident light may be amplified. When the light energy is sufficiently amplified, this light may pass through the reflective member disposed on the lower surface of the oscillation unit 312 and may be incident on the lens unit 313. The optical path of the light incident on the lens unit 313 may be changed by a plurality of lenses having different shapes and functions as shown in the drawings. As shown in the drawings, the lens unit may be provided such that a lens having a concave center is interposed between lenses each having a convex center, but the invention is not limited thereto. The light incident on the lens unit 313 may be spot-focused on the sealing area SA of the target panel 100 after passing through the lens unit 313. That is, the light emitted from the light source unit 311 passes through the lens unit 313, thereby improving light quality.

Figure 13B:
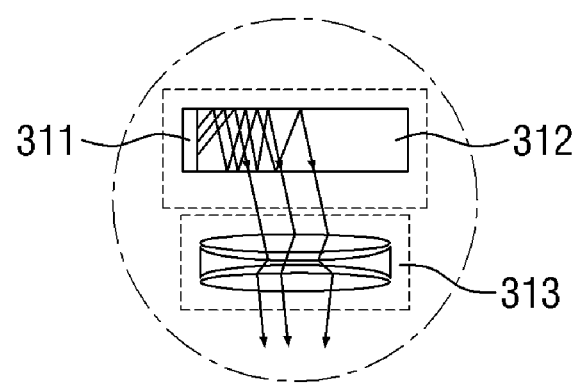
FIG. 13B is an enlarged view of a portion of FIG. 13A.

As shown in FIG. 13, a stage 500 may be disposed under the target panel 100. The stage 500 may move the overlying target panel 100 while moving at a predetermined speed such that the fixed sealing composite device 300 may aim the sealing area SA of the target panel 100. In an exemplary embodiment, when the sealing composite device 300 performs sealing and inspection in order from the second sealing area SA2 to the third sealing area SA3, while the stage 500 disposed under the target panel 100 is moving in the second direction DR2 in order to seal and inspect the second sealing area SA2, the sealing composite device 300 may move again in the first direction DR1 after completing the sealing and inspection of the second sealing area SA2, for example. In this case, the sealing composite device 300 may move relative to the stage 500. However, the invention is not limited thereto, and the sealing composite device 300 may perform sealing and inspection processes while moving over the target panel 100 with the target panel fixed. Hereinafter, for the sake of convenience of explanation, a description will be made mainly on the movement of the sealing compound device 300. However, as described above, the sealing compound device 300 may move relative to the stage 500.

In an exemplary embodiment, a mask M may further be provided on a FPC disposed in the third sealing area SA3. When the sealing composite device 300 is disposed in the third sealing area SA3 by the movement of the stage 500, it is possible to prevent the light emitted from the sealing module 310 from being applied onto the FPC due to the mask M. Accordingly, damages to the FPC and a plurality of wirings (not shown) disposed on the FPC may be prevented.

Figure 18A:
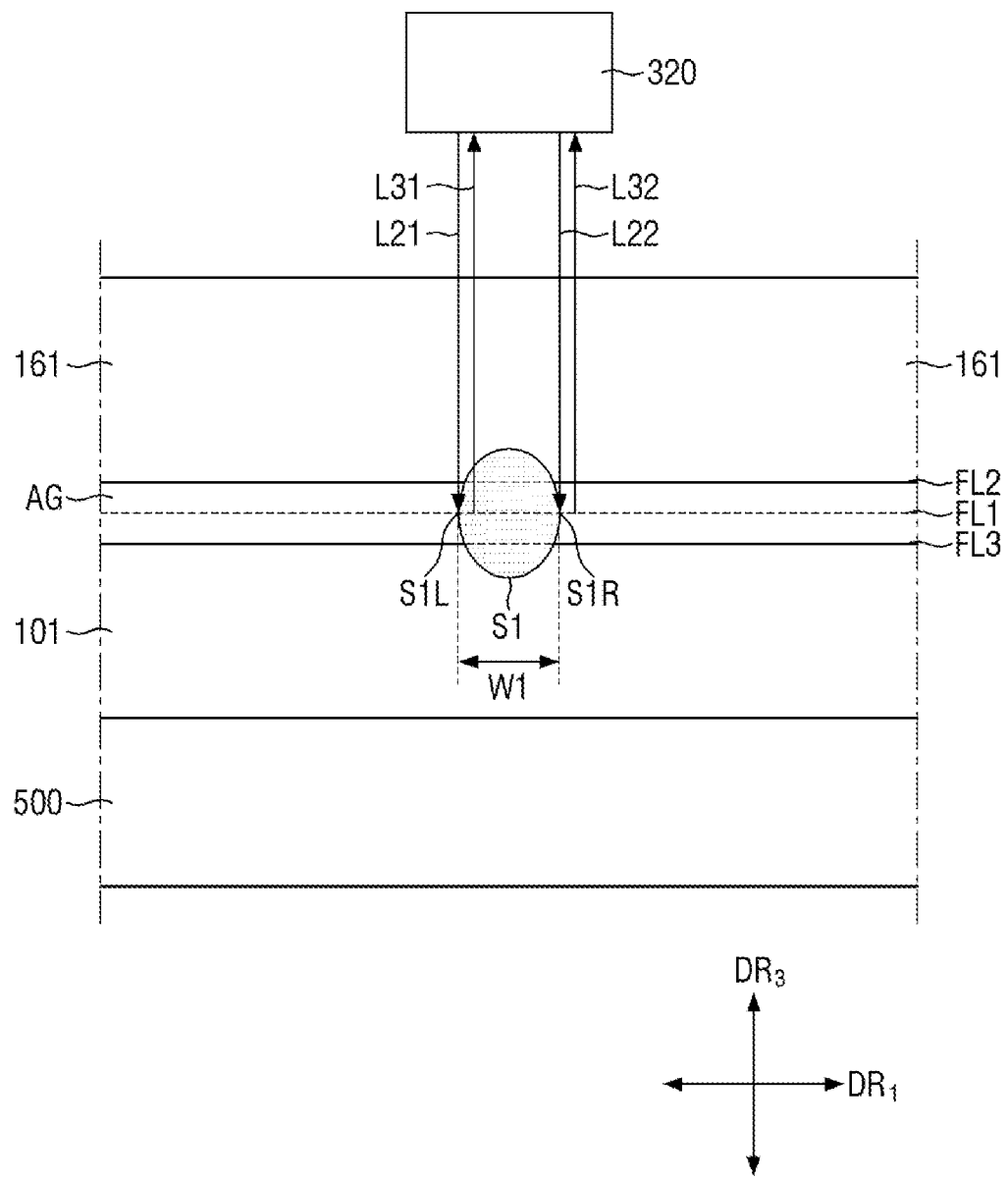

Although a gap between a first substrate 101 and a second substrate 161 in the third direction DR3 is not shown in FIGS. 13, 14, and 17A to 17C, referring to FIGS. 18A to 18B, the gap between the first substrate 101 and the second substrate 161 in the third direction DR3 may exist. The gap may be an air gap AG. The air gap AG may exist before the first substrate 101 and the second substrate 161 are bonded to each other. The air gap AG may be formed because the facing surfaces of the first substrate 101 and the second substrate 161 are not completely flat and have roughness to some degree. Therefore, the air gap AG may not exist depending on the characteristics of the facing surfaces of the first substrate 101 and the second substrate 161. In an exemplary embodiment, the thickness of the air gap AG may vary depending on the curvatures of the first substrate 101 and the second substrate 161, but may be generally between about 0 nm and about 1000 nm, for example. When the first substrate 101 and the second substrate 161 are bonded to each other, a part of the first substrate 101 and a part of the second substrate 161 are melted, and thus the space therebetween may be embedded. In this case, the bonding may be in a good state. However, there is a case where the first substrate 101 and the second substrate 161 are partially melted but the air gap AG is not completely embedded. In this case, the sealing of the first substrate 101 and the second substrate 161 may be in a bad state.

Referring to FIGS. 13 and 17A to 17C, the sealing module 310 may form the sealing cells S1, S2, and S3 while moving over the sealing area SA in one direction. The plurality of sealing cells S may be arranged along the second direction DR2. The respective sealing cells S may be formed discontinuously along the second direction DR2. This is because when the light emitted from the sealing module 310 is a laser, it has pulse vibration characteristics. The sealing cells S arranged in the second direction DR2 may overlap adjacent sealing cells S in the second direction DR2, but the invention is not limited thereto.

The sealing area SA may include the plurality of sealing cells S. Each of the sealing cells S may be formed as a result of melting the first substrate 101 and/or the second substrate 161 using the first light L1 emitted from the sealing module 310. As will be described later with reference to FIG. 7, the sealing cells S may include a first cell S1 passing through the air gap AG in the third direction DR3, a second cell S2 disposed over the air gap AG in the third direction DR3, a third cell S3 disposed under the air gap AG in the third direction DR3, and a fourth cell S4 passing through the air gap AG in the third direction DR3 and including a predetermined number of bubbles Bu therein. The first cell S1 may be sealed by physically connecting the first substrate 101 and the second substrate 161, but the second cell S2 may not be sealed because the first substrate 101 is not physically connected with the second substrate 161. The fourth cell S4 may connect the first substrate 101 and the second substrate 161, and may have an empty space therein, so that the first substrate 101 and the second substrate 161 may not be sufficiently sealed.

The first light L1 emitted from the sealing module 310 is focused on a region between the first substrate 101 and the second substrate 161 as described above. The distance from the sealing module 310 to the focal point is fixed. However, the emitted first light L1 may be focused on a region other than the focused region due to the upward or downward shake of the sealing module 310 or the aberration of the lens unit 313. In this case, the second cell S2 and the third cell S3 may be formed, respectively. The fourth cell S4 may be formed by trapping air therearound when the first substrate 101 and second substrate 161 of the sealing area SA are sealed by the sealing module 310.

The sealing inspection module 320 according to an exemplary embodiment is physically connected with the sealing module 310. The sealing inspection module 320 is connected with the sealing module 310 through the control module 301. Although it is illustrated in an exemplary embodiment that the sealing inspection module 320 is inclined in a third direction DR3 perpendicular to the movement direction (second direction DR2) of the sealing composite device 300, the invention is not limited thereto, and sealing inspection module 320 may be fixed at a predetermined angle to determine whether sealing of each of the sealing cells S1 to S4 is defective.

As shown in FIGS. 14, 15, and 16, the sealing inspection module 320 according to an exemplary embodiment is connected with the control module 301, and the sealing inspection module 320 irradiates the sealing area SA with the second light L2 and then inspects the reflected third light L3 to determine whether sealing is defective. In an exemplary embodiment, the sealing inspection module 320 may include a light source unit LS, a detector unit 321, a data generating unit 322, a data transforming unit 323, an image generating unit 326, a memory unit 327, and a comparison unit 328, as illustrated in FIGS. 15 and 16.

The light source unit LS may include a point light source PS, a focus adjustment lens CL, an optical path conversion lens TL, shape modulation lenses HL1 and HL2, and a dichroic lens HEL. The point light source PS may be a light source of the second light L2.

The focus adjustment lens CL may include a plurality of lenses. In an exemplary embodiment, the focus adjustment lens CL may include two convex lenses each having a center convex in a direction opposite to the point light source PS, and a planar lens, for example. However, the number, shape and arrangement of lenses are not limited thereto, and the focus adjustment lens CL may further include a concave lens having a concave center.

Figure 14B:
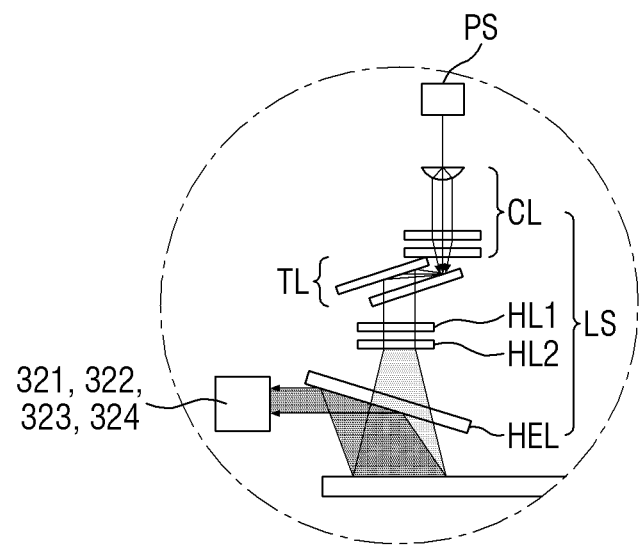
FIG. 14B is an enlarged view of a portion of FIG. 14A.

The optical path conversion lens TL may include two planar lenses having a reflection function. As shown in FIGS. 14A and 14B, the two planar lenses may be disposed to face each other. However, the invention is not limited thereto, and the optical path conversion lens TL may include two planar mirrors having a reflection function. The optical path conversion lens TL functions to converting the optical path of the light having passed through the focus adjustment lens CL.

The shape modulation lenses HL1 and HL2 may include two lenses. Although not shown in the drawings, each of the lenses may have a toothed wheel shape. That is, each of the first modulation lens HL1 and the second modulation lens HL2 may have a toothed wheel shape on one surface thereof. In this case, one surface of the first modulation lens HL1 and one surface of the second modulation lens HL2, each having a toothed wheel shape, may face each other. However, the invention is not limited thereto, and one surface of the first modulation lens HL1 and one surface of the second modulation lens HL2, each having a toothed wheel shape, may be viewed in different directions. The shape modulation lenses HL1 and HL2 may convert the light having passed through the optical path conversion lens TL into linear light. As shown in FIGS. 14A and 14B, the light emitted from the point light source PS may pass through the shape modulation lenses HL1 and HL2 and then converted into linear light whose laser region extends in one direction. The linear light may be the second light L2. The second light L2 may be linear light whose laser region extends in one direction. The light having passed through the shape modulation lenses HL1 and HL2 may pass through the dichroic lens HEL.

The dichroic lens HEL may include one surface and the other surface. One surface of the dichroic lens HEL may be a surface facing the shape modulation lenses HL1 and HL2. The other surface of the dichroic lens HEL may be a surface facing the sealing area SA. One surface and the other surface of the dichroic lens HEL may have different characteristics with respect to light being in contact therewith. In an exemplary embodiment, the light having passed through the shape modulation lenses HL1 and HL2 may directly passes through one surface and the other surface of the dichroic lens HEL and then applied to a boundary between the first substrate 101 and the stage 500, that is, the sealing area SA, for example. However, the dichroic lens HEL may not transmit the light reflected from the sealing area SA to the upper portion of the dichroic lens HEL, but may reflect the light from the other surface of the dichroic lens HEL toward the detector unit 221. Thus, the dichroic lens HEL may separates the light source unit LS for emitting light and the detector unit 221 for receiving the light to prevent light interference and signal noising due to the light interference. The light reflected by the dichroic lens HEL may be incident on the detector unit 221.

Specifically, explaining the light source unit LS, the light source unit LS may emit the second light L2 from the boundary between the first substrate 101 and the stage 500 to the upper surface of the second substrate 161. As described above, in an exemplary embodiment, the second light L2 may be linear light.

The second light L2 may be applied to the corresponding area in the first direction DR1 at the same time. That is, the second light L2 may be sequentially applied in parallel from the boundary between the first substrate 101 and the stage 500 to the upper surface of the second substrate 161 in the first direction DR1. The light source unit LS may irradiate the corresponding area in the first direction DR1 and sequentially focus the light upward or downward in the third direction DR3 to irradiate the sealing area SA of the target panel 100. The light source unit LS may zoom-in and zoom-out to adjust the focusing area in the third direction DR3. In an exemplary embodiment, the light source unit LS may focus the boundary between the first substrate 101 and the stage 500 in the third direction DR3, zoom-in in the third direction DR3 to focus the inside of the first substrate 101, focus a boundary between the first substrate 101 and the second substrate 161, and then focus the inside of the second substrate 161, for example.

The area irradiated with the second light L2 emitted from the light source unit LS may be variously defined. Although it has been described in the exemplary embodiment that, as described above, the second light L2 is sequentially applied in parallel from the boundary between the first substrate 101 and the stage 500 to the upper surface of the second substrate 161 in the first direction DR1 to irradiate the corresponding area with the second light L2, it may also be interpreted that a subject including the area is irradiated with the second light L2. Therefore, although the meaning of the subject in this specification may vary depending on an object to be irradiated by the light source unit LS, the subject may refer to an area that is widely used to be irradiated with the second light L2 emitted from the light source unit LS or may refer to a specific object in the irradiated area.

The second light L2 emitted from the light source unit LS may be reflected from the sealing area SA of the target panel 100 and the may be incident on the detector unit 321. The light reflected from the sealing area SA may be the third light L3. The detector unit 321 may function to receive the third light L3.

The data generating unit 322 may generate first data D1 on the basis of the received third light L3. The first data D1 may include time taken during a process of converting the second light L2 incident on the sealing area SA into the third light L3 and applying the third light L3 to the detector unit 321 again, a light distance, a phase difference between the second light L2 and the third light L3, and the like. Details thereof will be described with reference to FIGS. 18 to 20.

Figure 18C:
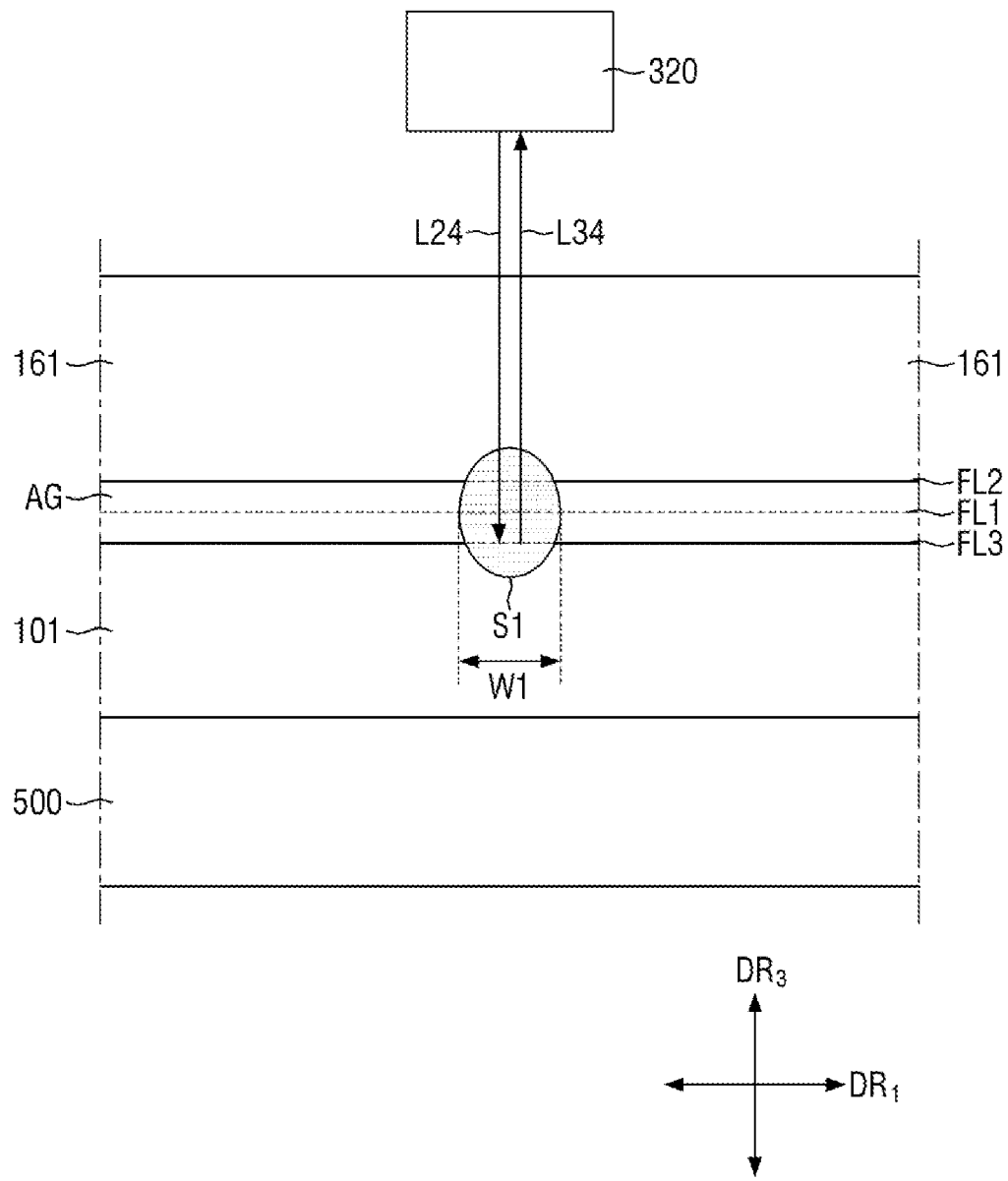
Figure 19A:
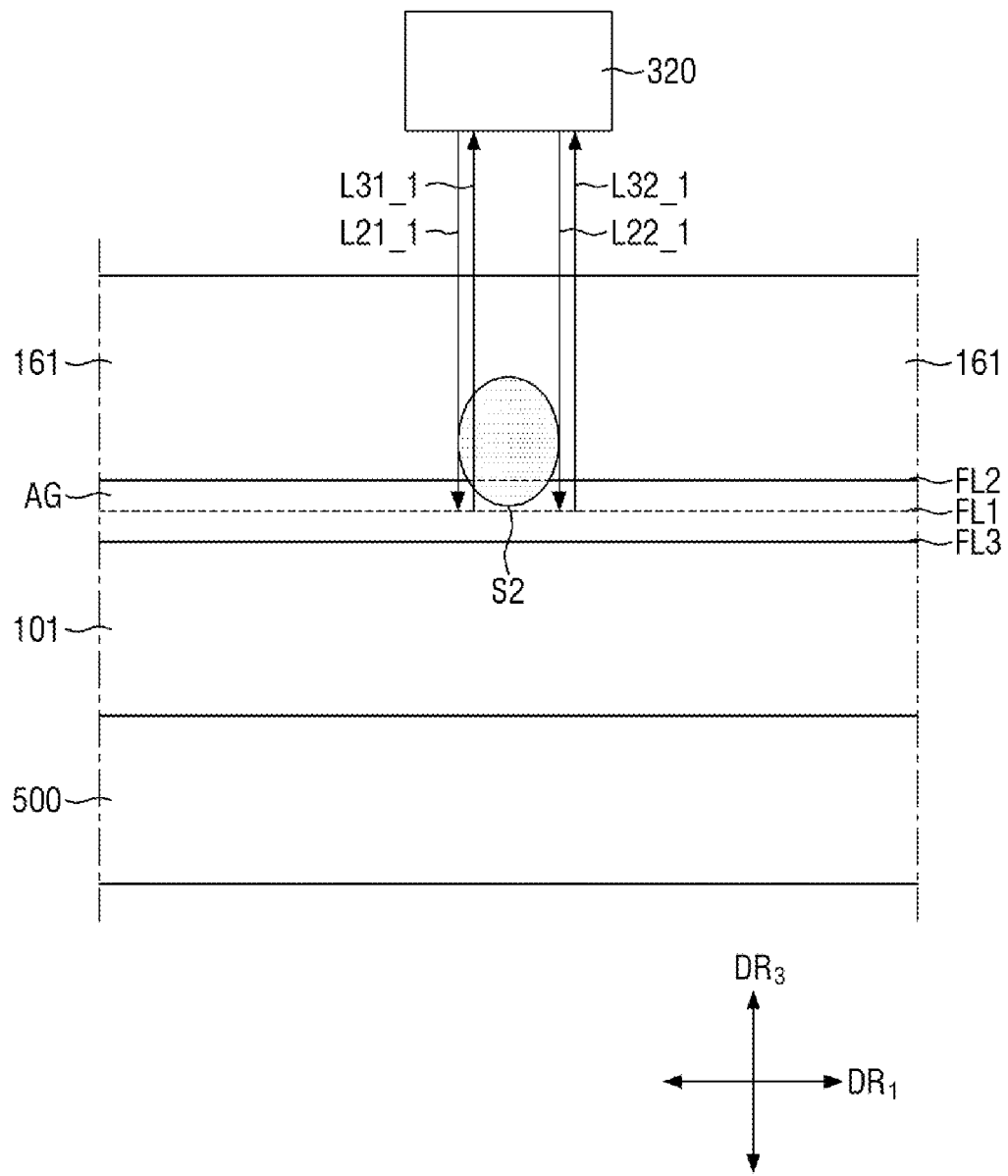
FIGS. 19A to 19C are cross-sectional views illustrating another exemplary embodiment of a process of inspecting a second cell by the sealing inspection module.
Figure 19B:
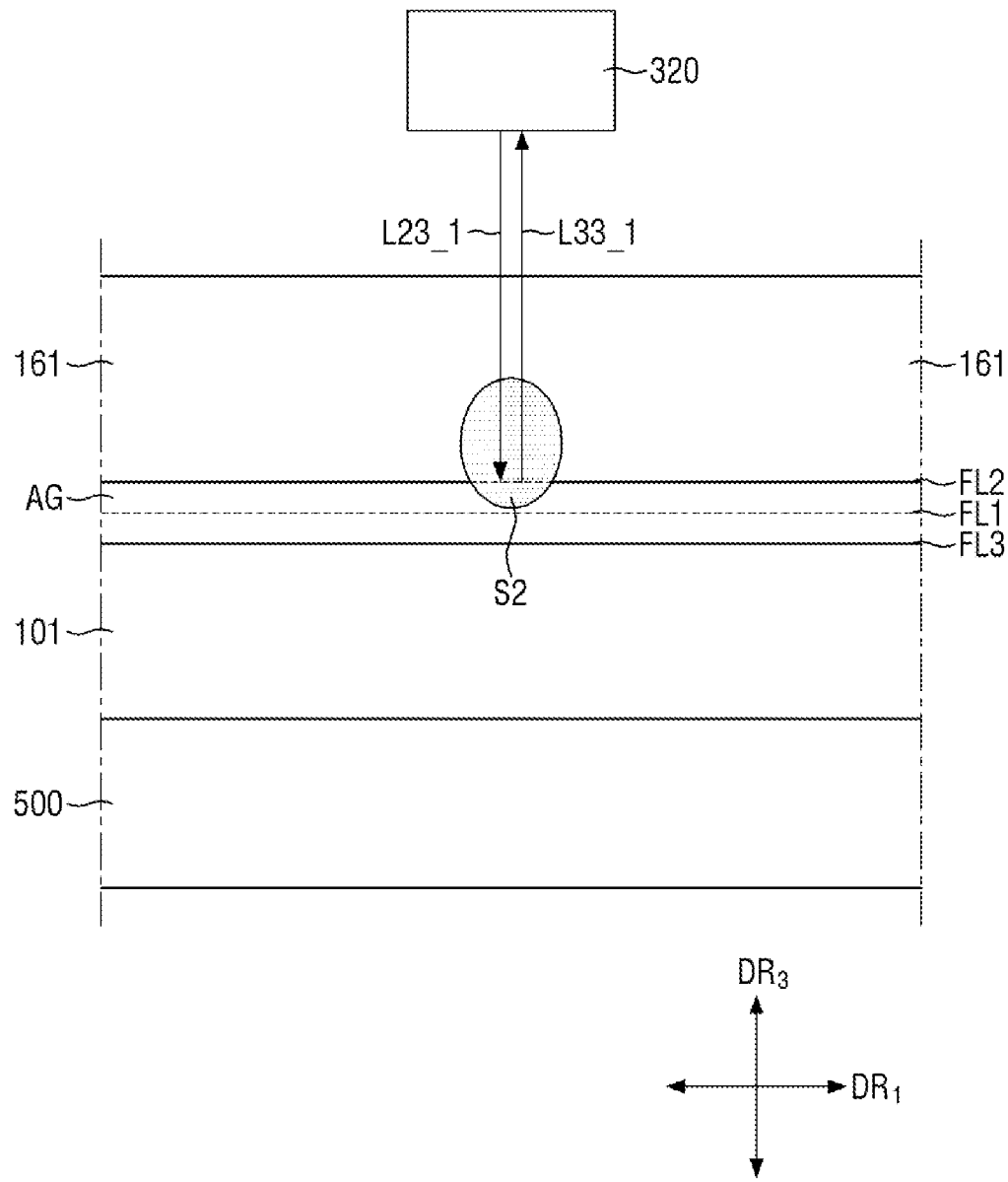
Figure 19C:
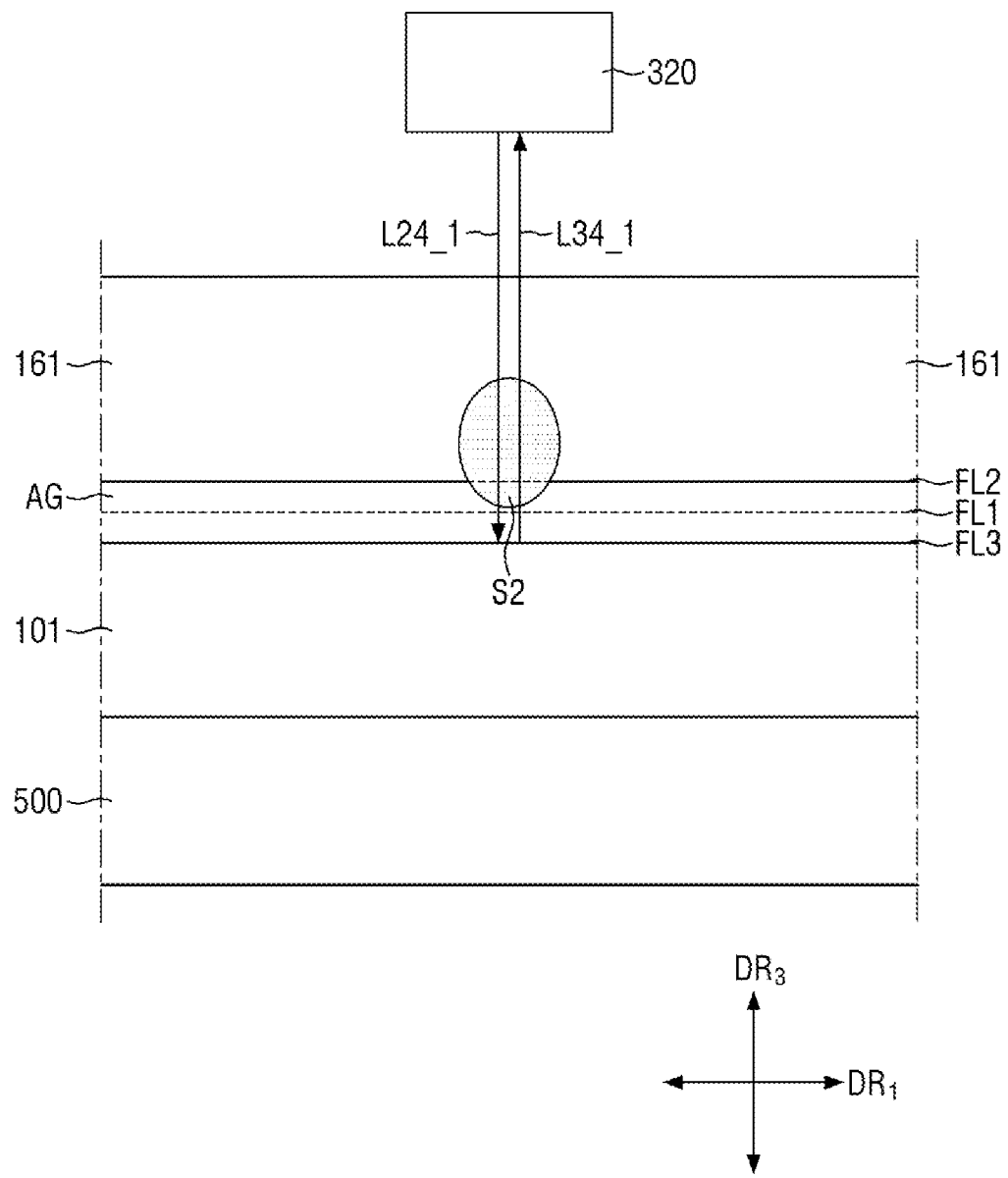
Figure 20A:
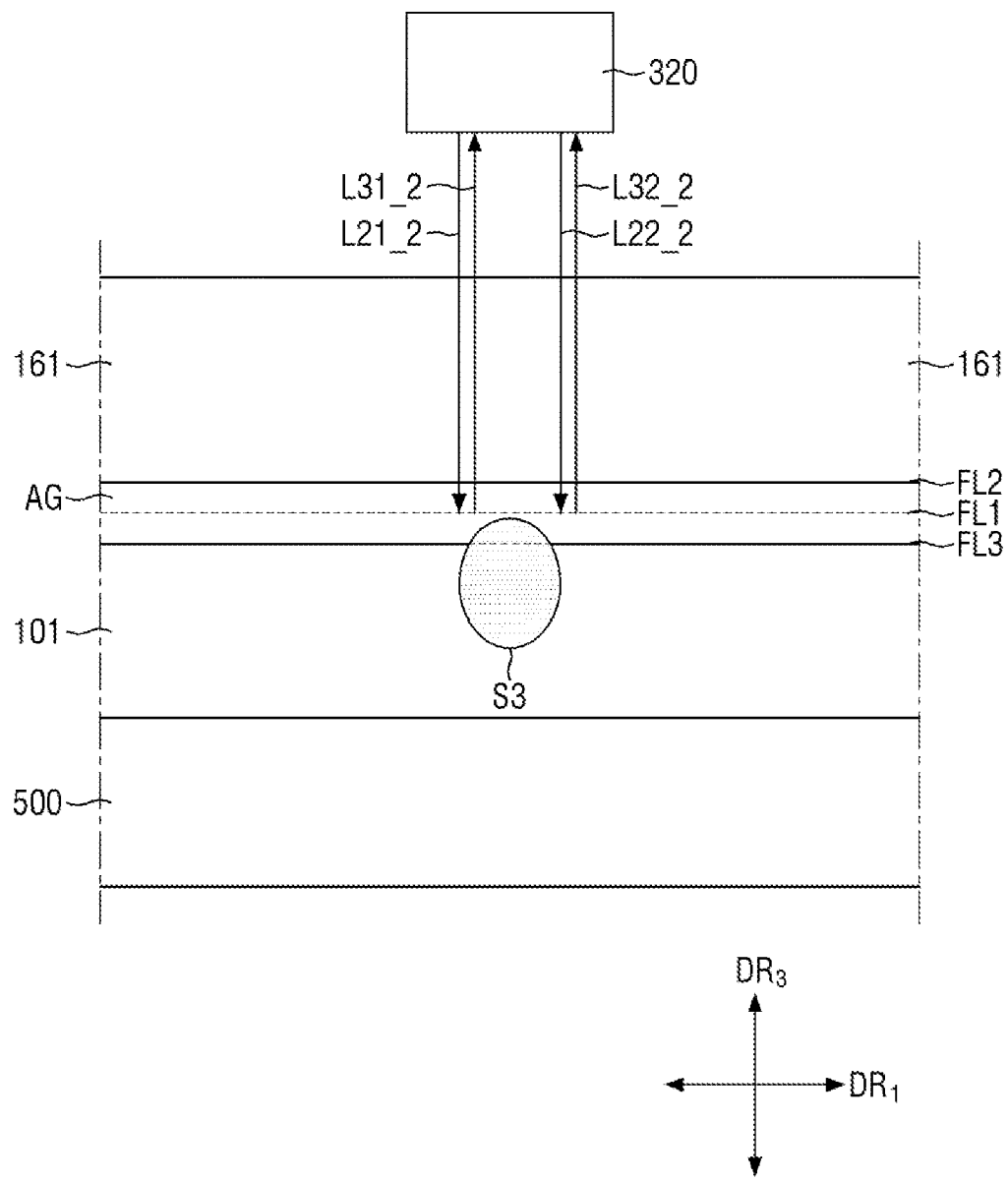
FIGS. 20A to 20C are cross-sectional views illustrating another exemplary embodiment of a process of inspecting a third cell by the sealing inspection module.
Figure 20B:
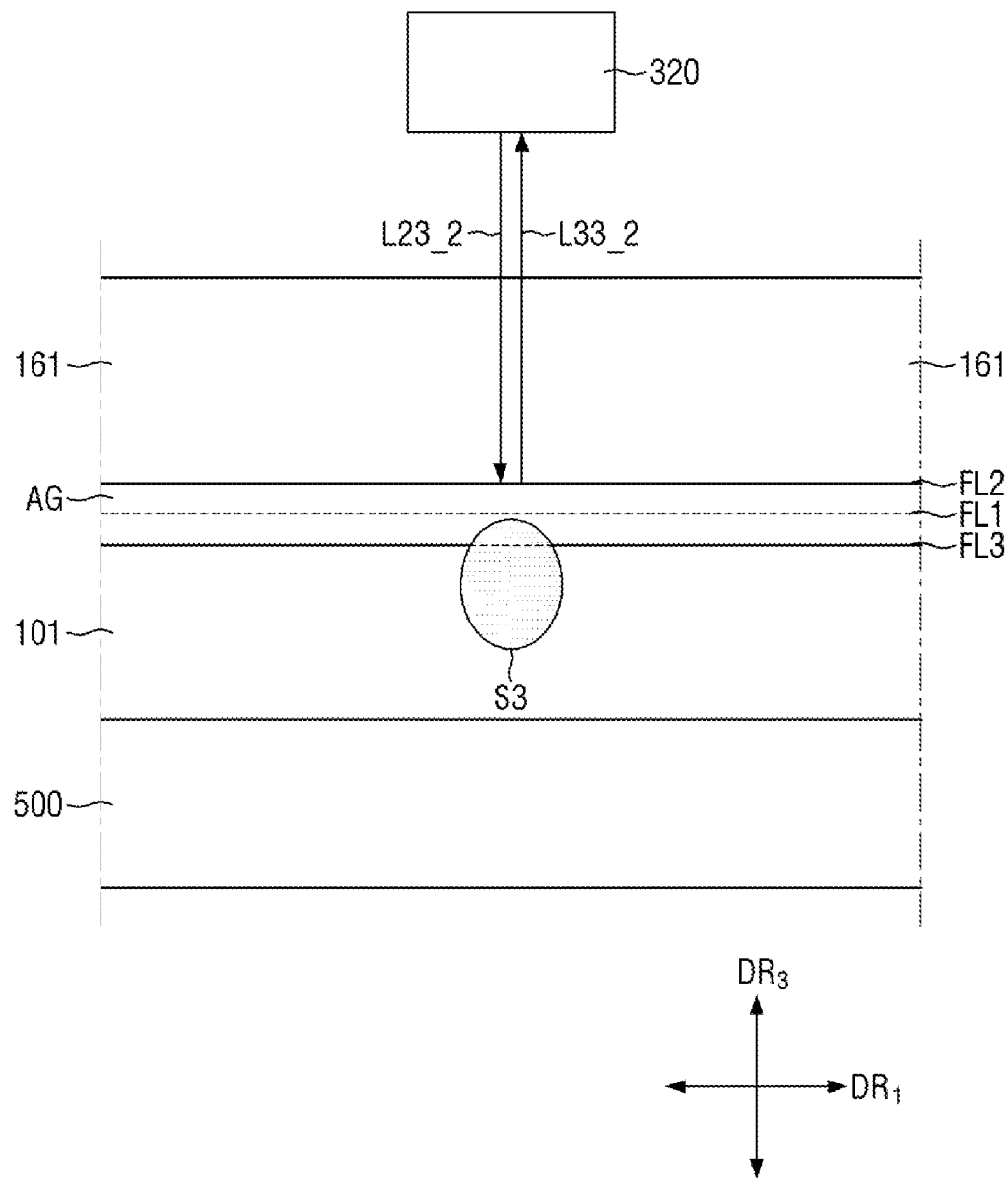
Figure 20C:
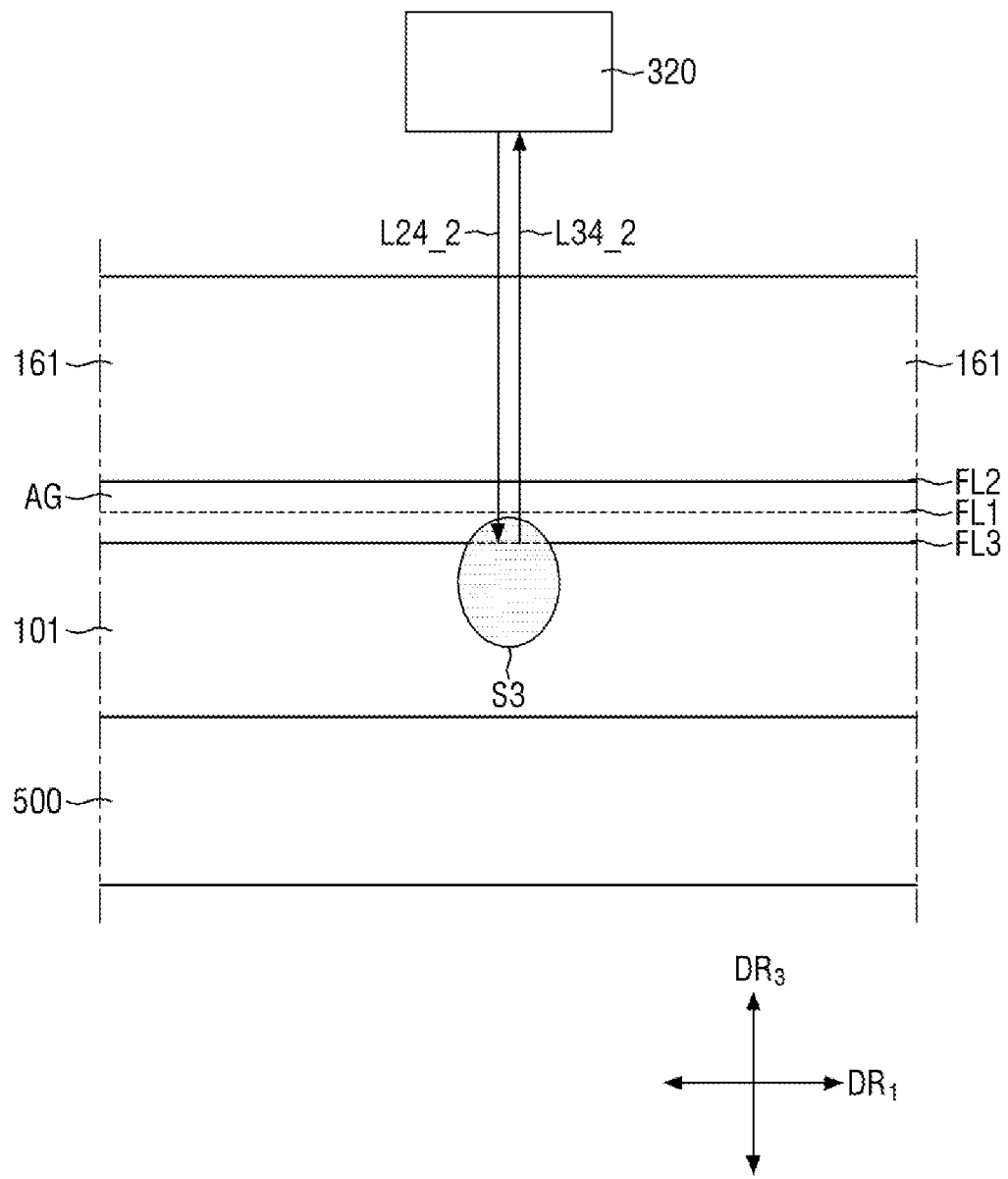

FIGS. 18A to 18C are cross-sectional views illustrating a process of inspecting a first cell by the sealing inspection module according to another exemplary embodiment, FIGS. 19A to 19C are cross-sectional views illustrating a process of inspecting a second cell by the sealing inspection module according to another exemplary embodiment, and FIGS. 20A to 20C are cross-sectional views illustrating a process of inspecting a third cell by the sealing inspection module according to another exemplary embodiment. FIGS. 18 to 20 illustrate cross-sectional shapes taken along the first direction DR1 of FIG. 14. As described above, the light source unit LS may focus the second light L2 from the boundary between the first substrate 101 and the stage 500 to the upper surface of the second substrate 161. However, for convenience of explanation, FIGS. 18 to 20 illustrate only the case where the second light L2 is focused on first to third focusing lines FL1 to FL3. Further, although it is illustrated in the drawings that only an area in which each cell S is disposed is irradiated with the second light L2, the invention is not limited thereto, and an area parallel along each of the focusing lines FL1 to FL3 including the area in which each cell S is disposed may be focused at the same time.

As described above, an air gap AG may be disposed between the first substrate 101 and the second substrate 161. FIGS. 18A to 18C illustrate a process of inspecting a normal cell S1.

The target panel 100 may have first to third focusing lines FL1 to FL3. The first focusing line FL1 may be a line disposed in the air gap AG. The second focusing line FL2 may be a boundary between the air gap AG and the second substrate 161. The third focusing line FL3 may be a boundary between the air gap AG and the first substrate 101.

Referring to FIGS. 14 and 18A, the light source unit LS of the sealing inspection module 320 may cause the second light L2 to be incident toward the first focusing line FL1. The second light L2 may include first sub-incident light L21 and second sub-incident light L22. The first sub-incident light L21 and the second sub-incident light L22 may be emitted from the light source unit LS and focused on the first focusing line FL1 through an air region between the sealing inspection module 320 and the second substrate 161, a region of the second substrate 161, and a region between the second focusing line FL2 and the first focusing line FL1. The first sub-incident light L21 and the second sub-incident light L22 may be reflected from the first focusing line FL1, passes through the region between the first focusing line FL1 and the second focusing line FL2, the region of the second substrate 161, and the region between the second substrate 161 and the sealing inspection module 320, and then incident on the detector unit 321. The light incident on the detector unit 321 may include first sub-reflected light L31 and second sub-reflected light L32. The detector unit 321 may receive the first sub-reflected light L31 and the second sub-reflected light L32.

The data generating unit 322 may generate first data D1 on the basis of the received first sub-reflected light L31 and second sub-reflected light L32. The first data D1 may include time taken until the first sub-reflected light L31 and the second sub-reflected light L32 are incident after the first sub-incident light L21 and the second sub-incident light L22 are emitted, a phase difference between the first sub-incident light L21 and the second sub-incident light L22 and a phase difference between the first sub-reflected light L31 and the second sub-reflected light L32, and an intensity difference between the first sub-incident light L21 and the second sub-incident light L22 and an intensity difference between the first sub-reflected light L31 and the second sub-reflected light L32. Further, the first data D1 may include a width W1 between a left side S1L and a right side S1R of the normal cell S1 in the first direction DR1.

Referring to FIG. 18B, the light source unit LS may cause the second light L2 to be incident toward the second focusing line FL2. The second light L2 may include third sub-incident light L23. The third sub-incident light L23 may be emitted from the light source unit LS and focused on the second focusing line FL2 through the air region between the sealing inspection module 320 and the second substrate 161 and the region of the second substrate 161. The third sub-incident light L23 may be reflected from the second focusing line FL2, passes through the region of the second substrate 161 and the region between the second substrate 161 and the sealing inspection module 320, and then incident on the detector unit 321. The light incident on the detector unit 321 may include third sub-reflected light L33. The detector unit 321 may receive the third sub-reflected light L33.

Similarly, the data generating unit 322 may generate first data D1 on the basis of the received third sub-reflected light L33. The first data D1 may include time taken until the third sub-reflected light L33 is incident after the third sub-incident light L23 is emitted, a phase difference between the third sub-incident light L23 and the third sub-reflected light L33, and an intensity difference between the third sub-incident light L23 and the third sub-reflected light L33.

The sealing inspection module 320 may inspect whether the cell S was sealed around the air gap AG contacting the second substrate 161 using the third sub-incident light L23 and the third sub-reflected light L33.

Referring to FIG. 18C, the light source unit LS may cause the second light L2 to be incident toward the third focusing line FL3. The second light L2 may include fourth sub-incident light L24. The fourth sub-incident light L24 may be emitted from the light source unit LS and focused on the third focusing line FL3 through the air region between the sealing inspection module 320 and the second substrate 161, the region of the second substrate 161, and the region of the air gap AG. The fourth sub-incident light L24 may be reflected from the third focusing line FL3, passes through the region of the air gap AG, the region of the second substrate 161, and the region between the second substrate 161 and the sealing inspection module 320, and then incident on the detector unit 321. The light incident on the detector unit 321 may include fourth sub-reflected light L34. The detector unit 321 may receive the fourth sub-reflected light L34.

Similarly, the data generating unit 322 may generate first data D1 on the basis of the received fourth sub-reflected light L34. The first data D1 may include time taken until the fourth sub-reflected light L34 is incident after the fourth sub-incident light L24 is emitted, a phase difference between the fourth sub-incident light L24 and the fourth sub-reflected light L34, and an intensity difference between the fourth sub-incident light L24 and the fourth sub-reflected light L34.

The sealing inspection module 320 may inspect whether the cell S was sealed around the air gap AG contacting the second substrate 161 using the fourth sub-incident light L24 and the fourth sub-reflected light L34.

Referring to FIGS. 19A to 19C, the second cell S2 is disposed in the sealing area SA. FIGS. 19A to 19C may perform inspection processes as shown in FIGS. 18A to 18C, respectively.

Specifically, referring to FIG. 19A, the second light L2 may include first sub-incident light L21_1 and second sub-incident light L22_1. The first sub-incident light L21_1 and the second sub-incident light L22_1 may be focused on the first focusing line FL1. The first sub-incident light L21_1 and the second sub-incident light L22_1 may be reflected from the first focusing line FL1, and then incident on the detector unit 321. The light incident on the detector unit 321 may include first sub-reflected light L31_1 and second sub-reflected light L32_1. The detector unit 321 may receive the first sub-reflected light L31_1 and the second sub-reflected light L32_1.

The data generating unit 322 may generate first data D1 on the basis of the received first sub-reflected light L31_1 and second sub-reflected light L32_1. The first data D1 may include time taken until the first sub-reflected light L31_1 and the second sub-reflected light L32_1 are incident after the first sub-incident light L21_1 and the second sub-incident light L22_1 are emitted, a phase difference between the first sub-incident light L21_1 and the second sub-incident light L22_1 and a phase difference between the first sub-reflected light L31_1 and the second sub-reflected light L32_1, and an intensity difference between the first sub-incident light L21_1 and the second sub-incident light L22_1 and an intensity difference between the first sub-reflected light L31_1 and the second sub-reflected light L32_1. Further, the first data D1 may include a width W1 of the normal cell S1 in the first direction DR1.

Referring to FIG. 19B, the second light L2 may include third sub-incident light L23_1. The third sub-incident light L23_1 may be focused on the second focusing line FL2. The third sub-incident light L23_1 may be reflected from the second focusing line FL2, and then incident on the detector unit 321. The light incident on the detector unit 321 may include third sub-reflected light L33_1. The detector unit 321 may receive the third sub-reflected light L33_1.

Similarly, the data generating unit 322 may generate first data D1 on the basis of the received third sub-reflected light L33_1. The first data D1 may include time taken until the third sub-reflected light L33_1 is incident after the third sub-incident light L23_1 is emitted, a phase difference between the third sub-incident light L23_1 and the third sub-reflected light L33_1, and an intensity difference between the third sub-incident light L23_1 and the third sub-reflected light L33_1.

The sealing inspection module 320 may inspect whether the cell S was sealed around the air gap AG contacting the second substrate 161 using the third sub-incident light L23_1 and the third sub-reflected light L33_1.

Referring to FIG. 19C, the second light L2 may include fourth sub-incident light L24_1. The fourth sub-incident light L24_1 may be emitted from the light source unit LS and focused on the third focusing line FL3. The fourth sub-incident light L24_1 may be reflected from the third focusing line FL3, and then incident on the detector unit 321. The light incident on the detector unit 321 may include fourth sub-reflected light L34_1. The detector unit 321 may receive the fourth sub-reflected light L34_1.

Similarly, the data generating unit 322 may generate first data D1 on the basis of the received fourth sub-reflected light L34_1. The first data D1 may include time taken until the fourth sub-reflected light L34_1 is incident after the fourth sub-incident light L24_1 is emitted, a phase difference between the fourth sub-incident light L24_1 and the fourth sub-reflected light L34_1, and an intensity difference between the fourth sub-incident light L24_1 and the fourth sub-reflected light L34_1.

The sealing inspection module 320 may inspect whether the cell S was sealed around the air gap AG contacting the second substrate 161 using the fourth sub-incident light L24_1 and the fourth sub-reflected light L34_1.

Referring to FIGS. 20A to 20C, the third cell S3 is disposed in the sealing area SA. FIGS. 20A to 20C may perform inspection processes as shown in FIGS. 18A to 18C, respectively.

Specifically, referring to FIG. 20A, the second light L2 may include first sub-incident light L21_2 and second sub-incident light L22_2. The first sub-incident light L21_2 and the second sub-incident light L22_2 may be focused on the first focusing line FL1. The first sub-incident light L21_2 and the second sub-incident light L22_2 may be reflected from the first focusing line FL1, and then incident on the detector unit 321. The light incident on the detector unit 321 may include first sub-reflected light L31_2 and second sub-reflected light L32_2. The detector unit 321 may receive the first sub-reflected light L31_2 and the second sub-reflected light L32_2.

The data generating unit 322 may generate first data D1 on the basis of the received first sub-reflected light L31_2 and second sub-reflected light L32_2. The first data D1 may include time taken until the first sub-reflected light L31_2 and the second sub-reflected light L32_2 are incident after the first sub-incident light L21_2 and the second sub-incident light L22_2 are emitted, a phase difference between the first sub-incident light L21_2 and the second sub-incident light L22_2 and a phase difference between the first sub-reflected light L31_2 and the second sub-reflected light L32_2, and an intensity difference between the first sub-incident light L21_2 and the second sub-incident light L22_2 and an intensity difference between the first sub-reflected light L31_2 and the second sub-reflected light L32_2. Further, the first data D1 may include a width W1 of the normal cell S1 in the first direction DR1.

Referring to FIG. 20B, the second light L2 may include third sub-incident light L23_2. The third sub-incident light L23_2 may be focused on the second focusing line FL2. The third sub-incident light L23_2 may be reflected from the second focusing line FL2, and then incident on the detector unit 321. The light incident on the detector unit 321 may include third sub-reflected light L33_2. The detector unit 321 may receive the third sub-reflected light L33_2.

Similarly, the data generating unit 322 may generate first data D1 on the basis of the received third sub-reflected light L33_2. The first data D1 may include time taken until the third sub-reflected light L33_2 is incident after the third sub-incident light L23_2 is emitted, a phase difference between the third sub-incident light L23_2 and the third sub-reflected light L33_2, and an intensity difference between the third sub-incident light L23_2 and the third sub-reflected light L33_3.

The sealing inspection module 320 may inspect whether the cell S was sealed around the air gap AG contacting the second substrate 161 using the third sub-incident light L23_2 and the third sub-reflected light L33_2.

Referring to FIG. 20C, the second light L2 may include fourth sub-incident light L24_2. The fourth sub-incident light L24_2 may be emitted from the light source unit LS and focused on the third focusing line FL3. The fourth sub-incident light L24_2 may be reflected from the third focusing line FL3, and then incident on the detector unit 321. The light incident on the detector unit 321 may include fourth sub-reflected light L34_2. The detector unit 321 may receive the fourth sub-reflected light L34_2.

Similarly, the data generating unit 322 may generate first data D1 on the basis of the received fourth sub-reflected light L34_2. The first data D1 may include time taken until the fourth sub-reflected light L34_2 is incident after the fourth sub-incident light L24_2 is emitted, a phase difference between the fourth sub-incident light L24_2 and the fourth sub-reflected light L34_2, and an intensity difference between the fourth sub-incident light L24_2 and the fourth sub-reflected light L34_2.

The sealing inspection module 320 may inspect whether the cell S was sealed around the air gap AG contacting the second substrate 161 using the fourth sub-incident light L24_2 and the fourth sub-reflected light L34_3.

Referring to FIGS. 15 and 16 again, the data transforming unit 323 may generate second data D2 on the basis of the first data D1 generated from the data generating unit 322 and prestored reference data. The reference data may be reference values with respect to time taken until the second light L2 is emitted from the light source unit LS and then incident on the detector unit 321, a phase difference between incident light of FIGS. 18 to 20 and reflected light of FIGS. 18 to 20, and an intensity difference between incident light of FIGS. 18 to 20 and reflected light of FIGS. 18 to 20. The transforming unit 323 may compare the first data D1 with the reference data, and synthesize the first data D1 to generate the second data D2. That is, the data transforming unit 323 may analyze the first data D1 collected through the series of processes shown in FIGS. 18 and 20 to generate the second data D2.

The second data D2 may be three-dimensional coordinates (X, Y, Z) of each of the cells S1, S2, and S3. The first coordinate (X) of the second data D2 may be a coordinate in the first direction DR1 of FIG. 14 based on the sealing inspection module 320. The first coordinate (Y) of the second data D2 may be a coordinate in the second direction DR2 of FIG. 14 based on the sealing inspection module 320. The third coordinate (Z) of the second data D2 may be a coordinate in the third direction DR3 of FIG. 14 based on the sealing inspection module 320. That is, the second data D2 may acquire the three-dimensional coordinates (X, Y, Z) of each of the cells S1, S2, and S3 to obtain three-dimensional shape information on each of the cells S1, S2, and S3. However, as described above, the sealing inspection module 320 may inspect not only the respective cells S1, S2 and S3 but also surrounding areas thereof. In this case, the second data D2 may include not only the three-dimensional coordinates (X, Y, Z) of each of the cells S1, S2, S3 but also three-dimensional coordinates (X, Y, Z) of the surrounding areas thereof. In an exemplary embodiment, the second data D2 may also include three-dimensional coordinates (X, Y, Z) of air gap AG areas around the cells S1, S2, and S3, for example.

The image generating unit 326 may generate a first image I1 of each of the cells S1, S2, and S3 on the basis of the second data D2.

The memory unit 327 may function to store a second image I2 that may be compared with the first image I1 extracted through the data generating unit 322. The second image I2 stored by the memory unit 327 may be stored based on the first image I1. As shown in FIG. 15, the memory unit 327 may store the second image I2. The second image I2 may be pre-stored before the sealing process and the sealing inspection process to be compared with the first image I1. Unlike this, referring to FIG. 16, the memory unit 327 may store the second image I2 generated during the sealing inspection process.

The comparison unit 328 may function to determine a sealing failure region of the target panel 100. Specifically, the comparison unit 328 may determine the sealing failure region by comparing the aforementioned first image I1 with the aforementioned second image I2.

The sealing inspection module 320 according to this exemplary embodiment may be physically connected to the sealing module 310 to measure the light reflected from the sealing area SA in real time while performing a process of sealing the sealing area SA by irradiating the sealing area SA with light. Thus, the sealing inspection module 320 may rapidly determine whether sealing is defective.

Although not shown in the drawing, the sealing inspection module 320 may further include an output unit. The output unit may function to output a signal when it is determined by the comparison unit that the sealing failure area of the target panel 100 exists. The signal may be, for example, an image signal or an alarm signal. When the sealing inspection module 320 includes the output unit, the output unit may immediately notify the sealing failure area through an image signal or an alarm signal while performing a sealing process.

Figure 21:
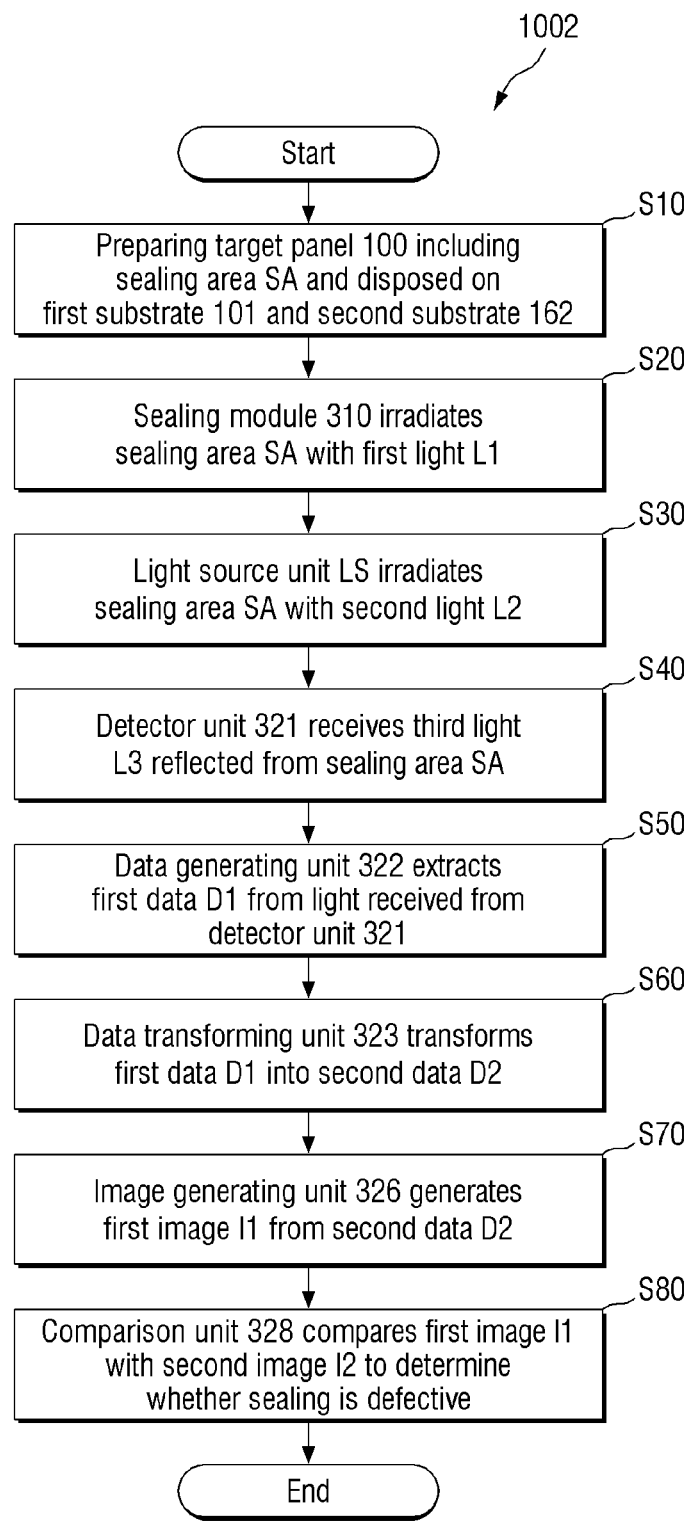
FIG. 21 is a flowchart of another exemplary embodiment of a method for manufacturing a display device.

FIG. 21 is a flowchart of a method for manufacturing a display device according to another exemplary embodiment.

Referring to FIG. 21, the method 1002 for manufacturing a display device according to another exemplary embodiment may include the processes of preparing a target panel 100 including a sealing area SA between a first substrate 101 and a second substrate 161, the target panel 100 including the first substrate 101 and the second substrate 161 disposed on one surface of the first substrate 101 (S10), irradiating the sealing area SA with first light L1 by a sealing module 310 (S20), irradiating the sealing area SA with second light L2 by a light source unit LS (S30), receiving third light reflected from the sealing area SA by a detector unit 321 (S40), extracting first data D1 from the light received from the detector unit 321 by a data generating unit 322 (S50), converting the first data D1 into second data D2 by a data transforming unit 323 (S60), generating a first image I1 from the second data D2 by an image generating unit 326 (S70), and comparing the first image I1 with a second image I2 by a comparison unit 328 to determine whether sealing is defective (S80).

The process of irradiating the sealing area SA may include a process of attaching the first substrate 101 to the second substrate 161. In this exemplary embodiment, the light may include a femtosecond laser, for example. The first substrate 101 and the second substrate 161 are partially melted and solidified in the sealing area SA to which the femtosecond laser is applied, to be attached to each other.

Figure 22:
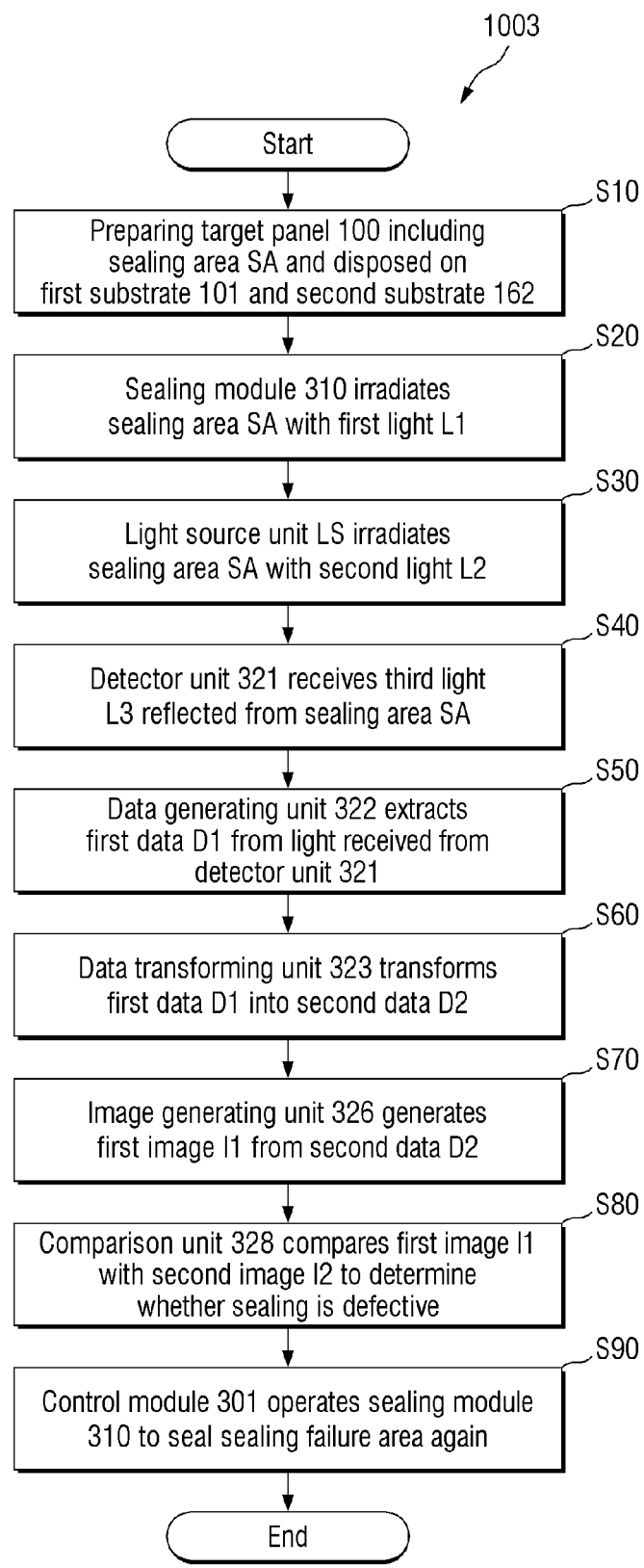
FIG. 22 is a flowchart of another exemplary embodiment of a method for manufacturing a display device.

FIG. 22 is a flowchart of a method for manufacturing a display device according to another exemplary embodiment.

Referring to FIG. 22, the method 1003 for manufacturing a display device according to this exemplary embodiment is different from the aforementioned method 1002 for manufacturing a display device with reference to FIG. 21 in that this method 1003 further includes a subsequent process after the process of comparing the first image I1 with the second image I2 by the comparison unit 328 to determine whether sealing is defective (S80).

More specifically, the method 1003 for manufacturing a display device according to this exemplary embodiment may further include a process of sealing the sealing failure area again by operating the sealing module 310 by a control module 301 (S90). The contents thereof are illustrated in FIGS. 23A and 23B.

Figure 23A:
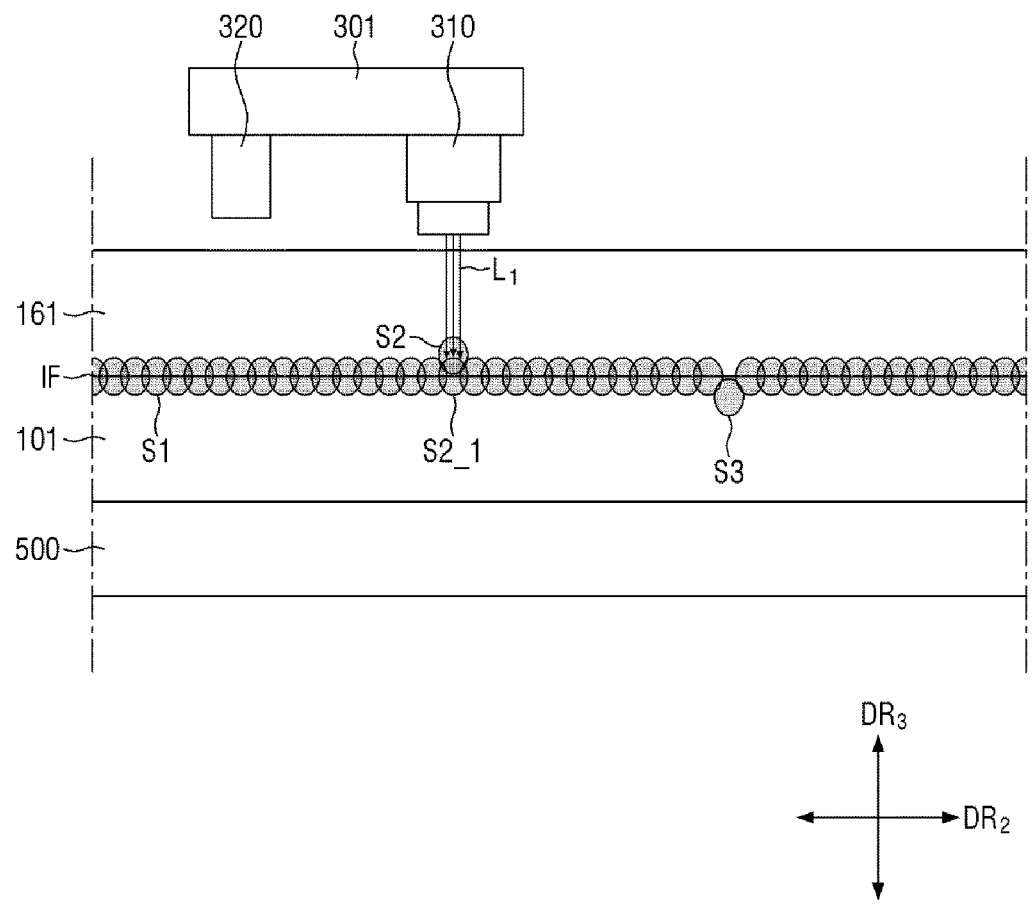
FIGS. 23A to 23B are views illustrating subsequent processes after the sealing inspection.
Figure 23B:
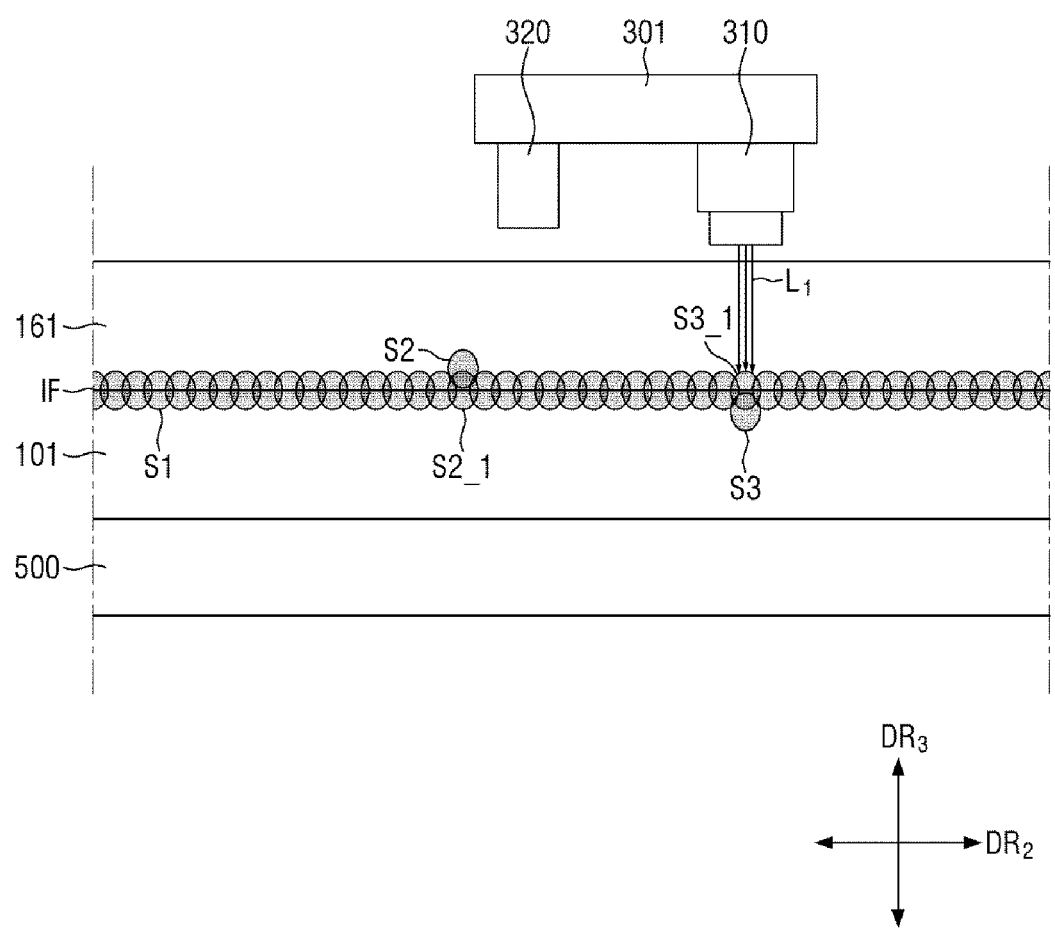

FIGS. 23A and 23B illustrate a subsequent process after the sealing inspection.

Referring to FIGS. 23A and 23B, as described above, the sealing area SA may include the plurality of sealing cells S2 and S3 not normally sealed. The sealing cells S2 and S3 may be referred to as abnormal sealing cells. The abnormal sealing cells S2 and S3 may include a second cell S2 disposed over the air gap AG in the third direction DR3 and a third cell S3 disposed under the air gap AG in the third direction DR3.

As shown in FIG. 23A, the second cell S2 is sealed again by the sealing module 310 to form a normal sealing cell. Thus, in the corresponding sealing area SA, the second cell S2 and the normal sealing cell S2_1 may be disposed together, and may overlap each other in the third direction DR3.

As shown in FIG. 23B, the third cell S3 is sealed again by the sealing module 310 to form a normal sealing cell. Thus, in the corresponding sealing area SA, the third cell S3 and the normal sealing cell S3_1 may be disposed together, and may overlap each other in the third direction DR3.

Figure 24:
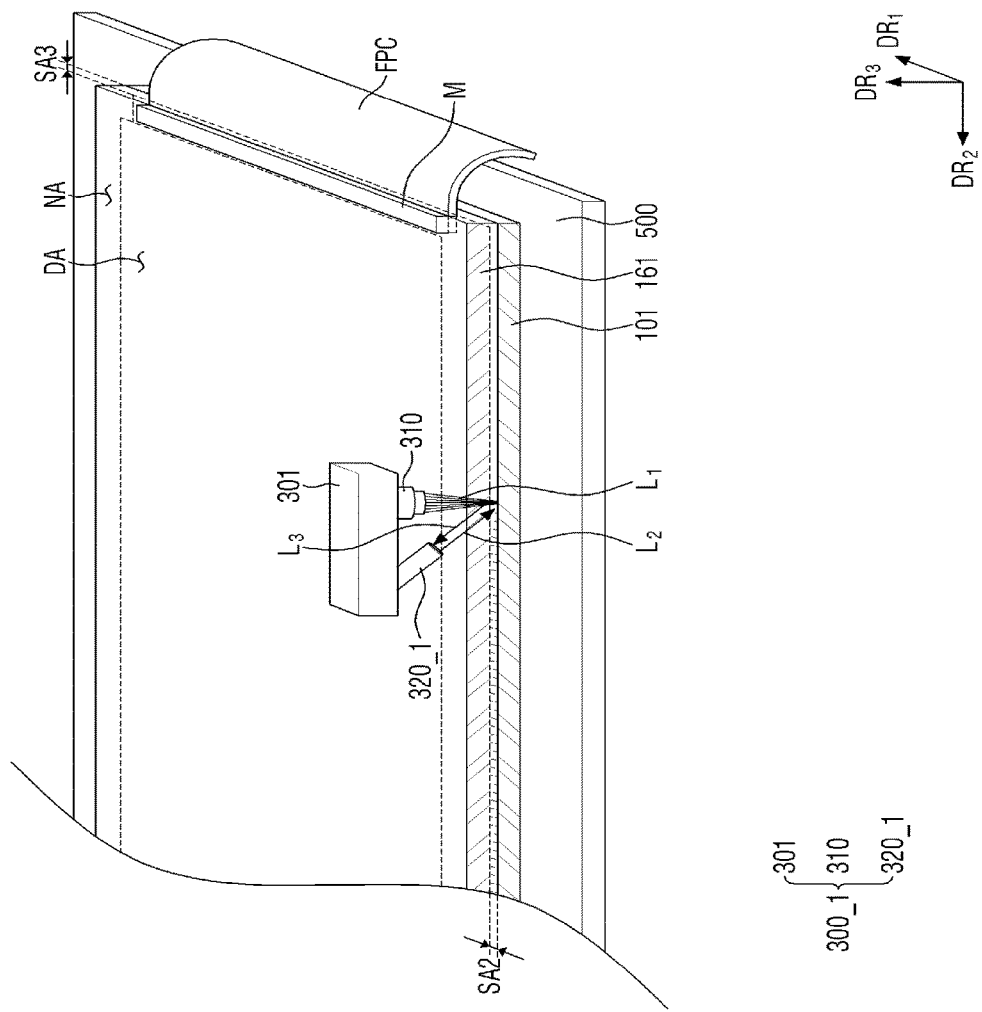
FIG. 24 is a perspective view illustrating another exemplary embodiment of a sealing inspection module.

FIG. 24 is a perspective view illustrating a sealing inspection module according to another exemplary embodiment.

The sealing inspection module 320_1 of a composite device 300_1 according to this exemplary embodiment may inspect the corresponding sealing area SA while the sealing module 310 irradiates the sealing area SA of the target module 100. The sealing inspection module 320_1 may be fixed with the sealing module 310 at a predetermined angle to determine whether sealing of each of the sealing cells S1 to S4 is defective. In an exemplary embodiment, the angle may be about 0° to about 60°, for example.

As described above, according to the exemplary embodiments of the invention, after the sealing of the display device, inspection of the sealing area may be performed in real time. As a result, the overall process time may be shortened.

The effects according to the invention are not limited by the contents exemplified above, and other various effects are included in the specification.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for manufacturing a display device, comprising:
   a sealing module including a light source unit which emits sealing light; and
   a sealing inspection module including a detector which receives at least a part of the sealing light, a data transforming unit which generates measurement light data based on the sealing light, and a comparison unit which determines whether sealing is defective by comparing the measurement light data with reference data,
   wherein the measurement light data includes at least one parameter of intensity, energy, voltage, and current of the sealing light.

2. The apparatus of claim 1,
   wherein the sealing module further includes a lens unit which is disposed on an optical path of the emitted sealing light and adjusts a focus distance of a femtosecond laser and the light receiving unit of the detector is disposed to face a focus of the femtosecond laser which passes through the lens unit.

3. The apparatus of claim 1,
   wherein the reference data includes at least one parameter of intensity, energy, voltage, and current.

4. The apparatus of claim 1, further comprising a data generating unit which includes a first data generating unit and a second data generating unit,
   wherein the first data generating unit generates intermediate data including at least one of intensity, energy, voltage, and current of the received sealing light and the second data generating unit generates the measurement light data by performing Fourier transformation based on the intermediate data.

5. The apparatus of claim 1,
   wherein the sealing light includes a femtosecond laser, and
   the sealing module irradiates the femtosecond laser to a target panel including a first substrate and a second substrate facing each other to bond the first substrate and the second substrate and the sealing module receives the femtosecond laser reflected from the target panel.

6. The apparatus of claim 1,
   wherein the emitted sealing light is reflected from the sealing area of which at least a part is melted and the detector receives at least a part of the sealing light.

7. The apparatus of claim 6, further comprising a data generating unit which generates the measurement light data based on the sealing light reflected from the sealing area of which at least a part is melted.

8. An apparatus for manufacturing a display device, comprising:
   a sealing module including a first light source unit which emits sealing light; and a sealing inspection module including a second light source which emits inspection light to a subject, a detector which receives at least a part of reflected light reflected from the subject, a data generating unit which generates measurement light data based on the inspection light and the reflected light, a data transforming unit which converts the measurement light data into conversion data, an image generating unit which generates a first image of the subject based on the measurement light data, and a comparison unit which compares the first image with a prestored second image to determine whether sealing is defective.

9. A method for manufacturing a display device, the method comprising:
preparing a target panel including a first substrate and a second substrate disposed on one surface of the first substrate, the target panel including a sealing area between the first substrate and the second substrate;
making sealing light be incident in the sealing area and receiving at least a part of the sealing light reflected from the sealing area;
generating first data including at least one parameter of intensity, energy, current, and voltage; and
determining whether sealing is defective by comparing the first data and prestored second data.

10. The method of claim 9,
wherein the sealing light includes a femtosecond laser and the first substrate and the second substrate are partially melted and solidified and bonded to each other in the sealing area in which the femtosecond laser is incident.

11. The method of claim 9,
wherein in the receiving the sealing light reflected from the sealing area, the sealing light is reflected from the sealing area which is at least partially melted.

12. The method of claim 9,
wherein the making the sealing light be incident in the sealing area includes bonding the first substrate and the second substrate.

13. The method of claim 12,
wherein the sealing light includes a femtosecond laser.

14. The method of claim 13,
wherein the prestored second data includes at least one parameter of intensity, energy, current, and voltage.

15. The method of claim 14,
wherein the determining whether sealing the target panel is defective includes determining that the sealing area in which at least any one of the intensity and the energy of the first data is reduced by about 5 percent or more as compared with the prestored second data in at least one wavelength in a wavelength band in a range of about 400 nanometers to about 1000 nanometers is a defective sealing area.

16. The method of claim 14,
wherein the determining whether sealing the target panel is defective includes determining that the sealing area in which at least any one of the voltage and the current energy of the first data is reduced by about 20 percent or more as compared with the prestored second data in at least one wavelength in a wavelength band in a range of about 400 nanometers to about 1000 nanometers is a defective sealing area.

17. The method of claim 14,
wherein the determining whether sealing the target panel is defective includes detecting that a corresponding area is a fluctuating area when a voltage amplitude or an energy amplitude of the first data is larger than a reference value stored in the prestored second data and distinguishing a detected area as a defective sealing area.

18. The method of claim 14,
wherein the determining whether sealing the target panel is defective includes data-transforming the first data into third data by Fourier transformation.

19. A method for manufacturing a display device, the method comprising:
preparing a manufacturing apparatus including a sealing module including a light source unit emitting sealing light and a sealing inspection module including a detector receiving at least a part of the sealing light, a data transforming unit generating measurement light data based on the sealing light, and a comparison unit determining whether sealing is defective by comparing the measurement light data with reference data; and
irradiating, by the light source unit, the sealing light to a target panel and partially melting the target panel to be bonded and making a part of the sealing light reflected therefrom be incident in the detector,
wherein the measurement light data includes at least one parameter of intensity, energy, current, and voltage.

20. The method of claim 19,
wherein the reference data includes at least one parameter of intensity, energy, voltage, and current.

21. The method of claim 19,
wherein the sealing light includes a femtosecond laser and a first substrate and a second substrate are partially melted and solidified and bonded to each other in a sealing area in which the femtosecond laser is incident.

22. A method for manufacturing a display device, the method comprising:
preparing a target panel including a first substrate and a second substrate disposed on one surface of the first substrate, the target panel including a sealing area between the first substrate and the second substrate;
irradiating the sealing area with first light;
irradiating the sealing area irradiated with the first light with second light;
receiving at least a part of third light reflected from the sealing area;
generating first data based on the applied first light and the received third light;
converting the first data into second data;
generating a first image based on the second data; and
comparing the first image with a prestored second image to determine whether sealing is defective.

23. The method of claim 22,
wherein the first light is sealing light, the second light is inspection light, and the third light includes reflected light of the second light.

24. The method of claim 23,
wherein the irradiating the sealing area with the sealing light includes attaching the first substrate to the second substrate, and
the sealing light includes a femtosecond laser, and the first substrate and the second substrate are partially melted and solidified in the sealing area irradiated with the femtosecond laser to be attached to each other.

25. The method of claim 23,
wherein the inspection light sequentially passes through one surface and another surface of a dichroic lens and is incident on the sealing area, and
the reflected light is reflected from another surface of the dichroic lens and then received.

26. The method of claim 23,
wherein the first data includes a phase difference between the inspection light and the reflected light and time taken until the inspection light is incident and the reflected light is received, and
the second data includes three-dimensional coordinates (X, Y, Z) up to the sealing area.

27. A method for manufacturing a display device, the method comprising:
preparing a display device manufacturing apparatus including:
  a sealing module including a first light source unit emitting sealing light;
  a sealing inspection module including a second light source emitting inspection light to a subject;
  a detector receiving at least a part of reflected light reflected from the subject, a data generating unit generating measurement light data based on the inspection light and the reflected light;
  a data transforming unit converting the measurement light data generated from the data generating unit into conversion data;
  an image generating unit generating a first image of the subject based on the measurement light data; and
  a comparison unit comparing the first image with a prestored second image to determine whether sealing is defective,
irradiating a sealing area of a target panel with the sealing light by the first light source unit; and
irradiating the subject to the inspection light by a second light source unit and making a part of the reflected light reflected from the subject incident on the detector.

28. The method of claim 27, further comprising:
generating the measurement light data based on the inspection light and the reflected light incident on the detector by the data generating unit.

29. The method of claim 28,
wherein the measurement light data includes a phase difference between the inspection light and the reflected light and time taken until the inspection light is incident and the detector receives the reflected light, and
the conversion data includes three-dimensional coordinates (X, Y, Z) from the sealing inspection module to the subject.

30. The method of claim 27, further comprising:
converting the measurement light data into the conversion data by the data transforming unit; and
generating the first image of the subject based on the conversion data by the image generating unit.

31. The method of claim 27, further comprising:
comparing the first image with the prestored second image by the comparison unit to determine whether sealing is defective.

* * * * *